United States Patent [19]

Arakawa et al.

[11] Patent Number: 5,461,314
[45] Date of Patent: Oct. 24, 1995

[54] MRI FRONT END APPARATUS AND METHOD OF OPERATION

[75] Inventors: Mitsuaki Arakawa, Hillsborough; Hsu Chang, Fremont; John Van Heteren, San Francisco, all of Calif.

[73] Assignee: The Regents of the University of California, Oakland, Calif.

[21] Appl. No.: 139,177

[22] Filed: Oct. 21, 1993

[51] Int. Cl.$^6$ ..................................................... G01V 3/00
[52] U.S. Cl. ........................................... 324/318; 324/322
[58] Field of Search ................................. 324/322, 318, 324/319, 320, 307, 309; 128/653.5

[56] References Cited

U.S. PATENT DOCUMENTS

| | | | |
|---|---|---|---|
| 4,602,213 | 7/1986 | Sugiura | 324/307 |
| 4,638,253 | 1/1987 | Jaskolski et al. | 324/318 |
| 4,691,164 | 9/1987 | Haragashira | 324/322 |
| 4,695,801 | 9/1987 | Arakawa et al. | 324/318 |
| 4,733,190 | 3/1988 | Dembinski | 324/318 |
| 4,763,076 | 8/1988 | Arakawa et al. | 324/322 |
| 4,782,298 | 11/1988 | Arakawa et al. | 324/322 |
| 4,827,219 | 5/1989 | Harrison | 324/322 |
| 4,855,680 | 8/1989 | Arakawa et al. | 324/314 |
| 4,881,034 | 11/1989 | Kaufman et al. | 324/318 |
| 5,097,210 | 3/1992 | Requardt et al. | 324/318 |
| 5,216,367 | 6/1993 | Mori | 324/322 |
| 5,260,658 | 11/1993 | Greim et al. | 324/322 |

FOREIGN PATENT DOCUMENTS

4039409A1  6/1992  Germany.

OTHER PUBLICATIONS

*Hewlett Packard 3577 A Network Analyzer User's Guide*, HP Product Note 3577A–1, pp. 13–15, Jun. 1992.
*Hewlett Packard 8753C Network Analyzer Reference Manual*, HP 8753, Appendix to Chapter 5, pp. 5–53 through 5–58, Jun. 1992.
*Hewlett Packard 3577A Network Operating Manual*, HP Manual #03577–900000), pp. 4–20, Jun. 1992.

Freschet, Lorenzo, "Accuracy Considerations in RF Network Measurements", *Proceedings RF Technology Expo 1988*, Feb. 10–12, 1988.
"Comparison of Linear and Circular Polarization for Magnetic Resonance Imaging" by Glover et al.; *Journal of Magnetic Resonance* 64, 255–270 (1985).
"Quadrature Detection Coils—A Further √2 Improvement in Sensitivity" by Chen, Sank, and Hoult; *Journal of Magnetic Resonance* 54, 324–327 (1983).
"Elimination of Coupling Between Cylindrical Transmit Coils and Surface–Receive Coils for *in Vivo* NMR" by Bendal, Connelly and McKendry: *Magnetic Resonance In Medicine* 3, 157–163 (1986).
"Passive Decoupling of Surface Coils by Pole Insertion" by Hyde et al.; *Journal of Magnetic Resonance* 89, 485–495 (1990).
"Switched Surface Coil System for Bilateral MR Imaging" by Hardy et al.; *Radiology* 1988; 167: 835–838.

(List continued on next page.)

*Primary Examiner*—Louis M. Arana
*Attorney, Agent, or Firm*—Nixon & Vanderhye

[57] ABSTRACT

A front end unit (32) for a magnetic resonance imaging (MRI) system (20) comprises a plurality of coil attachment ports (46) to which an RF signal or tuning signal is selectively routed thereby permitting, during operation, coils (22) to remain attached to each of the plurality of ports. A signal routing controller (28, 30) selects to which of the ports the RF signal or tuning signal is to be routed. The RF front end Knit (32) is also known as the relay switchboard assembly or RSB. Each port of the RF front end is attached to a different RF coil or RF coil combination. Tuning and imaging operations can be conducted for a plurality of coils in succession, without coils having to be detached from the RF front end. The signal routing controller selectively applies the RF signal (from an RF unit) or the tuning signal (from a tuning controller) to the selected coil through a signal path unique to the selected coil. Coils not selected to be operative can be detuned.

23 Claims, 34 Drawing Sheets

OTHER PUBLICATIONS

"Switched Array Coils"; Requardt et al.; *Magnetic Resonance in Medicine* 13, 385–397 (1990).

"The NMR Phased Array" by Roemer et al.; *Magnetic Resonance in Medicine* 16, 192–225 (1990).

E. Fukushima and S. Roeder: "Experimental Pulse NMR A Nuts and Bolts Approach" Addison–Wesley Publishing Co. (1981) Chapter V NMR Hardware.

R. Liboff and G. C. Dalman, "Transmission Lines, Waveguides and Smith Charts" MacMillan 1985 (date unknown).

G. Gonzalez, "Microwave Transistor Amplifiers, Analysis and Design" Prentice–Hall, Inc. 1984 Chapter 2 (date unknown).

"Efficient Remote Transmission Line Probe Tuning" by Rath; *Magnetic Resonance in Medicine* 13, 370–377 (1990).

"Probe Tuning Adjustments—Need They Be in the Probe?" by Walton and Conradi; *Journal of Magnetic Resonance* 81, 623–627 (1989).

W. Sabin & E. Schoenike, Editors "Single–Sideband Systems & Circuits" McGraw–Hill Book Co. 1987 pp. 425–429 & 460–462 (date unknown).

"An Improved Saddle Coil for MR Imaging in Resistive Magnet Systems" by Doornbos et al; *Magnetic Resonance In Medicine* 2, 490–494 (1985).

"Fundamental of RF and Microwave Noise Figure Measurements" by Hewlett Packard Application note 57–1 (date unknown).

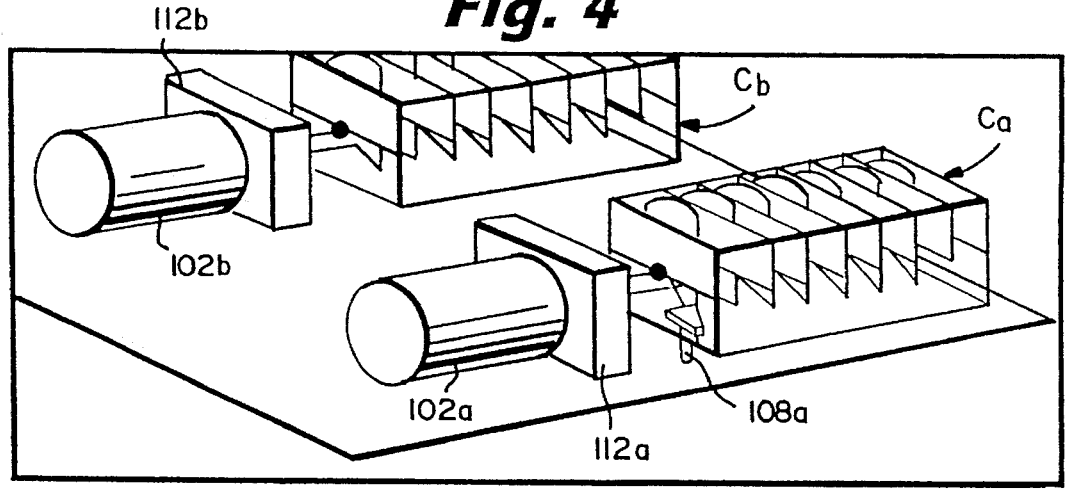
Fig. 4
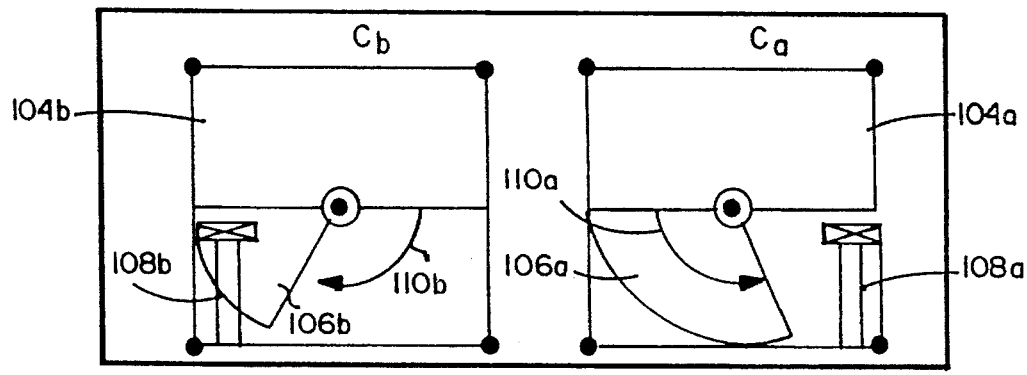
Fig. 5
Fig. 6
MOTOR STEP TO CAPACITANCE CONVERSION
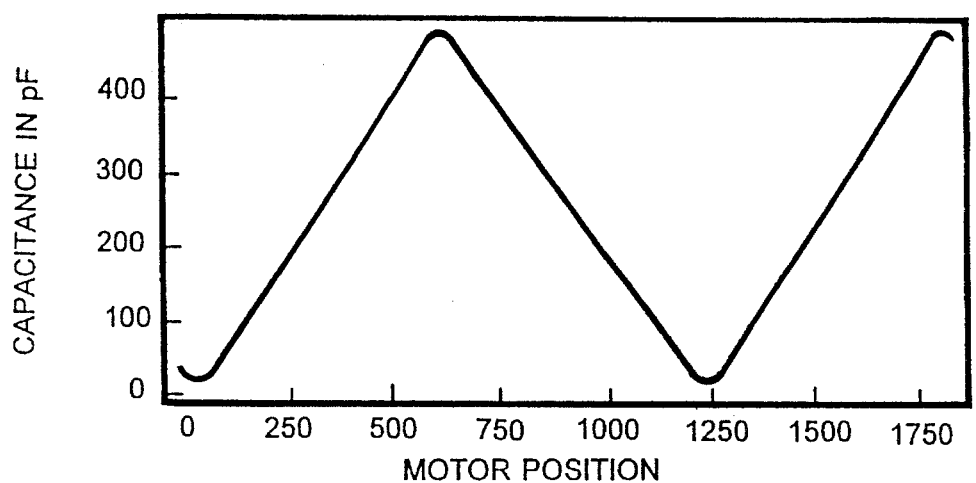

Fig. 13
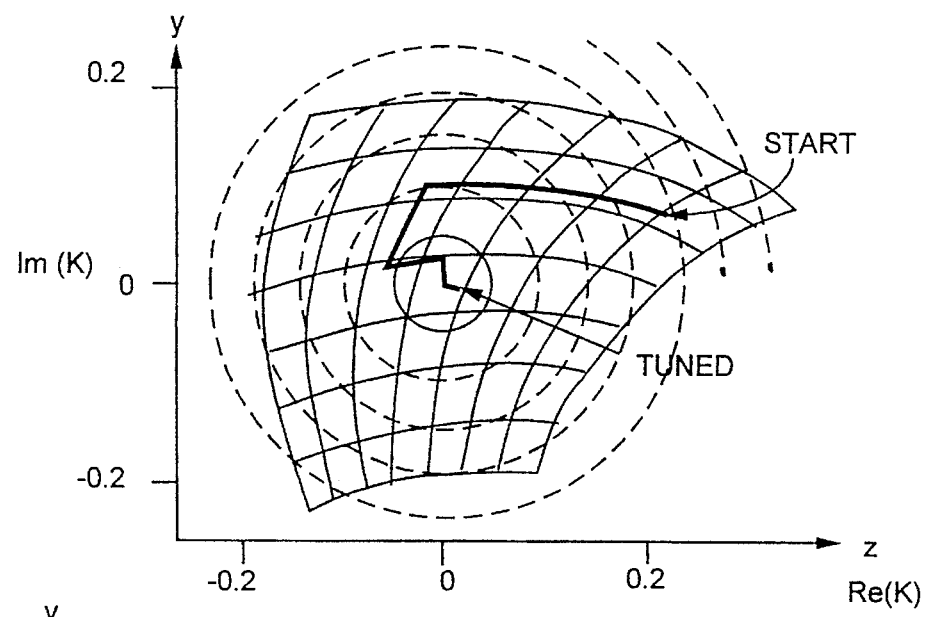
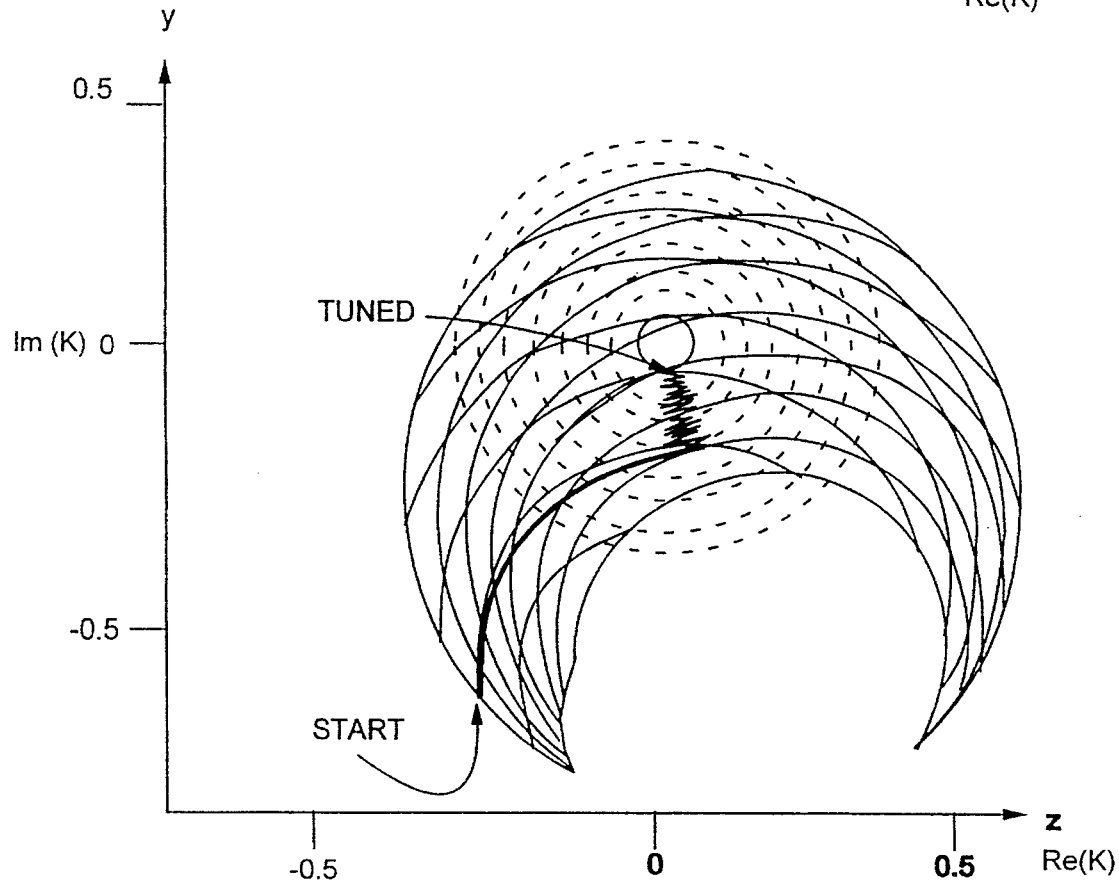
Fig. 14

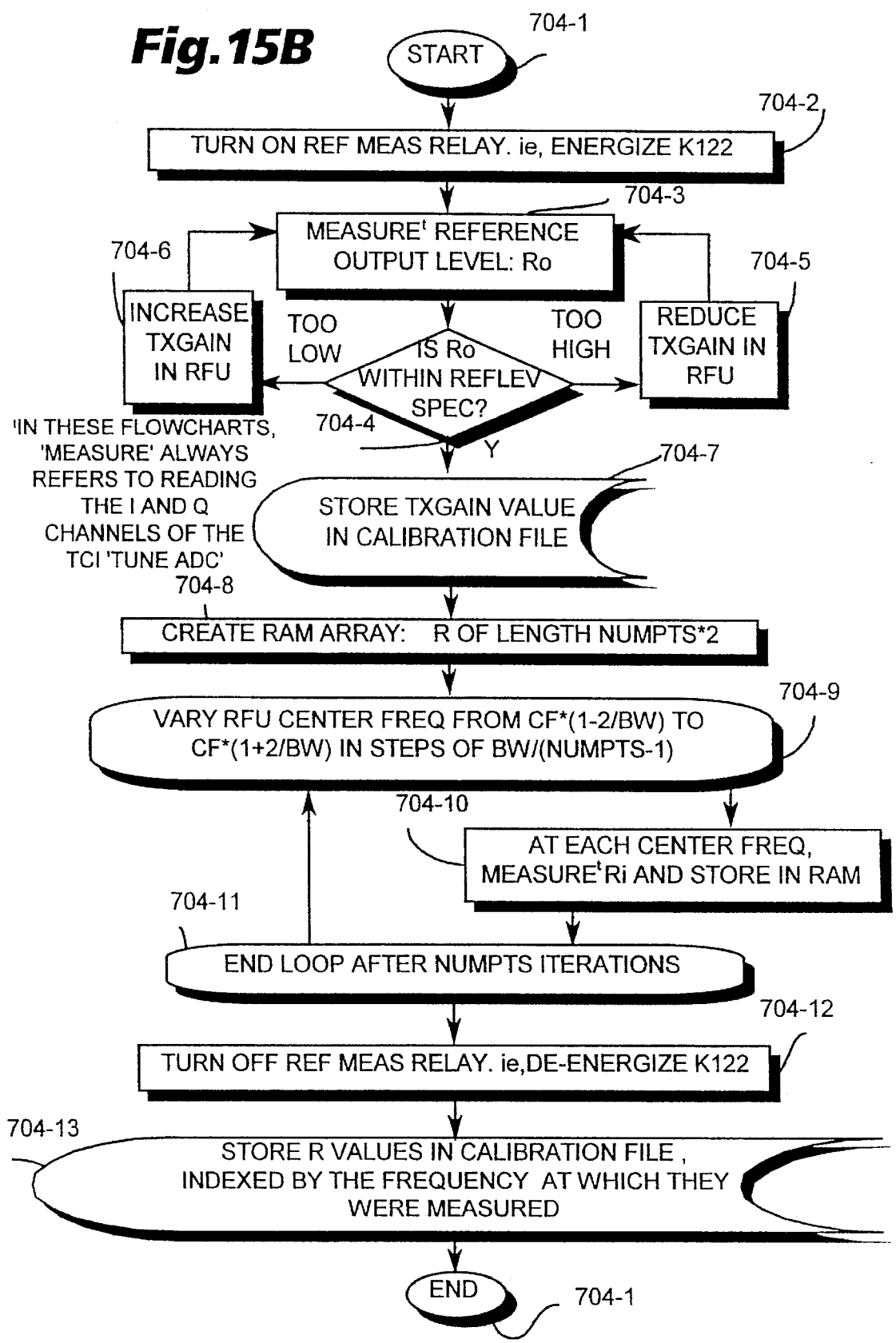

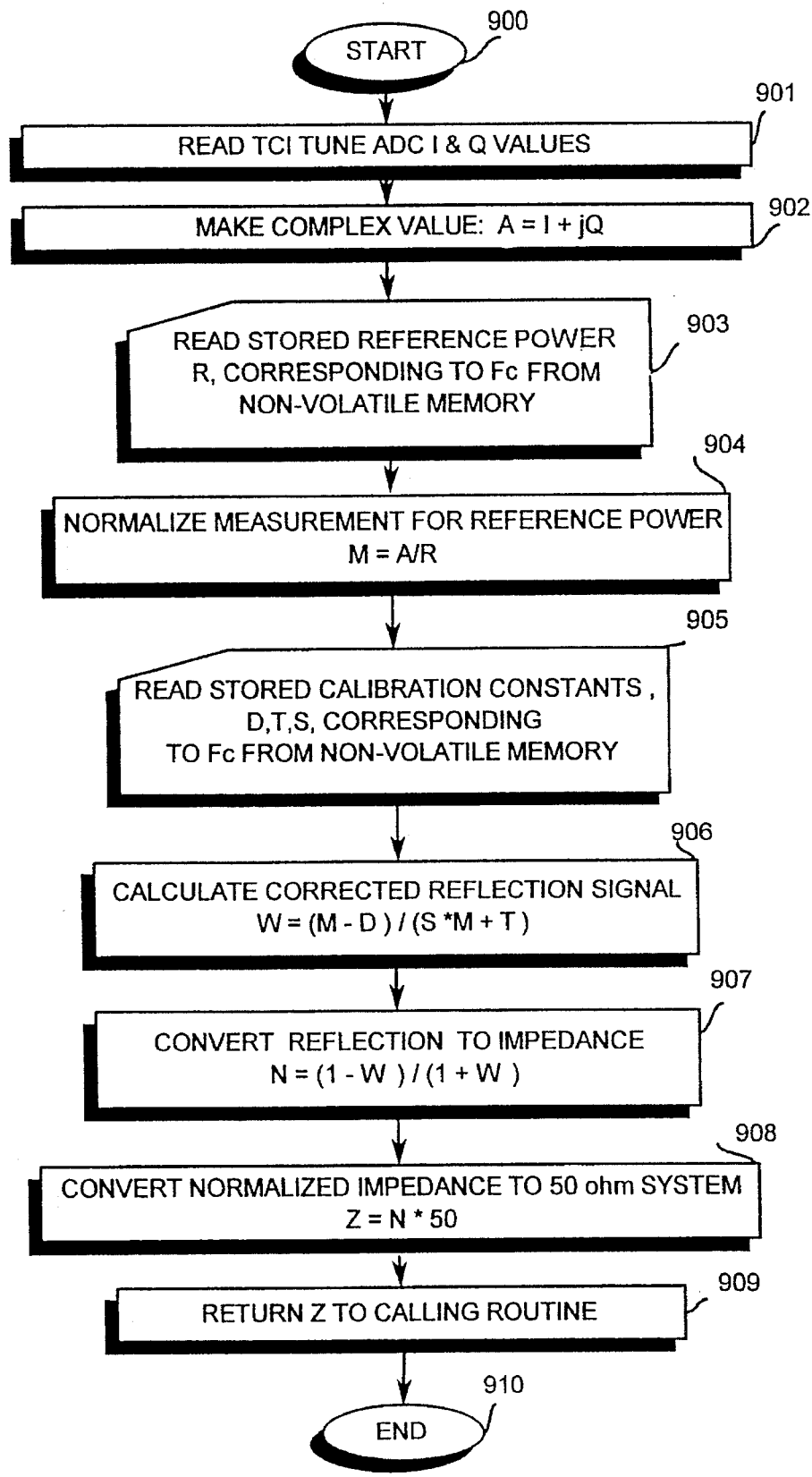

VARACTOR COIL BISECTION SEARCH

MRI FRONT END APPARATUS AND METHOD OF OPERATION

BACKGROUND

1. Field of Invention

This invention pertains to magnetic resonance imaging, and particularly to a method of operation and structure of a front end of a magnetic resonance imaging (MRI) system.

2. Prior Art and Other Considerations

Magnetic resonance imaging (MRI) involves the transmission of RF signals of predetermined frequency (e.g., approximately 15 MHz in some machines) via an RF coil structure into an object-to-be-imaged (e.g., a human patient). A short time later, radio frequency NMR responses are received by the same or similar RF coil structure. As will be appreciated by those in the art, it is possible to derive imaging information from such RF responses.

In general, the RF portions of an MRI system comprises an RF unit, an RF coil, and an RF "front end." The RF coil and the RF front end are housed in a shielded room (e.g., a gantry room). The object-to-be imaged is positioned in or otherwise proximate the RF coil inside the shielded room, while the MRI system operators station themselves outside the shielded room.

The RF unit both generates the RF signals transmitted to the object-to-be-imaged and receives and processes the MRI signals returned from the object. For an MRI system, an RF coil typically comprises a conductor (e.g., copper) suitably geometrically shaped to couple with a selected "image volume" portion of the human body. In addition, the RF coil includes its own unique matching circuit.

The RF unit is interfaced to an RF coil by the RF front end. In general, an RF front end of an MRI system has one or more channels for transmission and reception.

Historically, only one coil could be attached or remain attached at any given moment to each channel of the front end. For example, in one prior art configuration, a sole transmit only (Tx only) coil was connected to a transmit channel and a sole receive only (Rx only) coil was connected to a reception channel. In another prior art configuration, a sole transmit/receive coil was attached to the transmit channel, and an Rx only coil attached to the reception channel. The prior art RF front ends did not permit connection of a quadrature transmit coil to the transmit channel, but did permit connection of a quadrature Tx only coil at the reception channel.

In the early days of MRI utilization, there were very few types of coils, such as a non-QD (non-quadrature) head coil, a non-QD body coil, and a few surface coils. Then, as until now, technicians had to enter the shielded room to attach a desired one of the coils to the RF front end. For example, if the scanning regimen for a patient required images using a head coil and then a body coil, a technician would have to enter the shielded room after completion of imaging with the head coil in order to detach the head coil from the RF front end and to attach the body coil.

As MRI technology improved, more types of coils have been developed, including more anatomy-specific coils, for improving diagnostics. Coil shapes have proliferated, at least in part due to the fact that a "filling factor" (i.e., a ratio of patient volume occupied inside a Rx coil over the total Rx coil volume) affects the signal-to-noise ratio (SNR) of an Rx coil.

As mentioned above, imaging information is derived from the NMR RF responses received via an RF coil structure. One significant limiting factor on the quality of such images is the attainable signal-to-noise ratio (SNR) of the RF responses which must be detected and processed. The RF coil impedance is transformed by the use of matching circuits to an optimum impedance required by a low noise preamplifier.

The RF coil structure (also known as the "RF coil assembly" and "applicator") is typically housed within a static magnet (e.g., cryogenic magnet) and gradient coil structure where its load impedance may vary considerably (depending, for example, on the size and composition of the object being imaged and which is therefore coupled to the RF coil). MRI signal processing circuits (e.g., in the RF unit), including RF transmit/receive circuits, are located remotely from the RF coil structure and are connected thereto by a transmission line. The signal-to-noise ratio is optimized when the RF coil/applicator is resonated so that the impedance looking into the coil/applicator (e.g., the "load impedance") is "matched" or made equal to the complex conjugate transmission line impedance that connects the coil/applicator to the MRI processing equipment.

The load impedance of the coil/applicator will vary considerably depending upon the mass and composition of the material being imaged. In the past, efforts were made to obtain satisfactory performance (favorable SNR) by making an inconvenient internal impedance adjustment to the RF coil (i.e., to an RF tuning/matching circuit located at the coil site) each time a new object was to be imaged.

U.S. Pat. No. 4,827,219 to Harrison, commonly assigned herewith and incorporated by reference herein, discloses a remote tuning network for matching MRI RF coil impedance. The remote tuning network includes two adjustable impedances for achieving a matched RF impedance condition between an RF coil assembly, an RF transmission line interconnecting the RF coil assembly with the remote tuning network, and RF processing circuits. The remote tuning network may achieve matched RF impedance over, for example, a 3:1 VSWR (voltage standing wave ratio).

Advantageously, remote tuning units (RTUs) such as those disclosed in U.S. Pat. No. 4,827,219 are low cost. However, having a complex transfer function, the remote tuning units generally do not quickly tune high power RF coils. The RTUs are tuned with conventional computer-controlled tuning algorithms which may require thirty seconds or longer to tune a coil. These conventional computer-controlled tuning algorithms use a "hunt and peck" approach (similar to conventional manual RF antenna tuning/loading adjustments) to minimize the magnitude of a signal reflected from the coil (e.g., the "reflected signal").

Thus, the cumbersome prior art practice of repeatedly entering a shielded room to manually attach and detach coils and repositioning patients, as well as the prior art "hunt and peck" tuning approach, cost precious time. Actual imaging time constituted only a small portion of the time that a coil was loaded with a patient. The non-imaging time expended in tuning operations and manual connection/disconnection of coils hindered greatly the efficient use of expensive MRI equipment, and tended to exacerbate concerns of anxious patients.

The present invention provides an RF front end for a MRI system which readily accommodates, at any given moment, attachment of a plurality of RF coils including RF coils having differing types of matching circuits. The included novel front end facilitates gathering of diagnostic and other information. In part, this is facilitated by quickly and efficiently tuning an RF coil for an MRI system. Efficient and accurate calibration of RF coil tuning for an MRI system is also achieved.

SUMMARY

A front end for a magnetic resonance imaging (MRI) system comprises a plurality of coil attachment ports to which an RF signal or tuning signal is selectively routed thereby permitting, during operation, coils to remain attached to each of the plurality of ports. A signal routing controller selects to which of the ports the RF signal or tuning signal is to be routed.

The RF front end unit is also known as the relay switchboard assembly or RSB. Each port of the RF front end is attached to a different RF coil or RF coil combination. Tuning and imaging operations can be conducted for a plurality of coils in succession, without coils having to be detached from the RF front end. The signal routing controller selectively applies the RF signal (from an RF unit) or the tuning signal (from a tuning controller) to the selected coil through a signal path unique to the selected coil. Coils not selected to be operative can be detuned.

The RF front end accommodates simultaneous attachment of coils having different types of matching circuits. For example, a first of the coil ports can be attached to a high power coil, a second of the coil ports can be attached to a varactor-tuned coil, and a third of the coil ports can be attached to a multiple coil assembly (MCA).

The front end unit (RSB) of the invention provides a unique imaging signal path for each of the plurality of coil ports for selectively connecting the coil port to the RF imaging unit. In this respect, in during an imaging operation, the RF unit is connected either by a first imaging signal path to the first RF coil, or by a second imaging signal path to the second RF coil, and so forth. The imaging paths of the respective coils have at least some path segments which are not identical with another imaging signal path. The imaging paths include relays and switches.

The signal routing controller causes the connection of a selected one of the plurality of coil ports to the RF imaging unit or to the tuning controller through the relays of corresponding unique signal path of the selected coil port.

In addition to the coil ports, the front end unit (RSB) includes a tuning port for connecting the front end unit to the tuning control means. The tuning control means determines, during a tuning operation, when a magnitude of a signal reflected from one of the RF coils is below a predetermined value. Accordingly, the front end unit further includes a unique reflection signal path for each of the plurality of coil ports. A reflected signal for a coil port is selectively connectable to the tuning port along its unique reflection signal path during the tuning operation. The signal routing controller connects a selected one of the plurality of coil ports to the tuning control means through the reflected signal path of the selected coil port.

The reflection signal paths each include thereon a common demodulator. In addition, tuning switching means is provided for directing a reflected signal from the selected one of the RF coils to the tuning control means.

In accordance with a method of operation, a selection is made between an imaging mode, a coil tuning mode, and a testing or diagnostic mode. In the imaging mode, an RF signal is generated for application to an object-to-be-imaged. One of the plurality of RF coils is selected to receive an MRI signal returned from the object-to-be-imaged. The received MRI signal is then routed from the selected RF coil to an MRI imaging unit through an imaging signal path unique to the selected RF coil.

In the tuning mode, an RF signal is generated for application to an object-to-be-imaged. One of the plurality of RF coils is selected to receive a reflected signal returned from the object-to-be-imaged. The reflected signal is then routed from the selected RF coil to a tuning control unit through a reflection signal path unique to the selected RF coil.

In the testing or diagnostic mode, isolation is measured by applying a tuning signal to a first coil, but ignoring a small reflected MRI signal from the first coil. Instead, a signal received by a second coil (resulting from the application of the tuning signal on the first coil) is measured to determine the isolation of the coils (or channels).

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 4 is an isometric view of a portion of the tuning network of FIG. 3 including adjustable impedances and of motors for adjusting the adjustable impedances.

FIG. 5 is a front view of adjustable capacitances and associated position sensors included in the tuning network of FIG. 3.

FIG. 6 is a graph showing capacitance values for the adjustable capacitances of the tuning network of FIG. 3 as a function of motor step positions.

FIG. 13 is a graph illustrating a relatively easy high power coil fine tuning operation.

FIG. 14 is a graph illustrating a relatively difficult high power coil fine tuning operation.

FIG. 15B is a flowchart showing steps executed in connection with a reference level and TxGain measurement portion of the calibration operation depicted in FIG. 15.

FIG. 15F is a flowchart showing steps executed in connection with a calculation and storage of calibration constants portion of the calibration operation depicted in FIG. 15.

FIG. 16 is a flowchart showing steps executed in connection with a reflected signal measurement and correction operation for the system of the embodiment of FIG. 1.

DETAILED DESCRIPTION OF THE EXEMPLARY EMBODIMENT

Figure 1:
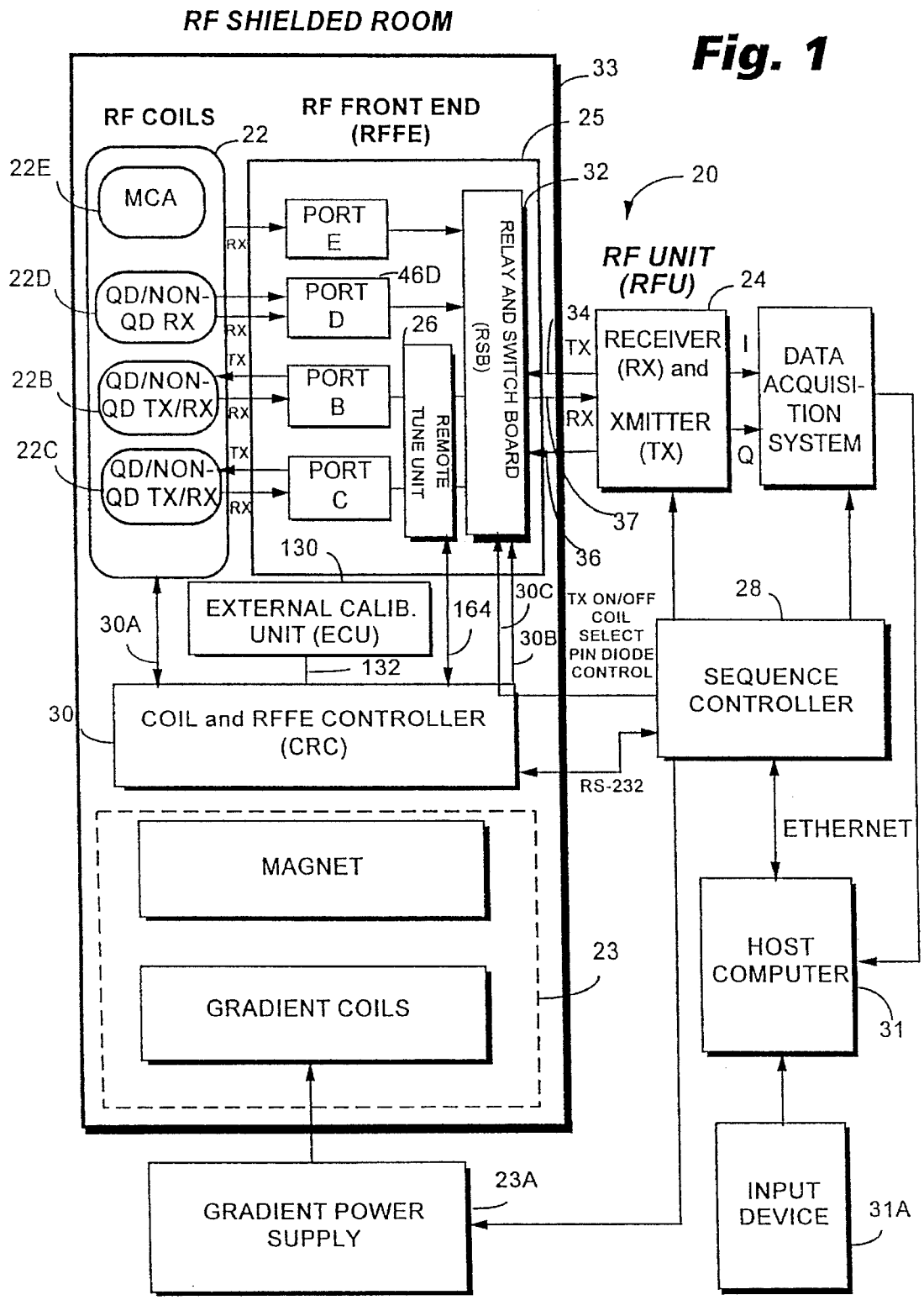
FIG. 1 is a schematic view of a magnetic resonance imaging system including an exemplary embodiment of the invention.

FIG. 1 shows a magnetic resonance imaging (MRI) system 20 which includes an RF coil assembly 22 and the usual background (e.g., a cryogenic) magnet & magnetic gradient coil ("mag/coil") assembly 23 for producing $B_o$, $B_x$, $B_y$, $B_z$. MRI system also includes RF unit ("RFU") 24; an RF front end (RFFE) 25 which includes a remote tuning network (or "RTU") 26; an imaging sequence controller 28; a coil and RFFE controller (CRC) 30; and, a host computer or host controller 31. As explained herein after, RF front end includes a relay and switch assembly (also known as relay and switch board or "RSB") 32.

Mag/coil assembly 23, RF coil assembly 22, RF front end 25, and the coil and RFFE controller 30 are typically remotely positioned (e.g., in an RF shielded room 33) from the remainder of the system 20. As described hereinafter, RF front end 25 connects the RF coil assembly 22 with RFU 24. Sequence controller 28 is connected, inter alia, to a gradient power supply 23A to control the magnetic gradient pulses $G_x$, $G_y$, $G_z$ as in the usual MRI process.

CRC 30 is connected via cable 30A to one of the coils in coil assembly 22 in the manner hereinafter described. CRC 30 is also connected by a relay bus 30B and a bus 30C to RF front end 25, both of which are described subsequently.

RF unit (RFU) 24 is utilized, under control of the sequence controller 28, to generate both transmit (Tx) pulse sequences (for application on cable 34) and tuning signals ("CW tune signal") on cable 36. In addition, RFU 24 receives the returned MRI signals on cable 37.

The host computer 31 is connected to receive input from an input device 31A (e.g., a keyboard). The input device 31A enables an operator to specify, inter alia, whether the MRI system 20 is to be operated in an imaging mode, a tuning mode, or a testing mode. Moreover, as explained below, since the MRI system 20 may have a plurality of RF coils in assembly 22 to be accommodated, with some of the coils having two channels (e.g., quadrature I and Q channels), the operator may use the input device 31A to specify which coil is utilized for imaging, tuning, or testing. It should be appreciated that, in some embodiments, a separate input device can be used for controller 30 whereby tuning selection (or coil identification) information is directly inputted to controller 30.

When in an imaging mode, Tx transmit pulses applied on cable 34 are ultimately applied via RSB 32 to RF coil assembly 22 loaded with an object-to-be-imaged, such as a patient. A short time later, the NMR RF signal received from the patient by the RF coil assembly 22 (hereinafter known as the "returned MRI signal" or the "returned RF signal") is returned through the RSB 32 and via cable 37 to RF signal processing circuits in the RFU 24 from whence it is ultimately used for deriving image information. For some coils, such as high power coils, the Tx transmit pulse and returned MRI RF signal are also routed through the RTU 26.

When in a tuning mode, the CW signal applied on cable 36 is ultimately applied via RSB 32 to a coil in the RF coil assembly 22. The signal reflected from the coil loaded by the object-to-be-imaged is returned to RSB 32 and applied to the controller 30. As in the imaging mode, for some coils (e.g., such as high power coils), the outgoing signal and the returned signal are also routed through RTU 26.

The tuning and/or testing of certain types of coils (e.g., high power coils and varactor-tuned coils) of the RF coil assembly is greatly facilitated by the present invention. An RF coil in the RF coil assembly 22 is considered to be tuned when the magnitude of the reflected signal (represented by |K|) is below a predetermined value (e.g., 0.05 of the incident RF signal).

As explained below, in accordance with the present invention, a high power coil is typically tuned using the remote tuning unit ("RTU") 26. The remote tuning unit includes two channels, each channel having two adjustable impedances (e.g., adjustable capacitors). The adjustable impedances are initially coarse tuned by the controller 30, and then fine tuned if necessary.

The tuning of a varactor-tuned coil involves adjusting the bias voltages for two varactor diode capacitors Cs and Cp such that, for a single frequency RF signal sent through a cable to the coil, the magnitude of its reflected signal is at a minimum. In the tuning of a varactor-tuned coil, the controller chooses a starting point for the varactor-coil tune and obtains a reflection signal magnitude for the starting point. Once a starting point is obtained, the controller executes a recursive bisection search operation to locate the tuned point. The bisection search returns a "last" point as its leading candidate for the tuned point. As a last effort to locate the tuned point and as a double check, in a starburst operation the controller examines the magnitude of reflected signals at points in a starburst or asterisk (*) pattern about the point returned by the bisection search, and the point in the pattern with the smallest reflection is the tuned point.

A more detailed discussion of the structure of MRI system 20 ensues as a prelude to an explanation of the coil tuning operations. The explanation of the coarse tuning and fine tuning operations for high power coils is followed by a discussion of a calibration operation according to the invention. The discussion of the calibration operation facilitates understanding of a reflection measurement and correction operation which is subsequently elaborated.

STRUCTURE: RF COIL ASSEMBLY

The RF coil assembly 22 comprises an unillustrated cable retractor and possibly one or more of a plurality of potentially compatible RF coils 22B, 22C, 22D and multiple coil assembly (MCA) 22E. The coils 22B–22C are typically high power coils (either dedicated transmit, or dual use transmit/receive coils) whose signals are routed through RTU 26 and are remotely tuned in accordance with the present invention. Coils 22B and 22C typically are quadrature detection coils having mutually orthogonal I and Q coils with minimized inter-coil coupling.

Coil 22D is a relatively low power, varactor-tuned receive only coil whose signals bypass RTU 26. Although not specifically discussed as such herein, coil 22D may also be a quadrature detection coil and therefore may have either one or two RF cables (two cables being illustrated in FIGS. 1 and 2). The varactor-tuned coil 22D of FIG. 1 is illustrated as being a dual TMJ (TemporoMandibular Joint) coil with two cables. As explained below, in lieu of a coil such as coil 22D (having a single QD varactor-tuned coil connected by two cables), two separate varactor coils can be provided (for example, knee, spine, or a single TMJ coil).

Figure 19:
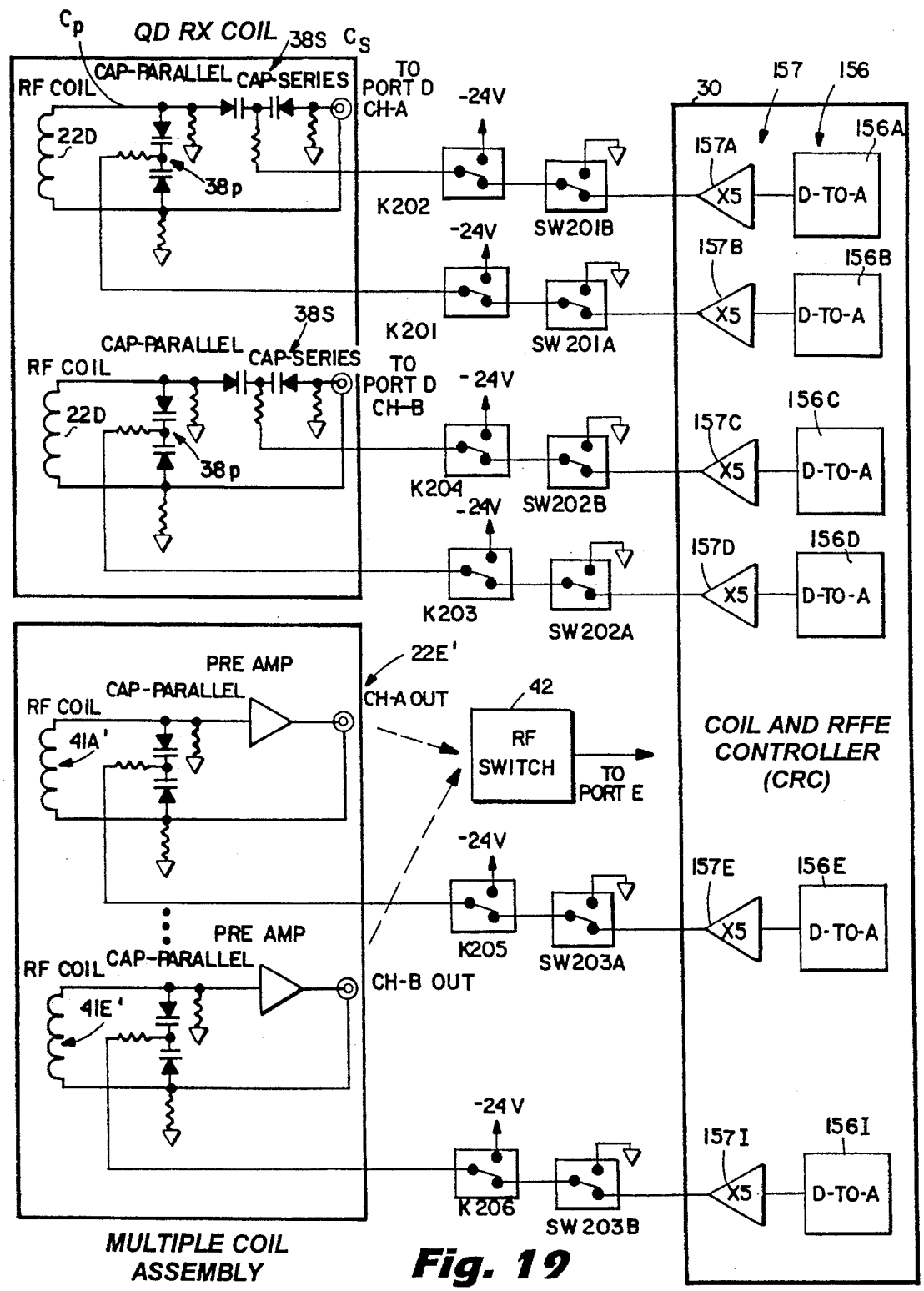
FIG. 19 is a schematic view of a coil detuning apparatus, as well as an embodiment of a multiple coil assembly (MCA), of the invention.

FIG. 19 includes, among its other features, an illustration of two varactor-tuned RF coils 22D, and thereby provides a simplified schematic view of an exemplary varactor-tuned RF coil. Each varactor-tuned coil has varactors 38s and 38p, with each varactor having a combination of fixed and adjustable capacitances. The adjustable capacitances of varactors 38s and 38p are referenced herein as capacitances Cs and Cp, respectively. For a 15 MHz surface coil, exemplary surface coil values corresponding to a resonant frequency of 14.95 MHz and Q= 600 are as follows: Cs=9.9 pF; Cp=23.6 pF; CpFixed= 243 pF; R=0.064 Ω; and L=0.41 μH.

Figure 2:
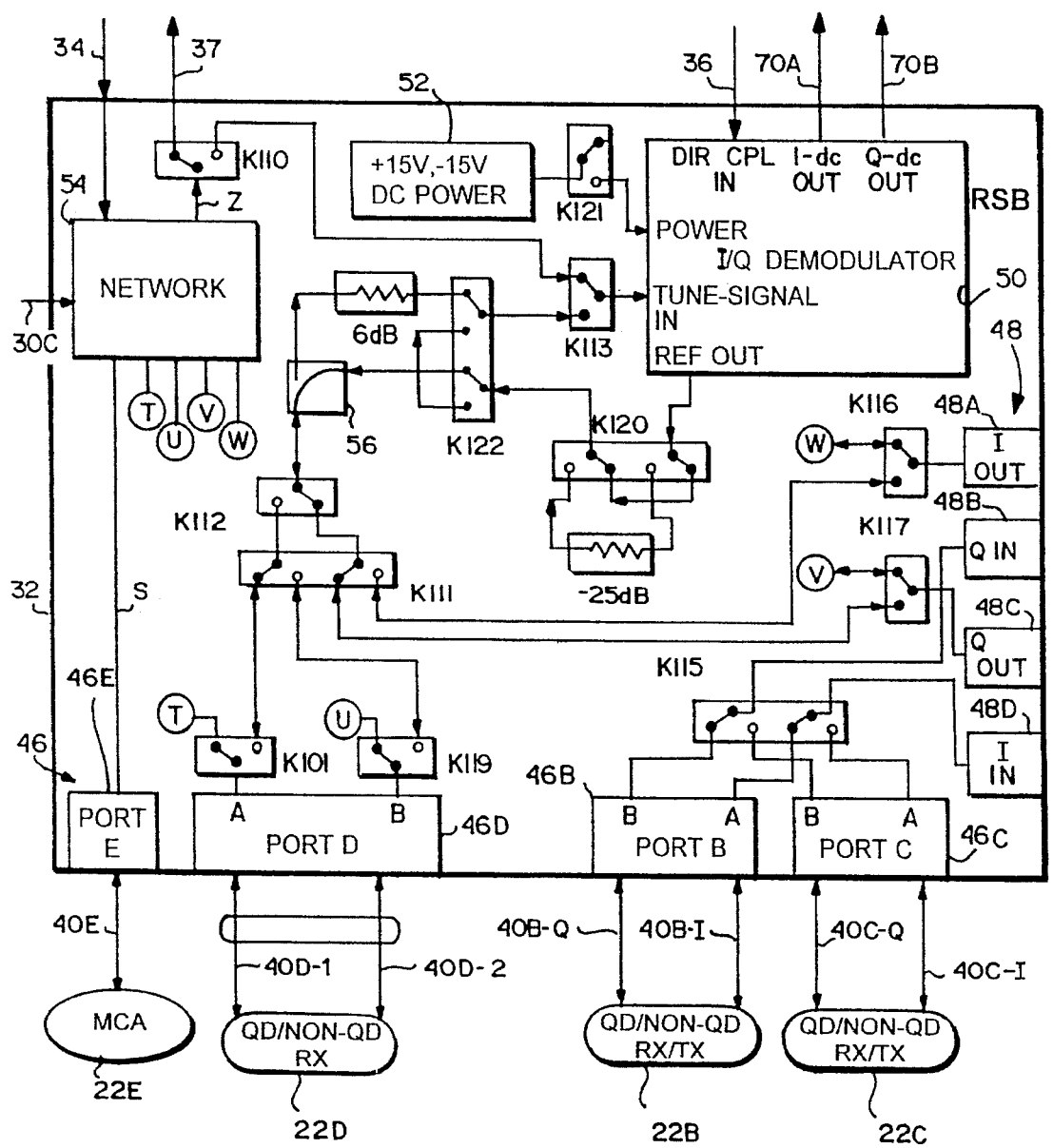
FIG. 2 is a schematic view of a switch assembly of the system of the embodiment of FIG. 1.

As shown in FIG. 2, each coil 22B–22E is attached to RSB 32 by one or more RF cables 40. Coils 22B–22C have two RF cables 40-I (an "In-Phase" cable) and 40-Q (a "Quadrature" cable) attached thereto. In this respect, coil 22B is shown with cables 40B-I and 40B-Q and coil 22C is shown with cables 40C-I and 40C-Q. Coils 22D is attached to RSB 32 by two cables 40D-1 and 40D-2, while multiple coil assembly (MCA) 22E is shown as being attached to RSB 32 by a single coil 40E. As used herein, the term "transmission line" encompasses a cable, including coaxial cables of the type shown as cables 40 and 62.

Figure 26:
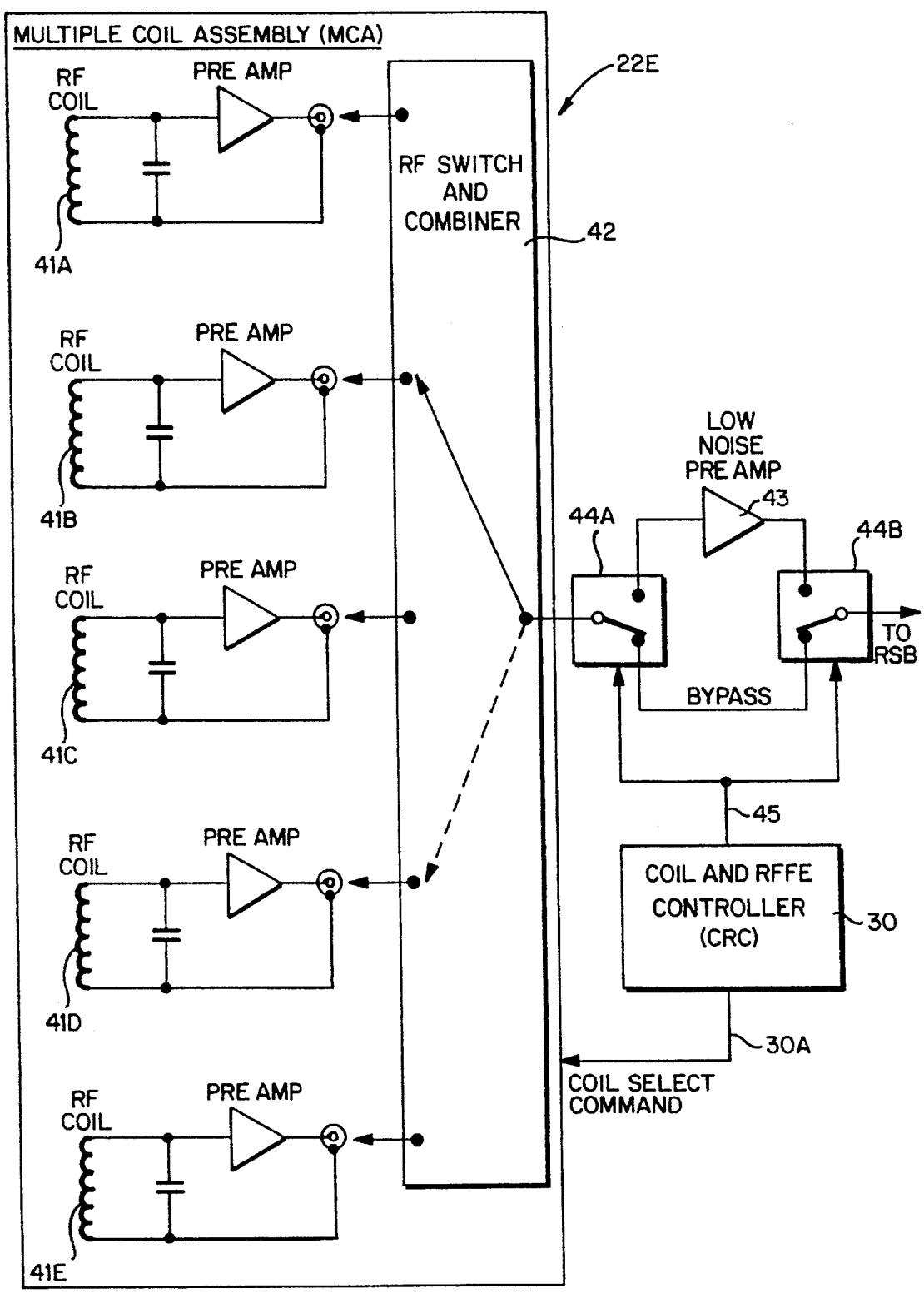
FIG. 26 is a schematic view of a multiple coil assembly (MCA) of an embodiment of the invention.

One embodiment of a multiple coil assembly (MCA) 22E is illustrated in FIG. 26, while another embodiment 22E' is illustrated in FIG. 19. In either embodiment, the multiple coil assembly typically bypasses RTU 26.

Multiple coil assembly 22E of FIG. 26 includes five RF coils 41A–41E. Each coil 41 has a capacitance connected in parallel thereacross, and is connected through a pre-amplifier to an RF switch and combiner 42. Under control of a signal applied on line 30A from controller 30, RF switch and combiner 42 typically routes a signal from a selected one of coils 41 through amplifier circuitry to RSB 32. The amplifier circuitry includes a low noise preamplifier 43 which, as shown in FIG. 26, is selectively by-passed by amplifier by-pass switches 44A and 44B. By-pass switches 44A and 44B are controlled by a signal applied on by-pass control line 45 from controller 30.

Multiple coil assembly 22E' included in FIG. 19 similarly has a plurality of RF coils 41A'–41E'. Connected in parallel across each coil 41 are diodes which, as explained hereinafter, are utilizable in a de-tuning process.

STRUCTURE: SWITCH ASSEMBLY

As shown in FIG. 2, RSB 32 (also known as the relay and switchboard) includes a plurality of coil ports 46 to which the cables 40 are attached; a plurality of ports 48 for connection to remote tuning unit (RTU) 26; an I/Q demodulator 50; a power source 52 for demodulator 50; a signal conditioning and routing network 54 (comprised primarily of hybrids, low noise amplifiers, transmit/receive switches, and splitters); a directional coupler 56; and, a network of relays. The signal conditioning and routing network 54 is described in more detail below with reference to FIG. 17. The demodulator 50 is described in more detail below with reference to FIG. 18.

As seen hereinafter, RSB 32 facilitates, among other things, the tuning of RF coils having differing types of matching circuits. The tuning operation per se is the subject of simultaneously-filed and commonly assigned U.S. patent application Ser. No. 08/139,178 of Van Heteren et al. entitled "METHOD AND APPARATUS FOR TUNING MRI RF COILS", which is incorporated herein by reference.

Figure 17:
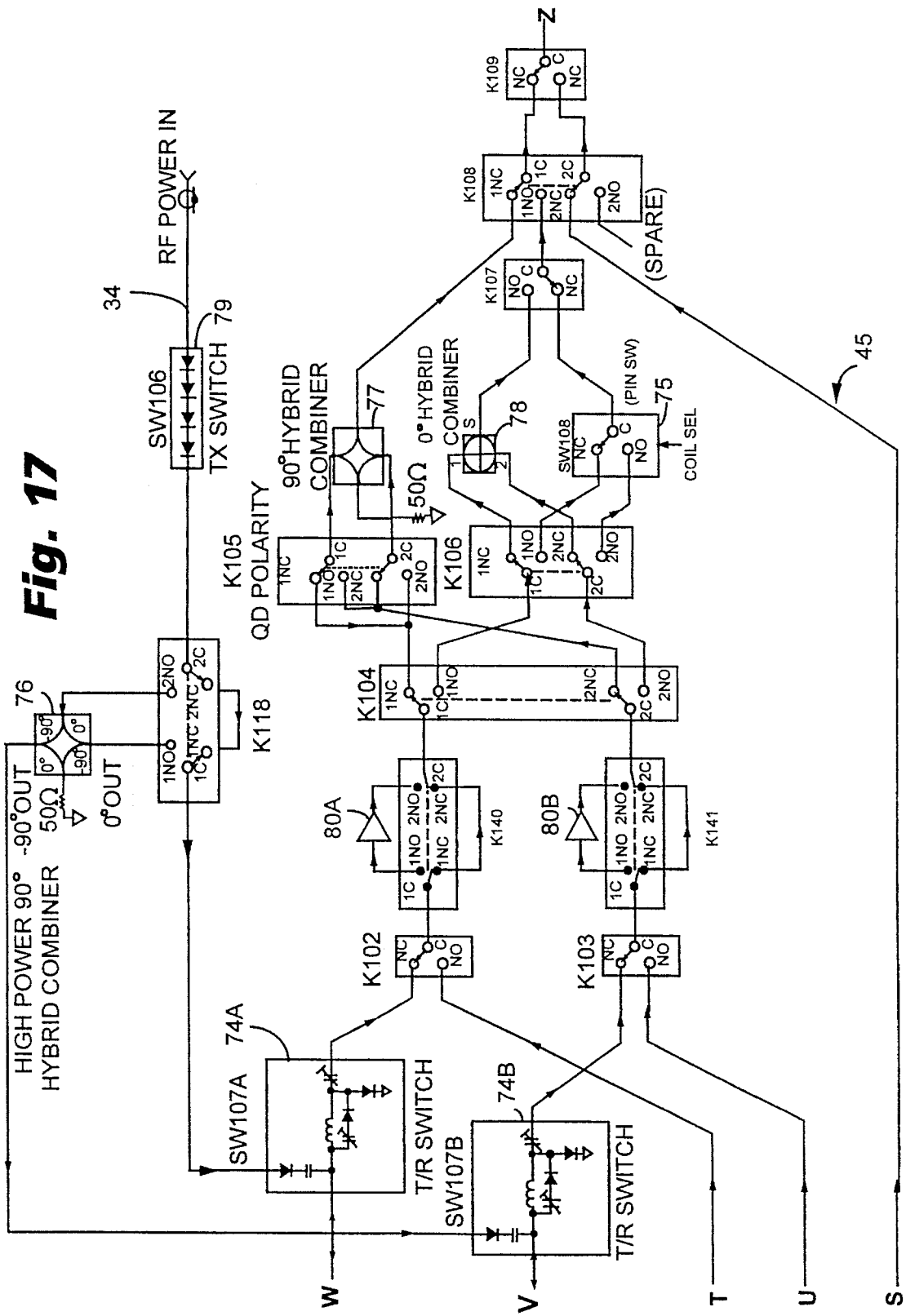
FIG. 17 is a schematic view of a network of low noise amplifiers, transmit/receive switches, splitters, and hybrids of the system of the embodiment of FIG. 1.

The RF coaxial relay elements included in the RSB 32, each having the prefix "K", bear the following reference numbers: K101, K110, K111, K112, K113, K115, K116, K117, K119, K120, and K121. Other relays in RSB 32 are described below in connection with the signal conditioning and routing network 54. As described hereinafter, RSB relays (including those in the signal conditioning and routing network 54) are controlled or activated (i.e., energized and de-energized) by signals on bus 30B from CRC 30 to selectively interconnect various coils in assembly 22 with either the RFU 24 or (through the directional coupler 56 and I/Q demodulator 50) with CRC 30. FIGS. 2 and 17 show each of the relays in the relay network of RSB 32 in a de-energized state.

In the above regard, for imaging mode purposes, each of the coil ports 46 of RSB 32 is connected to the RFU 24 by a unique imaging signal path. The imaging signal path is comprised of path segments. As used herein, a path segment comprises two elements (e.g., relays, switches, combiners, splitters) of RSB 32 (including the signal conditioning and routing network 54) and any means (e.g., a conductive line or other transmission means) for connecting the two elements. As is seen with respect to FIGS. 2 and 17, no two ports 46 are connected by an identical imaging signal path to RFU 24. In other words, an imaging signal path for each port 46 has at least some path segments which are not con, non with another signal path.

Similarly, for tuning purposes, each of the coil ports 46 of RSB 32 is connected via its I/Q demodulator 50 to CRC 30 by a unique reflection signal path. As is seen in FIG. 2, no two coil ports 46 are connected by an identical reflection signal path through RSB 32 to CRC 30. The I/Q demodulator 50 is common to all reflection signal paths.

CRC 30, together with sequence controller 28 (collectively also referred to as connection control means) controls the connecting means (including RSB 32). When high power coils are utilized, signals are routed through RTU 26 and RSB 32 to either CRC 30 or to RFU 24. FIG. 1 shows that relay control lines 30B connect CRC 30 to the plurality of RSB relays included in RSB 32.

As shown in FIG. 2, RSB ports 46B–46E serve for interfacing RSB 32 with the coils 22B–22E, respectively, via the respective cables 40B–40E. As shown in FIG. 2 in conjunction with FIG. 7, RSB ports 48A–48D serve for interfacing RSB 32, via cables 62A–62D, to RTU 26. As used herein, the term "transmission line" encompasses a cable, including coaxial RF cables of the type shown as cables 40 and 62.

As mentioned above, in the illustrated configuration of the MRI system 20 coils 22B and 22C may be high power coils. Each coil 22B, 22C is connected to RSB 32 by both In-Phase and Quadrature-Phase cables. To this end, the coil ports 46B and 46C each have "A" pins or "A" channels which are connectable via relay K115 to the "In Phase In" or "I In" port 48D, as well as "B" pins or "B" channels which are connectable via relay K115 to the "Quadrature In" or "Q In" port 48B. The "Quadrature Out" or "Q Out" port 48C is connectable by relay K117 either to network 54 for imaging (i.e., scanning) or (via relays K111, K112, by directional coupler 56, and relays K122, K113) to a "tune signal in" pin of I/Q demodulator 50 for tuning. Similarly, the "In Phase Out" or "I Out" port 48A is connectable by relay K116 either to the network 54 or (via relays K111, etc.) to the "tune signal in" pin of I/Q demodulator 50.

The "A" and "B" pins or channels of port 46D are respectively attached to cables 40D-1 and 40D-2. In the illustrated embodiment, one of the cables 40D-1 and 40D-2 is, in turn, attached to the varactor-tuned coil 22D. It should be understood that cable 40D-1 and 40D-2 could instead both be attached to the same coil (a QD RX or Dual TMJ coil). Alternatively, the cables 40D-1 and 40D-2 may be attached to separate single-cable varactor coils, such as a knee coil, a spine coil, or a single TMJ coil, for example. Relays K101 and K119 serve to connect port 46D (interfacing with coil 22D) either to the network 54 or to I/Q demodulator 50 (via relay K111, etc., as described above).

It should be understood that coils can be attached to the coil ports 46 in configurations other than that illustrated in FIGS. 1 and 2. For example, different coils can be attached to each of the channels for ports 46B and 46C. Table 2, subsequently described, provides various relay settings for each port channel in accordance with the type of coil attached to the port channel (e.g., quadrature coil or non-quadrature single coil). When using non-quadrature coils for ports 46B and 46C, RTU 26 can be disconnected if desired by connecting switch assembly port 48A and 48D and by connecting switch assembly port 48C and 48B.

The relays K111, K112, and K115 serve as tuning switch means. The energization/de-energization of relays K111, K112, and K115 governs from which of the coil ports 46B–46D a reflected signal will be directed to the I/Q demodulator 50 (and thus to CRC 30).

The power source 52 is connectable to I/Q demodulator 50 via relay K121 during a tuning operation, but is disconnected therefrom during imaging operations.

The signal conditioning and routing network 54 is connectable by relay K110 either to the cable 37 leading to the RFU 24 or (further via relay K113) to the "tune signal in" pin of I/Q demodulator 50. Connection of the network 54 to cable 37 occurs during imaging. Connection of the network 54 to I/Q demodulator 50 allows for measuring coil isolation as described below, which is a useful tool for checking the performance of QD and dual coils.

The switch assembly 32 further provides means for demodulating a reference signal. In this respect, a "reference out" or "ref out" pin of I/Q demodulator 50 is connectable via relays K120, K122, and K113 to the "tune signal in" pin of I/Q demodulator 50.

I/Q demodulator 50 receives (at pin "directional coupler in", also known as "Dir Cpl in") a continuous wave (CW) tune signal (known as the "tuning signal") on line 36 from the RFU 24. I/Q demodulator 50 has an output port comprising two output channels or output pins labeled as "I-dc Out" and "Q-dc Out". The "I-dc Out" channel is connected by cable 70A to an "I-dc In" channel of an analog to digital converter (ADC) 72 and the "Q-dc Out" channel is connected by cable 70B to the "Q-dc In" channel of the analog to digital converter 72. The analog to digital converter 72 (collectively referencing two ADC converters) is included in CRC 30 (see FIGS. 18 and 28).

The reader should keep in mind that the term "quadrature" or "QD" is thus used in discussing the separate issues of both coils and demodulation. The phrase "quadrature" or "QD" is used for two distinct aspects of the tuning process: a first aspect is for the two channels of the coil; a second aspect is for the two channels of the analog to digital converter 72.

STRUCTURE: SIGNAL CONDITIONING AND ROUTING NETWORK

Figure 28:
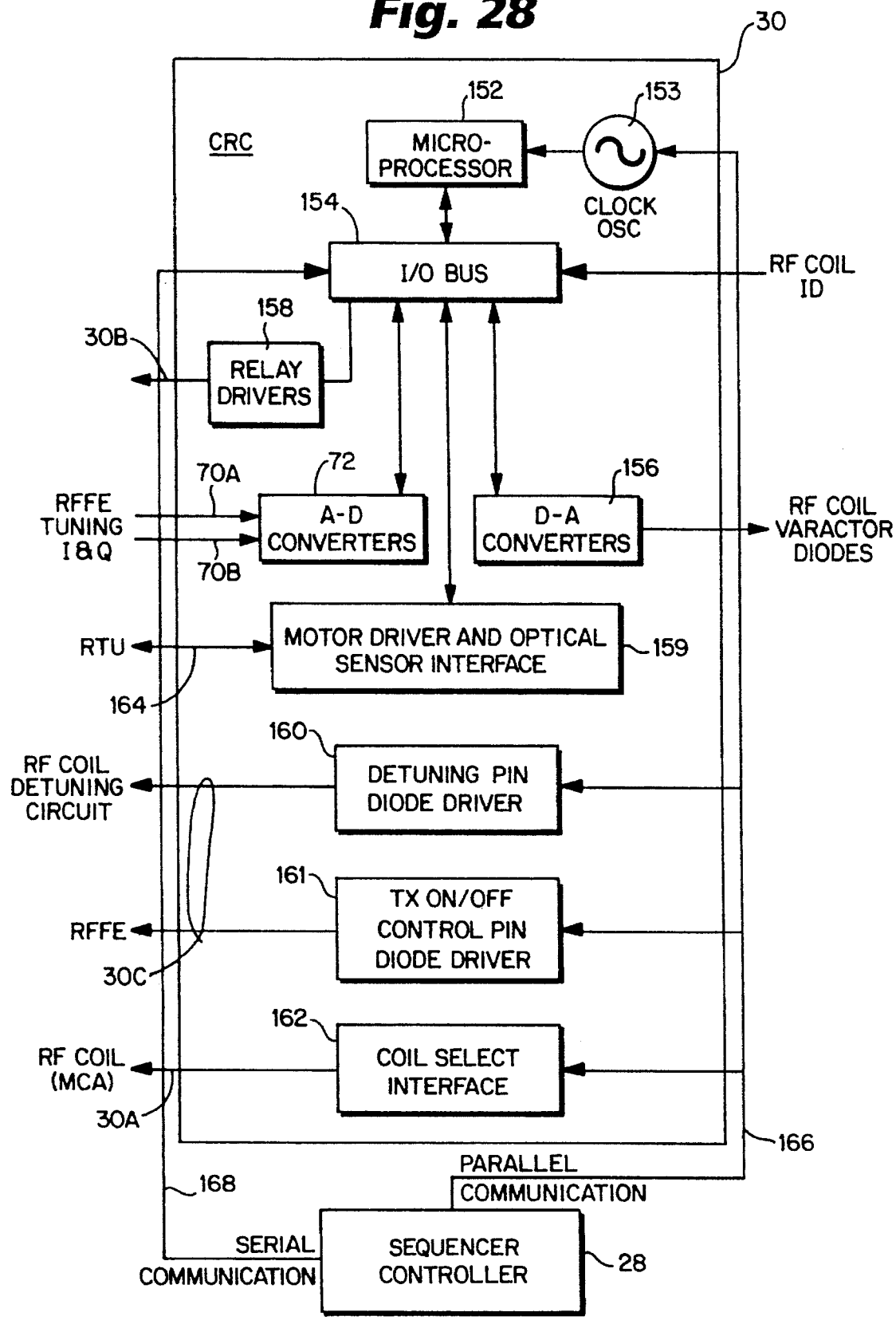
FIG. 28 is a schematic view showing a relationship between a coil and RFFE controller and a sequence controller, collectively referred to as a signal routing controller.

The signal conditioning and routing network 54 (generally shown in FIG. 2) forms part of relay switch board (RSB) 32. The signal conditioning and routing network 54 is shown in more detail in FIG. 17 as including transmit/receive switches 74A and 74B; pin diode switch 75; hybrid combiners 76, 77, and 78; transmitting switch 79 (with built-in power sensor); low noise amplifiers 80A and 80B; and, a plurality of other relays. The other relays included in the network 54 are illustrated in FIG. 17 as relays K102–K109, K118, K140 and K141. FIG. 17 shows each of the relays in the network 54 of RSB 32 in a de-energized state. The relays of the network 54, like other relays of RSB 32, are controlled by CRC 30 by application of signals over cable 30B. Switches 74A, 74B and pin diode switch 75 are ultimately controlled by sequence controller 28, but (as illustrated in FIG. 28) are routed through CRC 30.

As understood from following descriptions, for various elements the signal conditioning and routing network 54 serve as imaging switch means and are responsive to sequence controller 28 for directing an MRI RF signal returned from the coil loaded with the object-to-be-imaged through a selected imaging signal path to RFU 24.

As shown in FIG. 2, the signal conditioning and routing network 54 is connected to cable 34 (upon which Tx transmit pulses are applied from RFU 24) and to relay K110 (through which incoming RF signals are applied either on cable 37 to RFU 24 or to K113 and I/Q demodulator 50). The network 54 is also connected (as shown by symbols "V" and "W") to relays K117 and K116, respectively, and ultimately to the high power coils 22C and 22B. In addition, the network 54 is connected (as shown by symbols "T" and "U") to relays K101 and K119, respectively, and ultimately to the varactor coil 22D. The details of these connections of the network 54 to RFU 24 and the aforementioned relays, as well as the internal connections of network 54, are discussed below.

Received MRI RF signals from a QD coil are routed (via relay K104) to the quadrature polarity relay K105, and from thence to the hybrid combiner 77. The hybrid combiner 77 combines or adds the quadrature signals to produce a single signal such as is necessary for imaging. Any polarity reversal of the coil's magnet can be taken into consideration by the selective energizing of the QD polarity relay K105.

Received MRI signals from a coil having non-QD reception are routed (via relay K104) to the relay K106. If the received signals from two channels are to be summed, relay K106 is de-energized so that the received signals can be added at 0° hybrid combiner 78 prior to ultimate application to RFU 24. If the signals are not to be summed, the signals from both channels are applied (per energization of relay K106) to the pin diode switch 75. The sequence controller 28, in real time sequence control under user input direction (e.g., including but not limited to a preprogrammed sequence) from input device 31A, selects one of the channels, or toggles the channels, for imaging purposes for application to RFU 24.

Describing the foregoing structure of signal conditioning and routing network 54 now in more detail, the Tx transmit pulse cable 34 from RFU 24 is connected to a RF power input terminal of Tx switch 79. The Tx transmit pulse is applied from an RF power output terminal of Tx switch 79 to relay K118. When relay K118 is energized for imaging a QD coil, Tx pulses are applied to an input terminal HYBRID IN of hybrid combiner 76. When relay K118 is energized, a zero degree (0°) output terminal of combiner 76 is connected to a contact of relay K118 and further to a transmit input terminal (TX/A) of transmit/receive switch 74A (see FIG. 17). A −90° output terminal of hybrid combiner 76 is connected to the transmit input terminal (TX/B) of transmit/receive switch 74B. Thus, when relay K118 is energized, hybrid combiner 76 sends a ½ power, 0° phased-shifted Tx transmit pulse to switch 74A and a ½ power, 90° phase-shifted Tx transmit pulse to switch 74B. On the other hand, if relay K118 is de-energized (as occurs when imaging is to occur with non-QD coil), the Tx transmit pulse bypasses hybrid combiner 76 and is applied only to switch 74A.

As shown in FIG. 17, Tx/Rx switches 74A and 74B in FIG. 17 are ultimately controlled by sequence controller 28. In particular, sequence controller 28 is connected (through CRC 30 and cable 30C) to a current driver to supply biasing voltage to a PIN diode included in each switch 74. When sequence controller 28 supplies a first value to switches 74, the switches are in a transmit mode (as described in the preceding paragraph). When sequence controller 28 supplies a second value to the switches 74, the switches are in a receive mode (as described in the following paragraphs) wherein the received signal is sent to amplifiers 80A, 80B.

A coil interface terminal (RX/A) of switch 74A is connected to relay K116 (as denoted by symbol "W"), and accordingly is ultimately connected (via RTU 26 and under control of relay K115) to either coil 22C or coil 22B. As mentioned above, in the transmit mode switch 74A receives the half-power, 0° phase-shifted Tx transmit pulse from combiner 76 and sends it to relay K116, thus avoiding amplifier 80A. In the receive mode, switch 74A receives a signal from relay K116 and sends it to amplifier 80A, thus avoiding relay K118. Switch 74A thus serves as an "I-Phase" transmit/receive switch.

A coil interface terminal (RX/B) of switch 74B is connected to relay K117 (as denoted by symbol "V") and, in like manner as switch 74A, is ultimately connected (via RTU 26 and under control of relay K115) to either coil 22C or coil 22D. As mentioned above, in the transmit mode switch 74B receives the half-power, 90° phase-shifted Tx transmit pulse from combiner 76 and sends it to relay K117, thereby avoiding amplifier 80B. In the receive mode, switch 74B receives a signal from relay K117 and sends it to amplifier 80B, thus avoiding hybrid 76. Switch 74B thus serves as the "quadrature phase" transmit/receive switch.

A receive output terminal of the I-Phase transmit/receive switch 74A is connected to a first input terminal of relay K102. A second input terminal of relay K102 is connected to relay K101 (as indicated by symbol "T"). When relay K102 is de-energized, the signal received from switch 74A is routed through relay K102. Otherwise the signal received from relay K101 (e.g., from varactor coil 22D) is routed through relay K102.

A receive output terminal of the quadrature transmit/receive switch 74B is connected to a first terminal of relay K103. A second input terminal of relay K102 is connected to relay K119 (as indicated by symbol "U"). When relay K103 is de-energized, the signal received from switch 74B is routed through relay K103. Otherwise the signal received from relay K119 (e.g., from varactor coil 22D) is routed through relay K103.

Whichever signals are received at relays K102 and K103, the received signals are selectively routed to low noise amplifiers (LNAs) 80A, 80B, respectively, and then to relay K104. Whether are not the received signals are routed to LNAs 80A, 80B depends upon whether bypass relays K140 and K141, respectively, are energized. As explained hereinafter, de-energization of relays K140 and K141 is useful in some cases for improving dynamic range.

When relay K104 is de-energized (for coils having quadrature reception), the received signals are routed to QD polarity relay K105 and then to hybrid combiner 77 for combination. The energization of relay K105 facilitates use of RSB 32 when the polarity of the coil is reversed.

In the above regard, when relay K104 is de-energized, the amplified received signals from relays K102 and K103 are each routed to two terminals of quadrature polarity relay K105. Output terminals 1C and 2C of relay K105 are connected to respective input terminals of hybrid combiner 77. The combined output signal from combiner 77 is applied to 1NC terminal of relay K108. When relays K108, K109, and K110 are de-energized, the incoming signal is applied on cable 37 (after amplification) as the MRI RF signal to RFU 24. The output signal of relay K109, which is applied to relay K110, is shown as signal Z in FIGS. 2 and 17.

Relay K104 is energized for coils having non-QD reception. In such case, the received signals are routed to relay K106 rather than to quadrature polarity relay K105. If relay K106 is de-energized, the signals from both channels are to be added and accordingly the received signals from both channels are routed to differing input terminals of 0° Hybrid combiner 78. An output terminal of 0° Hybrid combiner 78 is connected to relay K107. When relays K107 and K108 are energized, the output signal from adder 78 is routed via relays K107 and K108 to relay K109.

If both relay K104 and relay K106 are energized, received signals from both channels are routed to channel selection PIN diode switch 75. Channel selection pin diode switch 75 transmits one channel at a time, and can be toggled to alternatingly transmit two channels. When channel selection switch 75 is de-energized, the signal from channel B is transmitted therethrough. When channel selection switch 75 is energized, the signal from channel A is transmitted therethrough. The signal transmitted through switch 75 is routed further to relay K107. The signal so routed can be applied to RFU 24 by de-energization of relay K107, energization of relay K108, and de-energization of relays K109 and K110.

The signal from multiple coil assembly (MCA) 22E on line "S" is routed through relay K108 and relay K109 (e.g., for application as the MRI RF signal on cable 37 or to demodulator 50) when relay K108 is de-energized and relay K109 is energized.

STRUCTURE: I/Q DEMODULATOR

Figure 18:
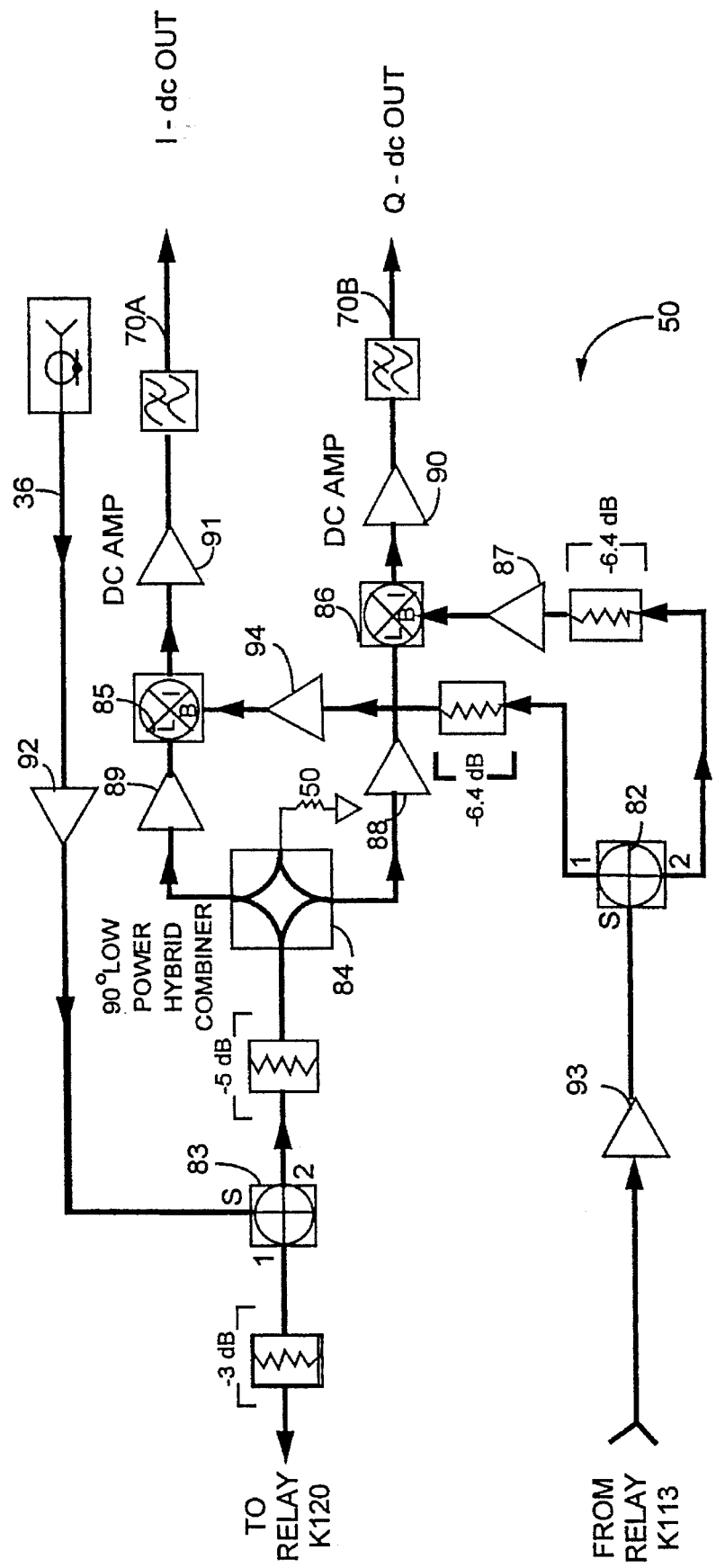
FIG. 18 is a schematic view of a tune signal demodulator of the system of the embodiment of FIG. 1.

I/Q demodulator 50 of RSB 32 is shown in more detail in FIG. 18. In particular, I/Q demodulator 50 is shown as comprising splitters 82 and 83; a low power 90 degree combiner 84; mixers 85 and 86; and, amplifiers 87– 94.

It will be recalled from the discussion of FIG. 2 that demodulator 50 receives the tuning signal ("CW tune signal") on cable 36; a power signal from relay K121; and, a signal from relay K113 at a tune signal in pin. I/Q demodulator 50 has two output channels or output pins labeled as "I-dc Out" and "Q-dc Out". The "I-dc Out" channel is connected by cable 70A to an "I-dc In" channel of an analog to digital converter (ADC) 72 and the "Q-dc Out" channel is connected by cable 70B to the "Q-dc In" channel of analog to digital converter 72.

The tuning signal ("CW tune signal") on cable 36 enters demodulator 50 (at input "Dir Cpl In") and is used in mixers 85 and 86 to demodulate the reflected signal. The reflected signal is demodulated into its DC quadrature components ("I-dc Out", "Q-dc Out") which are then read by ADC 72.

In the above regard, the tuning signal ("CW tune signal") on cable 36 is amplified (by amplifier 92) prior to application to an input terminal of splitter 83. A first output terminal of splitter 83 is connected to relay K120. A second output terminal of splitter 83 is connected to an input terminal of 90° hybrid combiner 84.

A −90° phase-shifted output terminal of hybrid combiner 84 is connected via amplifier 88 to local-oscillator frequency input ("L") terminal of mixer 86. The IF frequency output ("I") terminal of mixer 86 is connected through amplifier 90 to the Q-dc output pin, which is connected by cable 70B to ADC 72.

A 0° phase-shifted output terminal of hybrid combiner 84 is connected via amplifier 89 to local-oscillator frequency input ("L") terminal of mixer 85. The IF frequency output ("I") terminal of mixer 85 is amplified (by amplifier 91) to form the I-dc output pin, which is connected by cable 70A to ADC 72.

The signal applied at the tune-signal in pin of demodulator 50 is amplified by amplifier 93 prior to application to splitter 82. A first output terminal of splitter 82 is connected through amplifier 94 to the RF frequency input ("R port") terminal of mixer 85. A second output terminal of splitter 82 is connected through amplifier 97 to the RF frequency input ("R") terminal of mixer 86.

Application of the tuning signal through demodulator 50 to the coil-to-be-tuned occurs as follows. The tuning CW signal is applied on cable 36 from RFU 24. In demodulator 50 the tuning CW signal is amplified by amplifier 92 and then split at splitter 83. The amplified tuning signal is then directed (to the left in FIG. 18) to relay K120 through a 3 dB attenuator. The tuning signal is also directed (to the right in FIG. 18) through a 5 dB attenuator to 90° hybrid combiner 84. 90° Hybrid combiner 84 serves as a phase-shifting splitter. In this regard, a first output signal having half the power of the tuning signal and a 0° phase shift is output via amplifier 89 to mixer 85 for mixing to produce the I-dc Out ("In-Phase") signal. A second output signal having half the power of the tuning signal and a −90° phase shift is output via amplifier 88 to mixer 85 for mixing to produce the Q-dc Out ("Quadrature") signal.

Receipt of a reflected signal through demodulator 50 in the tuning mode occurs as follows. The reflected signal is applied to the TUNE SIGNAL IN terminal of demodulator 50 from relay K113 (see FIG. 2). The reflected signal from relay K113 is amplified at amplifier 93 and applied to input terminal of splitter 82. The split signals from splitter 82 are applied to the RF frequency input terminals of mixers 85 and 86 (after −6.4 dB attenuation and amplification by amplifiers 94 and 87, respectively).

At mixer 85 the reflected signal is mixed with the first output signal of hybrid combiner 84 (e.g., a signal having half the power and a 0° phase shift of the tune signal). The output of mixer 85 is applied on line 70A as the I-dc Out signal to the I-dc Input channel of ADC 72 (see FIG. 1).

Similarly, at mixer 86 the reflected signal is mixed with the second output signal of hybrid combiner 84 (e.g., a signal having half the power and a −90° phase shift of the tune signal). The output of mixer 86 is applied on line 70B as the Q-dc Out signal to the Q-dc Input channel of ADC 72 (see FIG. 28).

STRUCTURE: REMOTE TUNING UNIT

Figure 7:
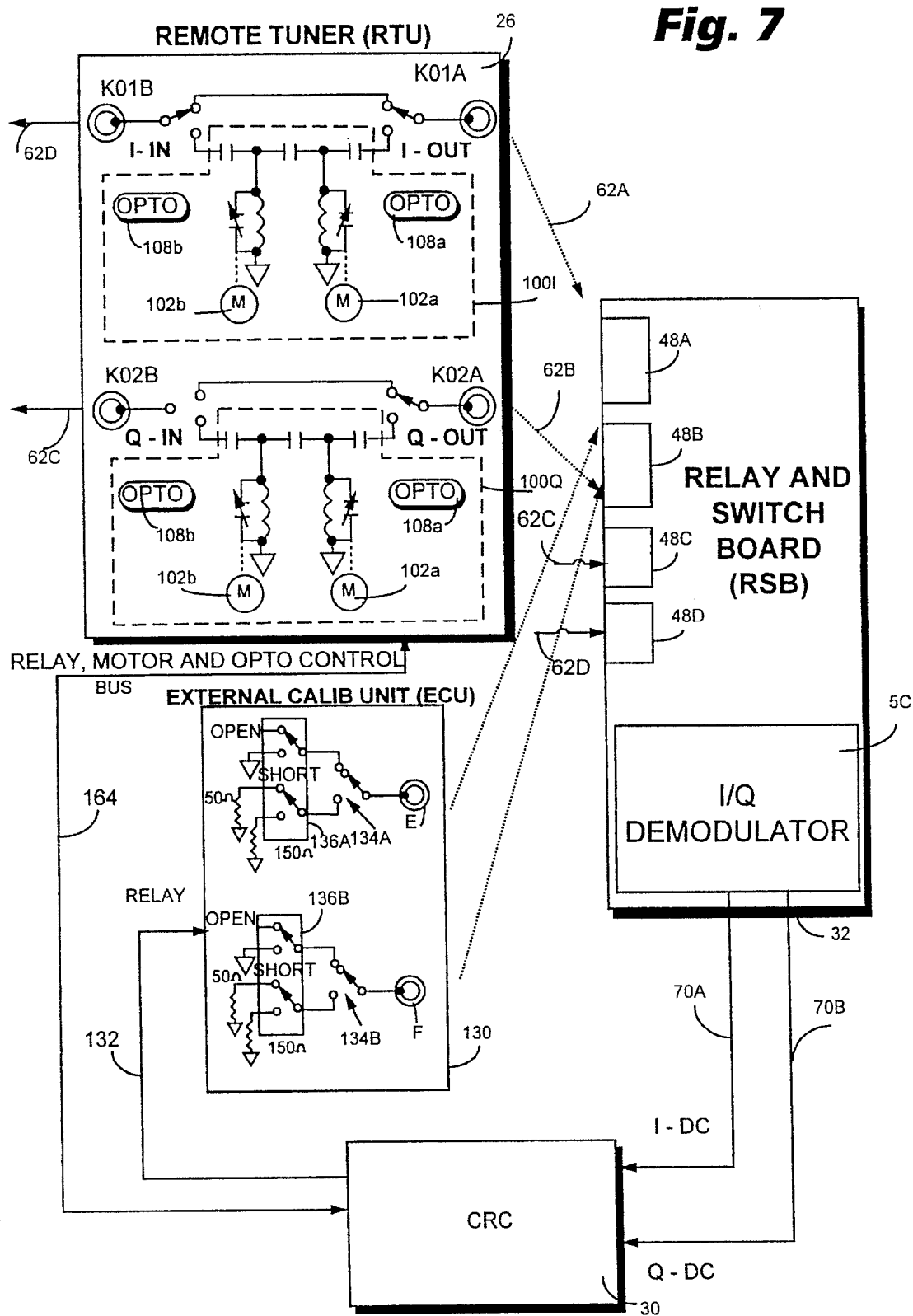
FIG. 7 is a schematic view showing connections between a tuning controller and other elements of the magnetic imaging system of the embodiment of FIG. 1.

As shown in FIG. 7, remote tuning unit (RTU) 26 has two identical tuning circuits to deal with the two channels of a high power coil. Each channel is connected to RSB 32 by two cables. The In-Phase channel is connected to RSB 32 by cables 62A and 62D; the Q channel is connected to RSB 32 by cables 62C and 62B.

Figure 3:
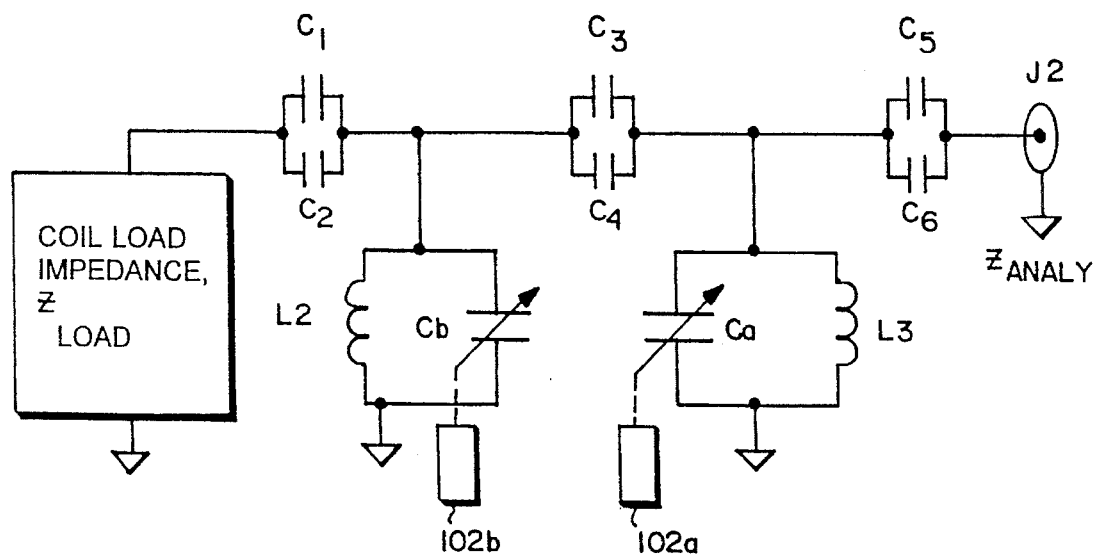
FIG. 3 is a schematic view of a tuning network included in a remote tuning unit of the system of the embodiment of FIG. 1.

Each channel comprises two relays between which a tuning network 100 is connectable. In this regard, the In-Phase channel of RTU 26 has relays K01A and K01B, while the Q (Quadrature) channel has relays K02A and K02B. FIG. 7 further shows a tuning network 100I for the In-Phase channel of RTU 26 and a tuning network 100Q for the Q channel. When the relays K01A, K01B and K02A, K02B are energized, signals bypass the tuning networks 100I and 100Q. Tuning networks of each channel are identical and are depicted in the schematic of FIG. 3. Each tuning network comprises capacitors C1 through C6; adjustable impedances (e.g., adjustable capacitors) Ca and Cb; and, inductors L1 and L2. The values of capacitors C1 through C6 and inductors L1 and L2 are dependent upon which magnet field strength is utilized for system 20. For example, for 0.35T systems, 15 MHz components are utilized and capacitors C1 through C6 each have the value of 100 pF while inductors L2 and L3 each have the value of 0.4 µH. For 0.5T systems, 21 MHz components are utilized and capacitors C1 through C6 each have the value of 75 pF while inductors L2 and L3 each have the value of 0.3 µH.

As further shown in FIG. 4, capacitors Ca and Cb are large air variable capacitors having an adjustable capacitance set by motors 102a and 102b, respectively. Each adjustable capacitor is rated at 20–480 pF. The actual capacitance of capacitors Ca and Cb is altered by electric fields between the capacitor and surrounding metal structures. As shown in FIGS. 4 and 5, each capacitor Ca, Cb has a plurality of fixed plates 104 and a plurality of moving armature blades 106.

A "zero point" position of each capacitor 102a, 102b is set by an associated infra-red ("IR") sensor 108. In this regard, capacitor Ca has IR sensor 108a (as shown in FIGS. 4 and 5), and capacitor Cb has IR sensor 108b (seen in FIG. 5).

In connection with the determination of the "zero point" of one of the adjustable capacitors Ca, Cb, associated IR sensor 108 returns a logic "0" when the blade of the armature is in front of the IR sensor (thus reflecting the IR beam). The IR sensor 108 returns a logic "1" when the blade has rotated away (thus not reflecting the IR beam). The "zero point" is defined as the motor position at which IR sensor 108 readout changes from "0" to "1" under positive direction motor increment. While the exact armature angle of detection depends upon the exact position of IR sensor 108, and upon the reflectivity of the armature, these factors do not adversely affect the operation described below.

The positive direction and negative direction rotations are defined with respect to location of IR sensor 108. IR sensor 108b is located on the left side of motor 102b, while IR sensor 108a is located on the right side of motor 102a. Thus, as shown in FIG. 5, a positive direction rotation for motor 102b is in the clockwise direction as viewed from the motor (see arrow 110b), and a positive direction rotation for motor 102a is in the counterclockwise direction (see arrow 110a in FIG. 5).

One 360° rotation of one of the capacitors Ca, Cb corresponds to 1200 steps of its corresponding motor 102a, 102b. Motors 102a, 102b have 200 steps per revolution. Gear boxes 112a, 112b, each having a 6:1 gear ratio, are employed between the respective motors 102a, 102b and capacitors Ca, Cb to obtain the 1200 steps. FIG. 6 is a graph showing capacitance values for the adjustable capacitors Ca, Cb as a function of motor step position of motors 102a, 102b. In connection with the coarse tuning operation described hereinafter, the motor step values are restricted between positions 10 and 600.

STRUCTURE: EXTERNAL CALIBRATION UNIT

As shown in FIG. 1, magnetic resonance imaging (MRI) system 20 further comprises an external calibration unit (ECU) 130 which is connected by an ECU relay bus 132 to CRC 30. As shown in more detail in FIG. 7, ECU 130 includes ECU relays 134A, 134B and ECU relays 136A, 136B. ECU relays serve to cause the ECU to supply either a short circuit, an open circuit, 150 ohms, or 50 ohms to whatever device (e.g., RTU 26) is selectively connected by cables to pins E and F of ECU 130.

As explained in more detail with reference to FIG. 15, CRC 30 uses calibrated reflection readings. Calibration measurements are made by disconnecting coaxial cables 62A and 62B from pins A and B of RTU 26 and connecting them to pins E and F of ECU 130. A calibration measurement operation is then conducted by CRC 30. After all the measurements are made, CRC 30 calculates a calibration array which is returned to host computer 31 for storage. Coaxial cables 62A and 62C are then re-connected to pins A and B of RTU 26.

STRUCTURE: COIL AND RFFE CONTROLLER

As shown in FIG. 28 taken in conjunction with FIG. 19, CRC 30 (also considered as at least part of the tuning control means) comprises the previously-mentioned analog to digital converter (ADC) 72; a microprocessor 152; a clock 153 (for microprocessor 152); and, an I/O bus 154. In addition, controller 30 includes a bank 156 of digital-to-analog converters 156A–156I; a bank 157 of output amplifiers 157A–157I (see FIG. 19); a bank of relay drivers 158; an interface 159 for motor drivers and optical sensors for RTU 26; a bank of detuning pin diode drivers 160; a driver 161 for controlling Tx on/off (e.g., switches 74A and 74B) and pin diodes; and, a coil select interface 162.

CRC 30 is connected to remote tuning unit (RTU) 26 by an RTU control bus 164. As shown in FIG. 7, RTU control bus 164 includes IR read lines for supplying signals from four IR ("opto") sensors 108; sets of motor control lines for supplying control signals to stepping motors 102; and, relay control lines for controlling relays K01A, K01B, K02A, and K02B of RTU 26.

As further shown in FIG. 28, CRC 30 is connected to sequencing controller 28 by a parallel communication bus 166 and a serial communication bus 168. Taken collectively, CRC 30 and sequencing controller 28 are referred to as a signal routing controller or signal routing means. Parallel communication bus 166 is connected to wake-up/put-to-sleep clock oscillator 153, and in addition to I/O bus 154 (for communicating select coil identification information). Further, bus 166 is connected to drivers 160 and 161, as well as interface 162, for communicating activating/deactivating and coil select information, respectively.

Each converter in bank 156 of digital-to-analog converters has input terminals which receive data from I/O bus 154. Each converter in bank 156 has its analog output terminal connected to an associated one of the amplifiers in bank 157. Four of the converter/amplifier pairs are utilized for tuning RF coils attached to port 46D of RSB 32. In particular, DACs 156A and 156B are connected to supply bias voltages to varactors 38s and 38p, respectively, of coil 22D connected to channel A of port 46D. DACs 156C and 156D are connected to varactors 38s and 38p, respectively, of coil 22D connected to channel B of port 46D. Five of the converter/amplifier pairs supply bias voltages to the varactors associated with RF coils in multicoil assembly (MCA) 22E' for tuning.

The DACs in bank 156 are uni-polar devices with twelve bit inputs (only the most significant 11 bits being required for tuning). The maximum output after amplification corresponds to +25 volts and the minimum corresponds to 0 volts.

A pair of relays are connected between CRC 30 and each varactor to which controller 30 supplies a bias voltage (as shown in FIG. 19). Relay SW201B and relay K202 are provided in series with one another between amplifier 157A and varactor 38s of channel A of coil 22D; relay SW201A and relay K201 are provided in series with one another between amplifier 157B and varactor 38p of channel A of coil 22D; and so forth for the varactors of the channel B of coil 22D. In similar fashion, the varactor of each coil included in multiple coil assembly 22E' is connected to CRC 30 through a pair of relays. For example, the varactor associated with coil 41A' is connected to amplifier 157E by relays K205 and SW203A. The relays K201–K206 selectively connect the varactors either (via the other relays) to the amplifiers in bank 157 or to −24 volts.

OPERATION: RSB CONTROL

Using input means 31A, a user directs MRI system 20 to perform either an imaging operation (in an "imaging mode"); a RF coil tuning operation (in a "tuning mode"); or a specified test measurement, such as a coil isolation measurement, for example (in a "test mode"). Input means 31A further receives an input indication as to which one of coils (22B–22E) in the RF coil assembly 22 is to be utilized for the imaging, tuning, or testing modes. As mentioned before, RSB 32 facilitates the use (e.g., imaging, tuning) of coils having differing types of matching or resonant circuits. In this respect, for each coil included in the RF coil assembly 22, RSB 32 provides a unique path for the returned MRI signal for imaging (and, for transmit/receive coils, a unique path for the Tx transmit pulse). Likewise, for tuning, for each coil included in the RF coil assembly 22, RSB 32 provides a unique path for the CW tuning signal and for the reflected signal received by the coil.

After a selected coil is tuned in a tuning mode, the imaging mode is executed for the tuned coil. Prior to the actual transmission of the Tx or transmit signal from RFU 24 on line 34, relays in RF front end 25 are set to configure the unique imaging path for the selected coil. In this regard, CRC 30, advised of the identity of the selected coil by sequencing controller 28, sets (energizes and de-energizes) relay drivers 158 so that signals are applied on bus 30B to relays in RF Front end 25 to configure the unique imaging path. The relays in RF front end 25 then remain in their thusly-set state (achieving the unique imaging path for the selected coil) during the ensuing imaging operation.

Clock 153 for microprocessor 152, and hence microprocessor 152, cannot be operated during the imaging mode in order to keep spurious noises from interfering with the RF coils and the RF front end 25. Accordingly, during an imaging mode, clock 153 for microprocessor 152 must be put to "sleep". For this reason, signals which must remain alive during the imaging mode are issued by sequence controller 28; applied to parallel communication bus 166; and routed through CRC 30 without being applied to I/O bus 154 of controller 30. The on/off control of clock 35 is subsumed in communication protocol between CRC 30 and sequencing controller 28 during a non-data acquisition period. Control lines which do not generate any spurious frequency are active and are connected through a number of low pass filters installed on the wall of the Rf shielded room 33.

In connection with both the tuning mode and the imaging mode, non-selected coils must be de-tuned so as not to interfere with the tuning or imaging operations. A separate discussion of detuning is provided below.

Table 1 (which [like Table 2, Table 3, and Table 4] is provided near the end of the text and before the claims) shows values indicative of relay and switch energization/de-energization as set by sequence controller 28 for a tuning mode for each of ports 46B–46E (having coils 22B–22E attached thereto, respectively, in the illustrated embodiment). In Table 1 (as with Table 2, Table 3, and Table 4 discussed subsequently), a "0" means that the particular relay or switch is de-energized (i.e., remains as shown in FIGS. 2 and 17) while a "1" means that the particular relay or switch is energized. A "*" indicates that the relay is not in the signal path and consequently the setting of the relay is immaterial (although such relays are generally de-energized to conserve power). A "0/1" notation indicates that the relay changes state during the tuning process under the control of controller 30. A "1/0" notation indicates that a switch changes state under the control of host controller 31. "N/A" means not applicable.

Tuning operations are discussed separately below. Table 2 shows values indicative of relay and switch energization/de-energization as set by CRC 30 for an imaging mode for each of (high power) coils 22B–22C (Tx/Rx coils). Table 3 shows values indicative of relay and switch energization/de-energization as set by CRC 30 and sequence controller 28 for an imaging mode for each of coils 22D–22E (Rx coils).

Table 4 shows values indicative of relay and switch energization/de-energization for isolation measuring operations. The isolation measurement operation is also discussed subsequently below.

Unless otherwise stated below, the value designations discussed with reference to Table 1 apply to other the Tables. In addition, a "DMP" value indicates that the value could be "0" or "1", depending on the magnet polarity at the imaging site. A "1/0" values indicates that the value toggles under the control of the sequence controller 28.

OPERATION: HIGH POWER COIL TUNING OVERVIEW

In general, a coil is "tuned" when, for a single frequency RF signal sent from RSB 32, the magnitude of the reflected signal is less than a predetermined value. As explained previously, the invention facilitates the tuning of high power coils (using RTU 26) and the tuning of varactor-tuned coils.

A high power coil, such as coil 22C or 22B, is "tuned" when the impedances (Ca and Cb) of the remote tuning unit (RTU) 26 have been adjusted such that, for a single frequency RF signal sent from RSB 32 and through either channel (i.e., the I channel and the Q channel) of RTU 26 to the coil, the magnitude of the reflected signal (represented by |K|) is less than a predetermined value, e.g., 0.05.

As will be seen hereinafter, when tuning a high power coil, the I-Phase and Q-Phase signals from RTU 26 are dealt with one at a time (by virtue of relay K111). The signal being dealt with at the moment is sent via RSB 32 to I/Q demodulator 50 where it is split into IN-Phase and Q-Phase components for ADC 72.

Figure 8:
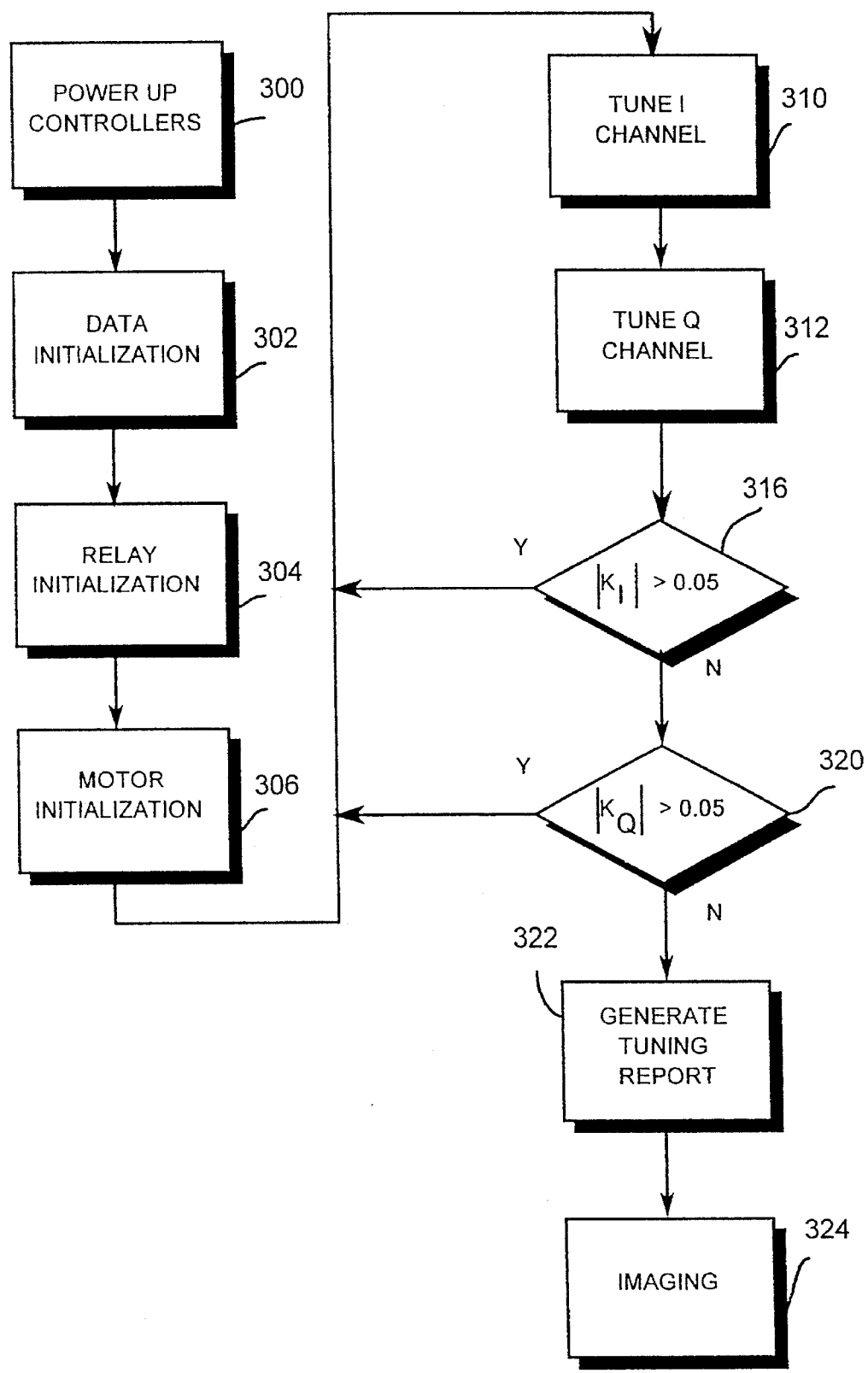
FIG. 8 is a flowchart showing steps involved in an overall high power coil tuning operation of the system of the embodiment of FIG. 1, including the steps of individually tuning an I channel and a Q channel.
Figure 9:
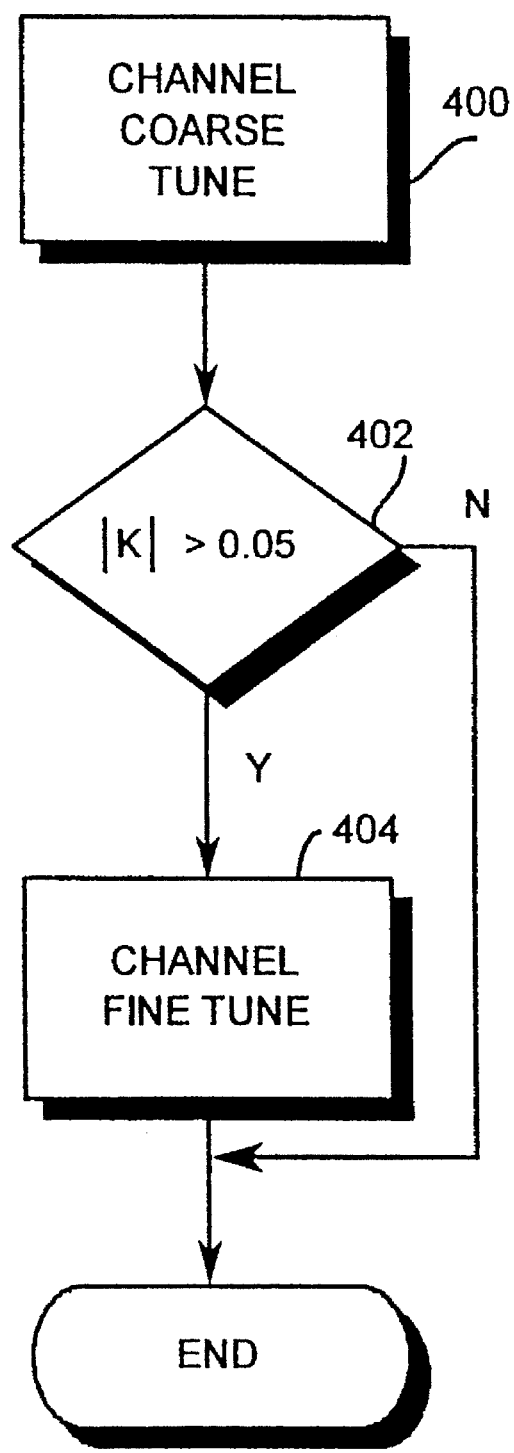
FIG. 9 is a flowchart showing steps involved in tuning a channel of the system of the embodiment of FIG. 1 (either an I channel or a Q channel), including a high power coil coarse tuning operation and a fine tuning operation.
Figure 10:
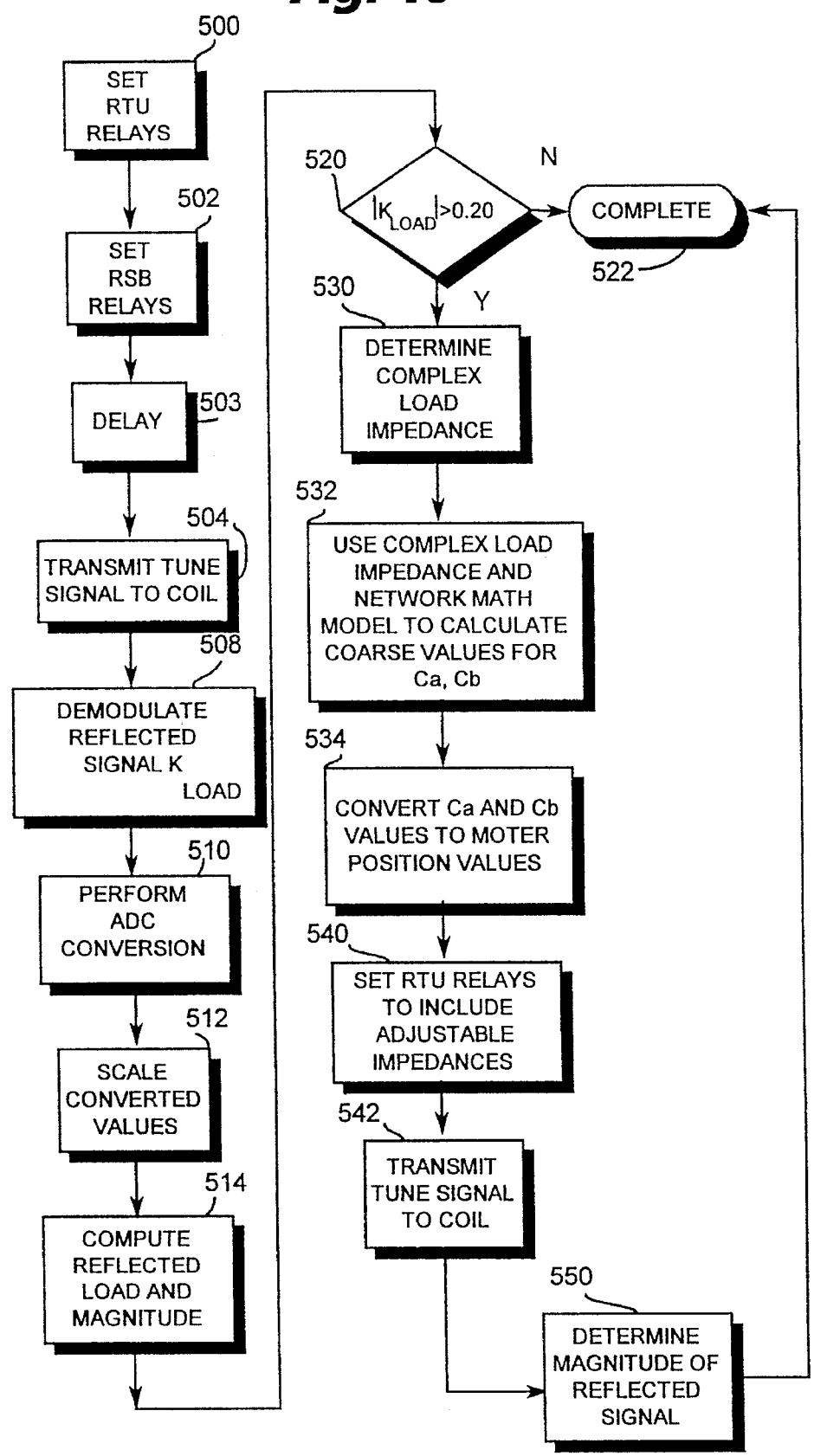
FIG. 10 is a flowchart showing steps executed in connection with the high power coil coarse tuning operation of the system of the embodiment of FIG. 1.

FIG. 8 shows steps involved in an overall tuning operation, including the steps of individually tuning the I channel and the Q channel of coils such as coils 22B or 22C. The specific steps involved in tuning a channel (either the I channel or the Q channel) are illustrated in FIG. 9, including a coarse tuning operation and a fine tuning operation. Detailed steps executed in connection with the coarse tuning operation are shown in FIG. 10.

At many junctures in the ensuing and foregoing discussion the letter "K" is employed to symbolically refer to a reflected signal. When so used, the letter "K" actually refers to the corrected full complex reflection value. The corrected complex reflection value is calculated using a procedure discussed with reference to FIG. 16. Thus, whenever the letter "K" (including with subscripts) is employed, it should be understood that the intermediate steps of FIG. 16 are assumed.

Turning now to the overall tuning operation having steps depicted in FIG. 8, a plurality of initialization steps 300, 302, 304, and 306 are first conducted. At step 300, the imaging controller 28, controller 30, and host controller 31 are powered up for the execution of coded instructions stored therein. As part or the powering up of step 300, a driver program is executed to ensure that each of the four motors 102 of RTU 26 is de-energized.

At data initialization step 302, a calibration file including global calibration constants is loaded into memory of controllers and data structures (including global motor data and general purpose data) are initialized. A calibration operation which yields the calibration file is discussed below in connection with FIG. 15. Initialized global motor data include, for each RTU 26 motor 102, a memory location for an integer motor position value and a memory location for an integer pattern (or "phase") value. The general purpose data includes two memory locations for each complex number pair (a floating value for each of the real and imaginary components of a complex number pair); a floating point memory location for each impedance (e.g., Ca and Cb) in RTU 26; and, a memory location for an integer motor position value for each motor 102 included in RTU 26.

At the relay initialization step 304, each of the relays included in RSB 32 is de-energized. As mentioned before, the de-energized positions of the relays of RSB 32 are shown in FIG. 2.

Motors 102 of RTU 26 are initialized at step 306. In this respect, motors 102 must be brought to a known starting position in order to perform the coarse tuning operation hereinafter discussed with reference to FIG. 10. As indicated above, the infra-red ("IR") sensor 108 for each motor 102 is used to detect the edge of the plate of a capacitor Ca or Cb as it is turned by its respective motor 102a or 102b. The infra-red ("IR") sensor 108 measures either a reflection (i.e., when the capacitor plate is present) or no reflection (when the capacitor plate is absent).

Using the sensor 108 on each capacitor, at step 306 the motors 102 are initialized in the following manner. Each motor 102 is rotated forward until sensor 108 is seen to go from a no-reflect to a reflect state. All four motors 102 of RTU 26 are rotated forward one full turn until sensor 108 is seen to go from a no-reflect to a reflect state once again. The number of steps each motor 102 took to perform the full turn is checked to be close to 1200, which is the known number of steps for a full revolution.

In a situation wherein a slippage is known to exist in the motor gear linkages, or in sensors 108, the above procedure is slightly modified as follows. When the state of sensor 108 is seen to change from no-reflect to reflect, the associated motor 102 is stopped. The motor 102 is then moved in the opposite directed one step at a time, until the state of sensor 108 is seen to change again to the no-reflect state. The number of steps counted in the opposite direction is determined to be a slack value. The slack value is saved and used in motor movement procedures during tuning to effectively remove the slack on motor direction changes. As will be seen hereinafter, after the each motor 102 has been initialized, controller 30 will keep track of the motor position by storing a position value and incrementing or decrementing the position value each time motor 102 is stepped. Forward stepping is in the positive direction.

After execution of the initialization steps, the overall tuning operation sequentially executes step 310 to tune the I channel and then step 312 to tune the Q channel. In connection with the tuning of the I channel, the tuning signal is applied from demodulator 50 through relays K120, K122, directional coupler 56, relays K112, K111, K116, RTU 26, and relay K115 to the coil-to-be-tuned (e.g., coil 22B or coil 22C). For tuning the I channel, the reflected signal is routed back through relay K115, RTU 26, relay 116, relay K111, relay K112, directional coupler 56, a 6 dB attenuator, relay K122, relay K113, to I/Q demodulator 50. Tuning of the Q channel is similar to that of the I channel, but with the tuning signal and the reflected signal being routed through relay K117 rather than relay K116.

Generic operational steps suitable for tuning either the I channel or the Q channel are described in more detail hereinafter with reference to FIG. 9. For present purposes, it is sufficient to state that the reflected signal from either channel is demodulated at demodulator 50 into its "I" and "Q" components for input to respective channels of ADC 72 in controller interface (TCI) 154. Execution of step 310 yields a magnitude value $|K_I|$ for the reflected signal from the I channel. Similarly, execution of step 312 yields a magnitude value $|K_Q|$ for the reflected signal from the Q channel.

At step 316 controller 30 determines whether the magnitude value $|K_I|$ for the reflected signal from the I channel is greater than 0.05. If so, steps 310 and 312 are re-executed to again tune both the I channel and the Q channel. Otherwise, a check is made at step 320 to determine whether the magnitude value $|K_Q|$ for the reflected signal from the Q channel is greater than 0.05. If so, steps 310 and 312 are re-executed to again tune both the I channel and the Q channel.

It will be seen from the foregoing that the I channel and the Q channel will be repetitively retuned until both $|K_I|$ and $|K_Q|$ are not greater than 0.05. Steps 310 and 312 will likely be executed but once for coils with well isolated channels (e.g., greater than 17 dB). Steps 310 and 312 will likely be executed two or three times for coils having isolation between 10 dB and 17 dB. Steps 310 and 312 may be executed four or more times for coils with poor isolation. Controller 30 allows the execution of the loop from steps 310 to 320 to occur only for a predetermined time interval (e.g., 30 seconds) to prevent too many iterations.

At step 322 controller 30 provides (via either an unillustrated printer and/or display screen) a tuning report. An example of a tuning report is provided in Appendix 1. For each channel the report includes values ("m1" and "m2") for the positions of motors 102; a VSWR value; raw coil measurement values, coarse tune measurement values, and fine tune measurement values (all explained hereinafter with reference to FIGS. 9 and 10). For each measurement value real and imaginary components ("r" and "i", respectively) are provided, as well as a magnitude value ("mag"). The tuning report also includes capacitance (e.g., capacitor "Ca" and "Cb") values calculated for the coarse tune. The tuning report further indicates the time at which the channel tune began and the time at which the channel tune terminated.

When the system 20 including RTU 26 has been successfully tuned, an imaging operation is conducted at step 324. In imaging step 324, the transmit pulse Tx is applied from RFU 24 through RSB 32 and the remote tuning unit (RTU) 26 to the target coil (e.g., coil 22B or coil 22C). In RSB 32 transmit pulse Tx is routed through the signal conditioning and routing network 54 and (as indicated by symbols "W" and "V") through both relays K116 and K117 to RTU 26 as signals "I in" and "Q in" respectively. The relays of RTU 26 are de-energized so that tuning networks 100 are not bypassed. Upon return from RTU 26 the transmit pulse Tx is routed as signals "I out" and "Q out" through relay K115 and to the target coil. After a short time the MRI RF signal returns in similar manner through relay K115, both channels of RTU 26, both relays K116 and K117, network 54, and relay K110 for application as a single signal on line 37 to RFU 24. In RFU 24 the MRI RF signal is demodulated and split into two quadrature signals for use by imaging controller 28 in the imaging operation.

OPERATION: HIGH POWER COIL CHANNEL TUNING

The channel tuning operations of both steps 310 and 312 are understood with reference to the steps shown in FIG. 9. The channel tuning steps of FIG. 9 are executable for either the I channel or the Q channel (e.g., the steps depicted in FIG. 9 are applicable for both channels).

Each channel tuning operation includes a coarse tuning step 400. The coarse tuning step is described in more detail with reference to FIG. 10. Upon the completion of the coarse tuning step, controller 30 computes the magnitude of the reflected signal $|K_x|$ for the channel (the subscript x being either "I" for the I channel or "Q" for the Q channel).

At step 402 controller 30 determines whether the magnitude of the reflected signal (e.g., $|K_x|$) is greater than 0.05. If so, controller 30 executes a fine tuning operation depicted by step 404.

Thus, it should be understood that channel tuning steps of FIG. 9 are executed for each channel (e.g., for the I channel at step 310 of FIG. 8 and for the Q channel at step 312 of FIG. 8). The details of the coarse tuning operation and the fine tuning operation are elaborated below.

OPERATION: HIGH POWER COIL COARSE TUNING

The purpose of the coarse tuning operation shown in FIG. 10 is to coarsely set values for the variable impedances of remote tuning unit (RTU) 26 (e.g., for variable capacitors Ca and Cb). The purpose of the coarse tuning operation is to coarsely tune those coils whose VSWR is ≦4. Although RTU 26 is capable of tuning coils with a higher VSWR, the signal-to-noise ratio (SNR) will decrease as the coils' VSWR increases.

FIG. 10 illustrates steps involved in the coarse tuning operation depicted as step 400 of FIG. 9. It should be remembered that the channel tuning operation of FIG. 9, and consequently the coarse tuning operation of FIG. 10, is executed separately for each of the two channels (i.e., separately for the I channel and for the Q channel).

In the coarse tuning operation of FIG. 10, a raw measurement of the reflected signal is first performed. In order to obtain the raw measurement, at step 500 the relays K01A and K01B of the I channel of RTU 26, as well as relays K02A and K02B of the Q channel, are energized to bypass tuning networks 100I and 100Q, respectively. Thus, variable capacitances Ca and Cb are bypassed. Energization of the relays included in RTU 26 occurs by the application of appropriate signals from tune controller 30 on relay control lines included in bus 164 (see FIG. 7). In the case of a quadrature tune, the relays should be energized for both channels simultaneously because the coil's channels may not be well isolated.

Also in preparation of obtaining the raw measurement, at step 502 the relays in RSB 32 are appropriately set to obtain a channel raw measurement. In this regard, CRC 30 applies signals on relay control lines 30B (see FIG. 1) to set the relays in RSB 32 so the tuning output signal "R" from demodulator 50 ("ref out" pin) can be routed through relay K120, relay K122, directional coupler 56, relays K112 and K111, through either relay K116 or relay K117 (depending on whether the I channel or the Q channel is being tuned), and (after return from RTU 26) through relay K115. At step 503 a delay is provided to allow RTU relays to settle before trying to obtain a measurement. At step 504 the tuning signal "R" is routed through RSB 32 as described with reference to step 502 and through RTU 26 as described with reference to step 500 (i.e., bypassing the tuning networks 100) and is applied to target coil 22.

At step 508 the complex reflected signal is reflected to demodulator 50 and is demodulated into its I phase and Q phase components for application to the respective I channel and Q channel input terminals of ADC 72. The complex reflected signal obtained at step 508 is labeled $K_{load}$ in view of the fact that it refers to the reflection from the coil-to-be-tuned. In this regard, the reflected signal $K_{load}$ is obtained with the relays of RTU 26 energized (e.g., bypassing tuning networks 100).

Accordingly, the complex reflected signal $K_{load}$ is routed from the coil-to-be-tuned back through ports 46, through relay K115, through RTU 26 (bypassing tuning networks 100), through either relay K116 or K117 (depending on the channel being tuned), through relays K111 and K112, through directional coupler 56, and through relays K122 and K113 to the "tune signal in" pin of demodulator 50.

The reflected signal, $K_{load}$, is a complex value with magnitude always less than or equal to 1. As previously explained with reference to FIG. 18, I/Q demodulator 50 uses the continuous wave (CW) signal at the MRI center frequency generated by RFU 24 and applied on line 36 to the "directional coupler in" pin of demodulator 50, as well as an output level specified by a TXGAIN parameter (set by imaging computer 28), to demodulate the reflected signal into its DC quadrature components ("I-dc Out" and "Q-dc Out"). Thus, the reflected signal is a complex number corresponding to a measured reflection in Cartesian coordinates (x+iy).

At step 510 the demodulated DC quadrature components ("I-dc Out" and "Q-dc Out") are read by the respective I channel and Q channel input terminals of ADC 72 and an analog to digital conversion operation is performed on each.

After the analog to digital conversion, at step 512 a scaling operation is performed by controller 30 in order to convert the raw ADC readings from values of between from 0 to 4095 to values of between −1 and +1. At step 514 controller 30 uses the converted and scaled components of the reflected signal to compute both the complex reflected load signal $K_{load}$ and the reflected magnitude $|K_{load}|$. The computation of the complex reflected load signal $K_{load}$ and its magnitude are understood with reference to the steps of FIG. 16 (up to step 906), which provide for correction of the measured signal.

At step 520 controller 30 determines whether the magnitude of the reflected signal $|K_{load}|$ is greater than 0.20. If the magnitude of the reflected signal is less than or equal to 0.20, the coarse tuning operation for the channel is terminated (as indicated by step 522). Otherwise, controller 30 continues execution of the coarse tuning operation at step 530.

At step 530 controller 30 uses the complex reflected signal $K_{load}$ to determine a complex load impedance value $Z_{load}$. The complex load impedance value $Z_{load}$ is computed for a 50 Ω coil using the generalized relationship of Equation 1 (wherein K is the complex reflected signal $K_{load}$ and Z is the complex load impedance $Z_{load}$).

$$Z = 50 \times [(1+K)/(1-K)] \qquad \text{[Equation 1]}$$

At step 532 controller 30 uses the complex load impedance $Z_{load}$ (determined at step 530) and a mathematical model of tuning network 100 to calculate coarse values for adjustable capacitances Ca and Cb. A further explanation of step 532 immediately ensues.

At step 532 controller 32 calculates capacitances Ca and Cb from the measurement of the complex load impedance $Z_{load}$ and with the use of analytic circuit impedance equations for tuning network 100. The component values of tuning network 100 as shown in FIG. 3 are not utilized in the analytic circuit impedance equations in view of various stray effects. Accordingly, the schematic circuit of FIG. 11 represents a mathematical model of the tuning network which takes the stray effects into consideration.

Figure 11:
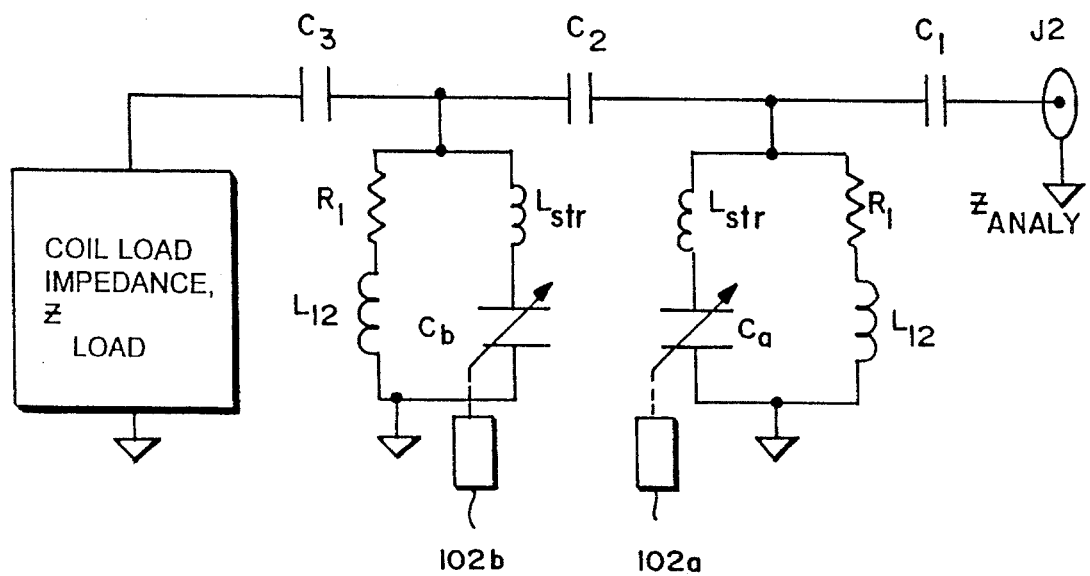
FIG. 11 is a schematic view of a mathematical model of a tuning network included in a remote tuning unit of the system of the embodiment of FIG. 1.

The mathematical model of FIG. 11 includes capacitances $C_3$, $C_2$, and $C_1$ (corresponding to capacitances C1 to C6 of FIG. 3); inductors $L_{12}$; resistors $R_1$ (which provide a finite Q to the two tank circuits); and, inductances $L_{str}$ (which represent 6 centimeter long copper strips connecting capacitors Ca and Cb to network 100). The values of the components included in the mathematical model of FIG. 11 are listed separately in Table 5 for both a 15 MHz system and a 21 MHz system.

The component values of Table 5 were obtained by fitting them to impedance data acquired from an RTU 26 with a known load. Specifically, measurements of $Z_{analy}$ (of FIG. 11) as a function of frequency were made with $Z_{load}$=50 Ω and Ca and Cb fixed at arbitrary values. Then the component values were varied until the predicted impedance matched the observed values to give the lowest squared error. The gathering of data for the determination of component values for RTU 26 is described in more detail in connection with the calibration operation, particularly FIGS. 15H and 15I.

The component fitting process used Equation 9 (below) to match the predicted $Z_{analy}$ to the observed $Z_{analy}$. Equation 9 is derived from the equivalent circuit of FIG. 11 and is simplified by using the intermediate impedances and admittances given by Equations 2–8. The intermediate impedances, Z, are in units of complex ohms (Ω), and the intermediate admittances, Y, are in units of siemens ($\Omega^{-1}$). For the equations appearing below, $$\omega = 2\pi \cdot \text{Freq}$$
$$j = \sqrt{-1}\ .$$

| | |
|---|---|
| $Z_{C1} = (-j)/(\omega \cdot C_1)$ | Equation 2 |
| $Z_{C2} = (-j)/(\omega \cdot C_2)$ | Equation 3 |
| $Z_{C3} = (-j)/(\omega \cdot C_3)$ | Equation 4 |
| $Z_{Ca} = (-j)/(\omega \cdot C_a)$ | Equation 5 |
| $Z_{Cb} = (-j)/(\omega \cdot C_b)$ | Equation 6 |
| $Y_{RL} = 1/(R_1 + j \cdot \omega \cdot L_{12})$ | Equation 7 |
| $Z_{ST} = j \cdot \omega \cdot L_{str}$ | Equation 8 |

$$Z_{analy} = Z_{C1} + \cfrac{1}{Y_{RL} + \cfrac{1}{Z_{Ca} + Z_{ST}} + \cfrac{1}{Z_{C2} + \cfrac{1}{Y_{RL} + \cfrac{1}{Z_{Cb} + Z_{ST}} + \cfrac{1}{Z_{C3} + Z_{load}}}}} \qquad \text{Equation 9}$$

The value of $Z_{load}$ (obtained from the reflected signal at step 530) and $Z_{analy}$ (equal to 50 Ω at the tuned point, since $K_{analy}$=0.0 at the tuned point) are used to calculate Ca and Cb at step 532. Whereas Equation 9 supra calculated $Z_{analy}$ when given $Z_{load}$, Ca, Cb, and the other fitted component values, the step 532 calculation works in the reverse direction by calculating the Ca and Cb values when given $Z_{load}$ and $Z_{analy}$. The equations to calculate Ca and Cb use the same intermediate impedances and admittances of Equations 2 through 8, but include further intermediate impedances so as to simplify the final expressions. The calibrated RTU 26 measures $Z_{analy}$ directly and measures $Z_{load}$ with the relays of RTU 26 energized. These two "knowns" can then be lumped together with other known parameters into the intermediate admittances $Y_{beg}$ and $Y_{end}$ as defined by Equations 10 and 11.

$$Y_{beg} = 1/(Z_{analy} - Z_{C1}) - Y_{RL} \qquad \text{Equation 10}$$

$$Y_{end} = Y_{RL} + [1/(Z_{C3} + Z_{load})] \qquad \text{Equation 11}$$

Using the fact that the real part of $Z_{Ca}$ equals zero, $C_a$ can be eliminated from the real part of the impedance equation and $C_b$ can be solved. This approach yields the correct $C_b$ value, but also introduces another intermediate admittance, $Y_\alpha$. In Equation 12, $\mathcal{R}[Z]$ stands for the real part of Z, and $\mathcal{I}[Z]$ stands for the imaginary part of Z. Note that $Y_\alpha$ is a real number without an imaginary component.

$$Y_\alpha = -\mathcal{R}\frac{1}{[Z_{C2}]}\ . \qquad \text{Equation 12}$$

-continued $$\left(1 - \sqrt{\left(-\mathcal{R}\frac{[Y_{anal}]}{[Y_{beg}]}\right) \cdot (1 - \mathcal{I}_{[Z_{C2}]}\mathcal{R} \ [Y_{ueg}^{\mathcal{R}}] \cdot \ [Y_{anal}])}\right)$$

The intermediate admittance, $Y_\alpha$, is used to calculate the impedance of $C_b$, $Z_{Cb}$, in Equation 13.

$$Z_{Cb} = \frac{-i}{Y_\alpha} \mathcal{I}_{[Y_{anal}]} - Z_{ST} \quad \text{Equation 13}$$

With $Z_{Cb}$ known, the original impedance Equation 9 can be rearranged to get $Z_{Ca}$ as shown by Equation 14.

$$Z_{C\alpha} = -Z_{ST} + \cfrac{1}{Y_{beg} - \cfrac{1}{Z_{C2} + \cfrac{1}{Y_{anal} + \cfrac{1}{Z_{Cb} + Z_{ST}}}}} \quad \text{Equation 14}$$

The Ca and Cb values are found from $Z_{Ca}$ and $Z_{Cb}$ by inverting Equations 5 and 6, respectively.

Thus, in determining the Ca and Cb values at step in the manner just described, controller 30 serves as impedance value determination means. In this regard, controller 30 uses quadrature demodulation of the reflected signal to determine values of the adjustable impedances (Ca and Cb) in an effort ultimately for obtaining a magnitude of the reflected signal below a predetermined value.

At step 534 the calculated adjustable impedance values of Ca and Cb are turned into motor position values for motors 102 included in RTU 26. The chart of FIG. 6 illustrates the conversion from capacitance value to motor step position. The motor position values along the X axis of FIG. 6 are written as digital values to tuning controller 130, whereby motors 102a, 102b receive appropriate signals on RTU control bus 164 for moving armature blades 106 so that the calculated capacitances Ca and Cb are set.

Thus, motors 102a and 102b, under the control of controller 30, provide means for setting adjustable impedances Ca, Cb of impedance match tuning network 100 at the values determined by the impedance value determination means (e.g., controller 30).

After the capacitances Ca and Cb have been set to the values computed at step 532, at step 540 controller 30 sets the relays of RTU 26 so that the adjustable impedances (Ca and Cb in each tuning network 100) are no longer bypassed. In this respect, controller 30 applies signals on RTU control bus 164 to de-energize relays K01A, K01B, K02A, and K02B. De-energization of relays K01A and K01B connect tuning network 100I in the I channel for the coil-to-be-tuned; while de-energization of relays K02A and K02B connect tuning network 100Q in the Q channel for the coil-to-be-tuned. It will be appreciated that one of these channels (the channel currently undergoing tuning) will have just had the value of its capacitances Ca and Cb coarsely adjusted as a result of the calculations at step 532 and the capacitance motors driving operations at step 534.

Upon inclusion of tuning networks 100I and 100Q in RTU 26 in the manner just described, at step 542 controller 30 causes the tuning signal from demodulator 50 to again be applied to the coil-to-be-tuned. In a manner understood from the preceding discussion, the tuning signal is applied through RSB switching network 32, through RTU 26 (including tuning networks 100), and through relay K115 to cables 40 for application to the coil-to-be-tuned. At step 542 the tuning signal is transmitted through both the I channel and the Q channel of RTU 26, meaning that both RSB relays K116 and K117 are energized.

After application of the tuning signal, the signal reflected from the coil-to-be-tuned is transmitted to tune controller 30 via directional coupler 56 and I/Q demodulator 50 in similar manner as aforedescribed.

At step 550, controller 30, after receipt of the reflected signal, determines the magnitude of the reflected signal. The determination of reflected signal magnitude at step 550 essentially includes the same operations as discussed with reference to steps 508, 510, 512, and 514. This determination of reflected signal magnitude is utilized after return (step 522) to the basic channel tuning operation of FIG. 9 (see step 402 of FIG. 9).

The coarse tuning operation of FIG. 10 typically sets capacitances Ca and Cb to within 15% of their tuned values. After the coarse tuning operation (step 400 of FIG. 9) is completed, the fine tune operation (step 404 of FIG. 9) is the next step in the tuning process.

OPERATION: HIGH POWER COIL FINE TUNING

Figure 12:
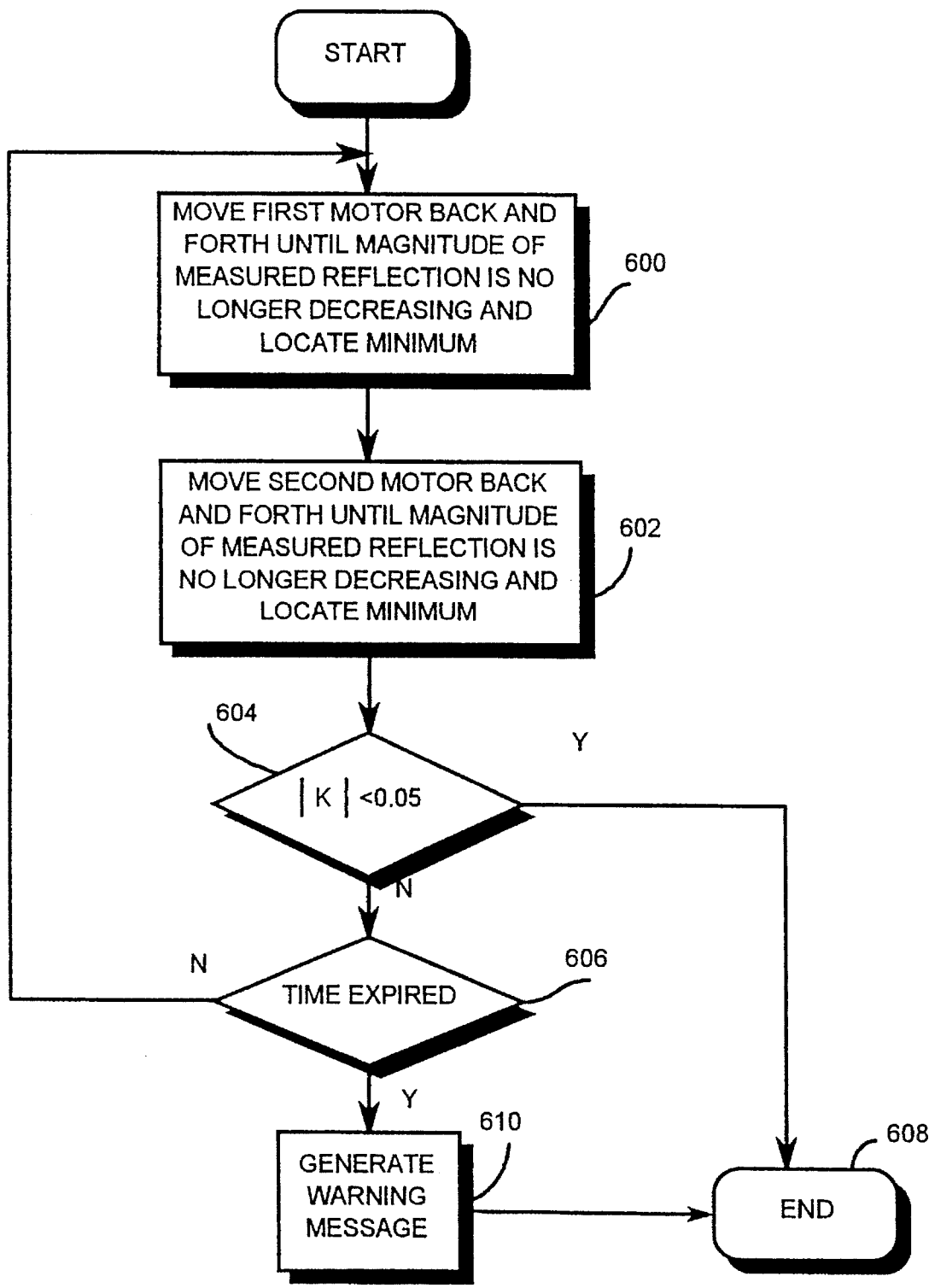
FIG. 12 is a flowchart showing steps executed in connection with the high power coil fine tuning operation of the system of the embodiment of FIG. 1.

The fine tuning operation of a high power coil (which generally follows the coarse tuning operation) is depicted by step 404 in FIG. 9 and is further illustrated by the steps set forth in FIG. 12. Basically, the fine tuning operation for a channel refines the tuned solution of the coarse tuning operation.

In the fine tuning operation, at step 600 controller 30 first rotates one of the motors 102 (thereby varying impedance of a first of the adjustable impedances [e.g., Ca] from its coarsely calculated value) and determines an impedance value at which the magnitude of the reflected signal is a minimum. Then at step 602, in similar manner, controller 30 rotates the other of motors 102 (thereby varying the impedance of a second of the adjustable impedances [e.g., Cb] from its coarsely calculated value) and determines an impedance value at which the magnitude of the reflected signal is a minimum. As indicated by steps 604 and 606, the rotation of the two motors continues in an alternating manner until either the tuned point is reached or (at step 606) a time limit has expired. The tuned point is defined by |K|<0.05.

The number of fine tune steps is dependent upon how the reflection behaves near the tuned point. FIGS. 13 and 14 illustrate fine tuning operational paths for two examples. In FIGS. 13 and 14, the reflected signal $K_{analy}$=x+iy is graphed, with the real component being plotted on the X axis (ordinate) and the imaginary component being plotted on the Y axis (abscissa). In FIGS. 13 and 14, the thin circles have radii |K|=0.05, 0.10, 0.15, 0.20 . . . 0.55. Any |K| value within the |K|=0.05 circle is considered to be tuned. The thick lines are the |K| values corresponding to changing either capacitor Ca or Cb while keeping the other capacitor constant.

FIG. 13 is a graph of a relatively easy fine tuning $K_{analy}$ path with $K_{load}$=0.1+i0.1. As shown in FIG. 13, the coarse tuning operation moved Ca to the point labeled "Start", whereat Ca is about 15% greater than the tuned point ("Tuned") and Cb is about 10% greater than the tuned value, giving a starting point of $K_{analy}$=0.2+i0.07. Since the constant Ca and Cb arcs are almost orthogonal, the tuned point (|K|<0.05) is found within four sweeps. For the case of FIG. 13, the tuned capacitor values are Ca= 155 pF and Cb=187 pF. As explained above, each sweep consists of moving a motor until the minimum |K| is reached.

FIG. 14 is a graph of a relatively difficult fine tuning $K_{analy}$ path with $K_{load}$=0.6+i0.6. As shown in FIG. 14, the coarse tuning operation moved Ca to the point labeled "Start", whereat Ca is about 15% less than the tuned point ("Tuned") and Cb is about 10% less than the tuned value, giving a starting point of $K_{analy}$=−0.3−i0.65. Since the constant Ca and Cb arcs intersect at shallow angles, the tuned point (|K|<0.05) is found only after many small sweeps. For the case of FIG. 14, the tuned capacitor values are Ca=425 pF and Cb=114 pF.

In connection with the above described fine tuning operation of FIG. 12, it should be understood that controller 30 (via bus 164) sets RTU relays so that the tuning networks 100 are not bypassed (that is, so that the adjustable impedances are included in the connection to the coil-to-be-tuned), much in the manner of step 540 discussed above. Further, controller 30 sets RSB relays so that a tuning signal will be routed through relays K116 and K117, through RTU 26, and through relay K115 to the coil-to-be-tuned (in like manner with previously described steps).

When a measured reflection is to occur in the fine tuning operation at either step 600 or 602, the tuning signal is applied through RTU 26 including tuning networks 100 (with the capacitances Ca, Cb), in the manner understood from the foregoing discussion of the states of the relays of RSB 32 and RTU 26. The reflected signal is returned to controller 30 (via directional coupler 56, I/Q demodulator 50, and ADC 72 in the manner above described as by step 548, for example). The determination of the magnitude of the reflected signal is accomplished much in the manner as even numbered steps 508–514 previously described with reference to the coarse tuning operation of FIG. 10. Although steps 508–514 concerned the determination of $|K_{load}|$, it will be readily understood therefrom that the magnitude |K| is similarly determined, including the signal correction steps of FIG. 16.

In the fine tuning operation, motor stepping is done in small increments equal to the sum of (1) the previously-discussed motor slack value (on a direction change only), plus (2) either six steps (if the reflection is far off [e.g., magnitude of 0.20 or greater]) or three steps (if the reflection is closer to tolerance). This ensures that motor 102 will move the capacitor enough to get some change in measured reflection. If the slack value (established during motor initialization—see step 306) becomes too large, fine tuning will become less accurate.

Thus, after each movement of a motor 102, the reflection is measured in the above-described manner to determine if progress is being made. If, after each motor has been tried, and if progress is less than desired, or if the fine tuning operation has taken too long (step 606), the fine tuning operation is terminated (see step 608) and motors 102a, 102b are moved to their last best tune position. In addition, at step 610 a warning message (e.g., "WARNING, DEVICE MAY NOT BE TUNABLE!!") may be generated.

The coarse tuning operation finds the Start point within about one second; the fine tuning operation takes between one second and three seconds to find the tuned point. The total tuning time for a QD coil is the sum of the tune times of each channel plus any extra time taken due to poor channel isolation.

OPERATION: CALIBRATION

Various systematic errors may arise in the MRI system 20 of the embodiment of FIG. 1. Such errors may arise from such considerations as imperfect directivity of directional coupler 50, impedance mismatches at connectors, and insertion loss of the relays and connectors. The amount of such errors can vary as a function of frequency and may be more noticeable at high frequencies (where the RF wavelength is shorter compared to the cable lengths).

In view of potential systematic errors, a reflected signal used in any tuning operation is "corrected" in the manner described below. In this respect, a corrected reflection signal $K_{cor}$ is calculated using interpolated values from arrays of calibration constants computed during a calibration operation. The calibration operation is executed upon installation of the system 20. In addition, the calibration operation may be executed prior to any tuning operation, or alternatively may be executed only periodically (e.g., at intervals of several months) and the arrays stored for subsequent use in the tuning operations until a further updating of the calibration operation.

In the calibration operation, coaxial cables 62 are disconnected from points A and B of RTU 26 and are instead connected to points E and F of external calibration unit (ECU) 130 (see FIG. 7). Then controller 30 executes the calibration procedure wherein calibration measurements are made and calibration sample values are calculated from reflection measurement data of open, short, and 50 ohm loads at several (e.g., 21) sample frequencies. The sample measurement data is used by controller 30 to calculate calibration constants (R, D, T, and S) for the sample frequencies. Tuning controller 30 returns arrays of calibration constants to host computer 31 for storage. The coaxial cables 62 are then re-connected to points A and B of RTU 26.

Since the arrays of calibration constants are calculated at a variety of frequencies but not necessarily at the frequency at which the system 20 may operation on a given occasion, controller 30 derives interpolated values of the four calibration constants from the arrays for the operational frequency to use when computing a corrected reflection $K_{cor}$. Although not specifically stated above in connection with the coarse tuning and fine tuning operations, correction in the below described manner is performed with respect to each instance of determining a reflected signal. In other words, whenever the letter "K" is used to refer to a reflected signal, it should be understood that the correction described below is also performed.

For 0.35T magnet systems, calibration measurements are measured at 21 sample frequency points between 14.5 MHz and 15.5 MHz. For 0.50T magnet systems, the frequency span is from 20.5 MHz to 21.5 MHz. Calibration measurements are gathered over these wide frequency ranges so that when reflection measurements are made at a specific frequency, the appropriate calibration constants can be interpolated. These frequency ranges were chosen to include the widest possible range of center frequency drift and lowest expected coil Q value.

For each of the 21 sample frequency points involved in the calibration, four measurements are taken. If "i" denotes a sample frequency, these four calibration measurements are (1) the reference signal at the sample calibration frequency [$R_i$]; (2) the reflected signal with the ECU 130 relays set to "Open" [$A_{0i}$]; (3) the reflected signal with ECU 130 relays set to "Short" [$A_{Si}$]; and, (4) the reflected signal with the ECU relays set to "50 ohms" [$A_{50i}$].

For each sample frequency i controller 30 uses the four calibration measurements to calculate three calibration constants for the frequency i. The three calibration constants $D_i$, $T_i$, and $S_i$ are evaluated using Equations 15– 17, respectively, with the $K_{0i}$, $K_{Si}$, and $K_{50i}$ parameters of those equations being understood from Equations 18–20, respectively.

$$D_i = K_{50i} \quad \text{Equation 15}$$

$$T_i = \frac{2K_{Si}K_{Oi} - 2K_{50i}(K_{Si} + K_{Oi})}{K_{Si} - K_{Oi}} \quad \text{Equation 16}$$

$$S_i = \frac{2K_{50i} - (K_{Si} + K_{Oi})}{K_{Si} - K_{Oi}} \quad \text{Equation 17}$$

$$K_{Oi} = A_{Oi}/R_i \quad \text{Equation 18}$$

$$K_{Si} = A_{Si}/R_i \quad \text{Equation 19}$$

$$K_{50i} = A_{50i}/R_i \quad \text{Equation 20}$$

Controller 30 thus prepares four arrays (R, D, T, and S) for the 21 sample frequencies. As mentioned above, a linear interpolation on the R, D, T and S arrays is performed to derive interpolated constants $R_{int}$, $D_{int}$, $T_{int}$ and $S_{int}$ specific to the frequency in use.

The corrected reflection, $K_{cor}$, at a single frequency is derived from the measured reflection ($A_{meas}$) and the interpolation constants $R_{int}$, $D_{int}$, $T_{int}$ and $S_{int}$ in accordance with Equation 21.

$$K_{cor} = \frac{(A_{meas}/R_{int}) - D_{int}}{S_{int}(A_{meas}/R_{int}) + T_{int}} \quad \text{Equation 21}$$

In view of the calibration operation, a typical $K_{cor}$ or value of a load placed at RTU 26 is within 3% of the true |K| and within 5% of the true reflected angle. Further, the electrical length of the traces within ECU 130 almost exactly matches the electrical length of the coaxial cable 62 between relay K0A1 and the matching board (tuning network 100) of RTU 26.

Figure 15:
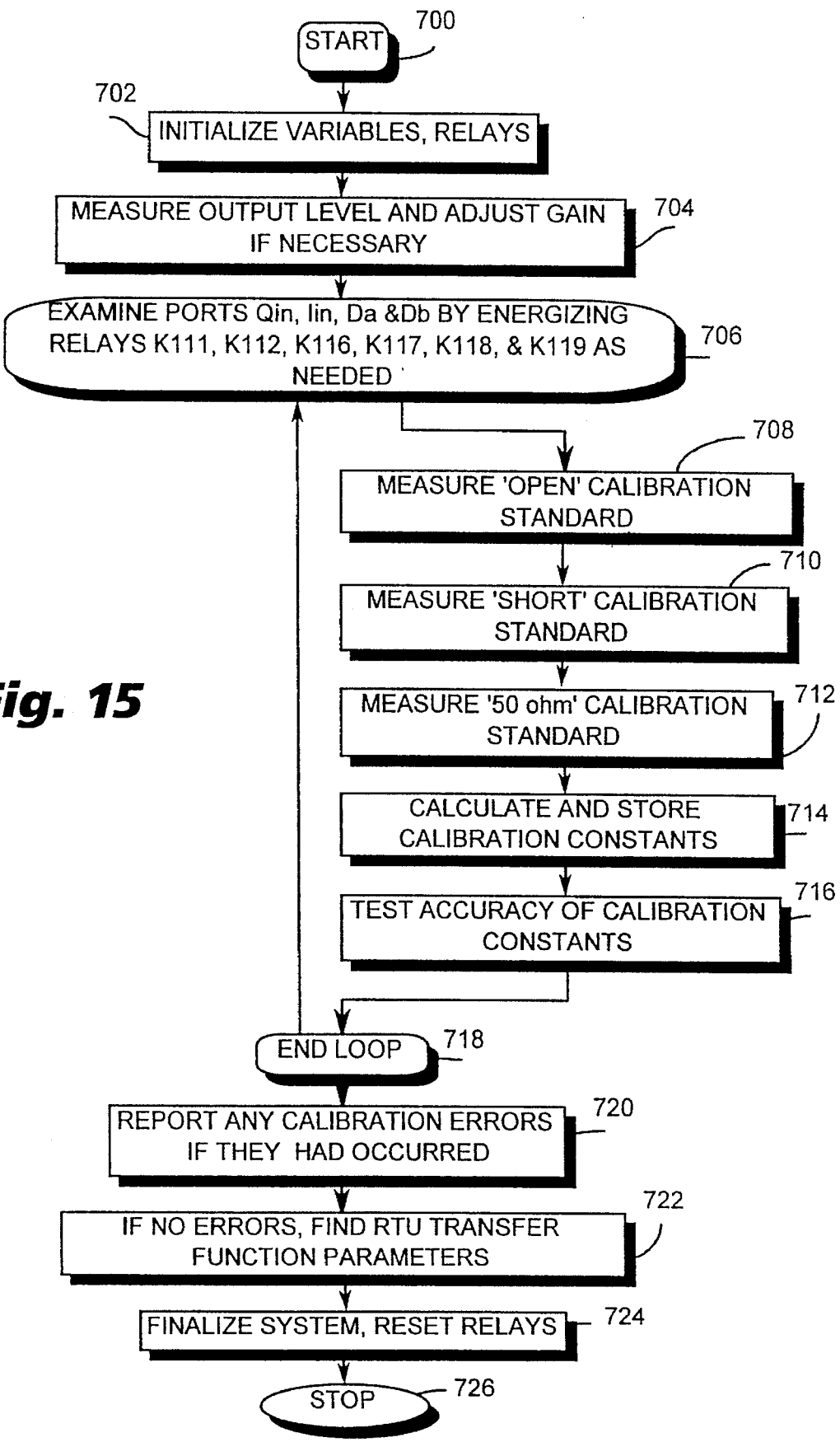
FIG. 15 is a flowchart showing steps executed in connection with a calibration operation of the system of the embodiment of FIG. 1.
Figure 15A:
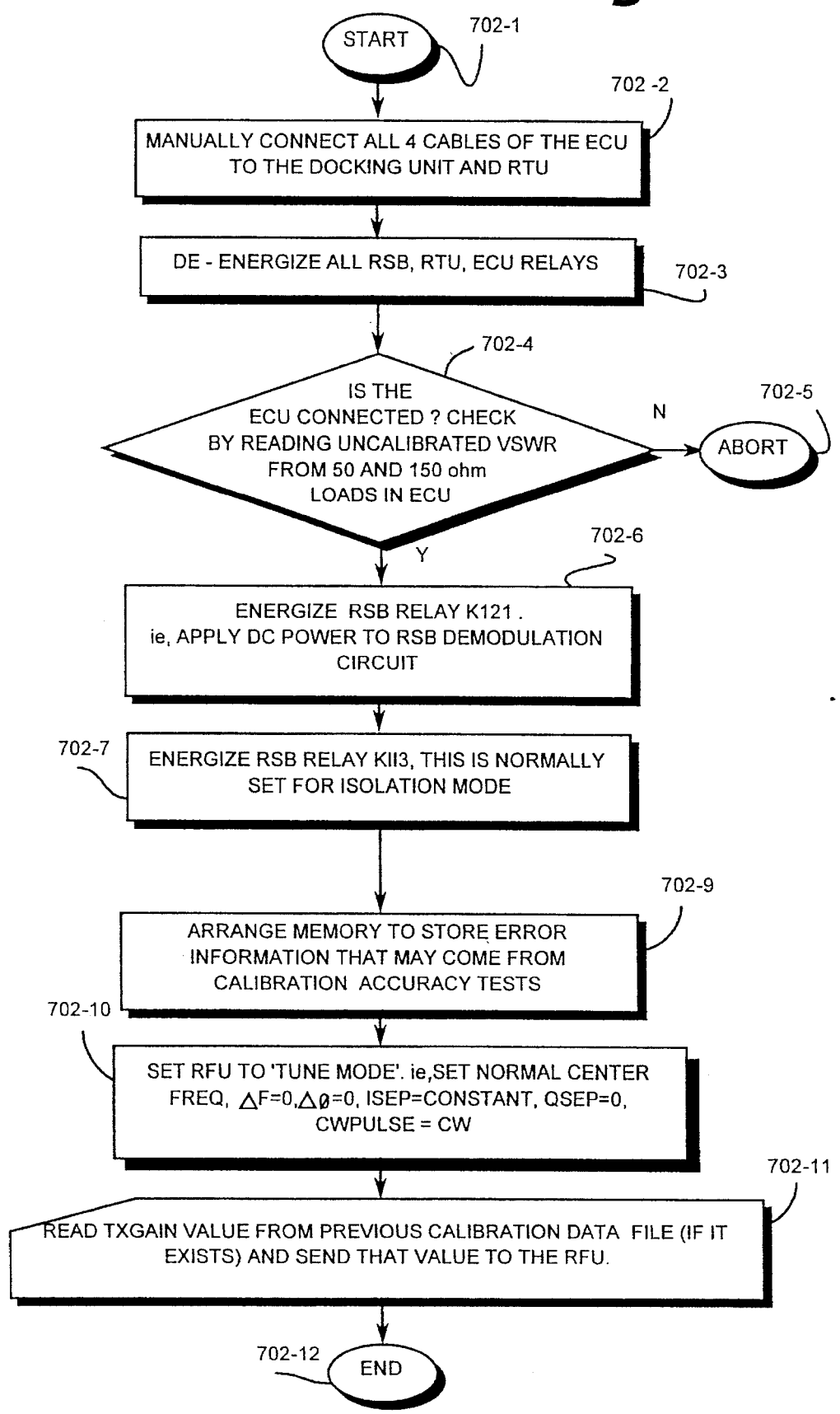
FIG. 15A is a flowchart showing steps executed in connection with an initialization portion of the calibration operation depicted in FIG. 15.

FIG. 15 is a flowchart showing an overview of the steps executed by controller 30 in connection with the calibration operation. After start up of the calibration operation (represented by step 700), at step 702 controller 30 initializes certain variables and relays. The calibration initialization step 702 is further detailed by FIG. 15A, which includes substeps 702-1 through 702-12 inclusive.

Substep 702-2 shows the manual disconnection of cables 62 from RTU 26 and connection of cables 62 to ETU 130. Then, at substep 702-3, all relays of RSB 32, RTU 26, and ECU 130 are de-energized. If, at substep 702-4, it is determined that the ECU is not properly connected, the calibration operation is aborted (substep 702-5). Otherwise, at substep 702-6 relay K121 of RSB 32 is energized and DC power is applied to demodulator 50. At substep 702-7, RSB relay K113 is energized. At substep 702-9, controller 30 allocates a memory location for any error information that may subsequently be generated. At substep 702-10 a tuning signal is obtained (from the CW pin of RFU 24 and via demodulator 50). At substep 702-11 a TXGAIN value is read from a previous calibration file (if such exists) and the TXGAIN value is sent to RFU 24.

At step 704 controller 30 measures the output level and adjusts gain, if necessary, as depicted by FIG. 15B. This is done by energizing RSB relay K122 (substep 704-2) so that the reference output signal from demodulator 50 can be measured (substep 704-3). As used in connection with the calibration operation, "measure" refers to reading the "I" and "Q" channels of ADC 72 in the manner previously described with reference to the tuning operations. If the measured reference output signal is not within specified limits (substep 704-4), the TXGAIN value is reduced (substep 704-5) or increased (substep 704-6) in RFU 24. If and/or when the reference signal is brought within the specified limits, the current value of TXGAIN is stored in a calibration file in a memory accessible by controller 30 (substep 704-7). The memory in which the calibration file is stored is a RAM memory in the illustrated embodiment, but can take other forms of non-volatile storage (including hard disk and EEPROM).

At substep 704-8 controller 30 creates in its RAM memory an array "R" of length NUMPTS*2. In the illustrated embodiment, NUMPTS=21 (the number of sample frequencies) and two locations are stored for each sample frequency—a real component and an imaginary component.

At substep 704-9 the center frequency of the RFU 24 is varied to generate one of the 21 sample frequencies for the calibration operation. At each frequency sample i (wherein i is indexed from 1 to NUMPTS), the reference signal $R_i$ is stored in the array R (substep 704-10). The reference signal $R_i$ is stored by routing the reference output signal from demodulator 50 through relays K120, K122, and K113 whereby the reference signal is applied to the "tune signal in" pin of demodulator 50. The actual use of the signal $R_i$ is understood with reference to the steps of FIG. 16.

As indicated by substep 704-11, substeps 704-9 and 704-10 are repeated in loop fashion until all 21 sample frequencies have been generated and reference signal values stored therefor. Then, at substep 704-12, relay K122 is de-energized and (substep 704-13) the "R" array is stored in the calibration file.

At step 706 the calibration operation begins a loop that includes even numbered steps 708, 710, 712, 714, 716, and 718. At step 706 controller 30 energizes the following relays of RSB 32 as needed: K111, K112, K116, K117, K118, and K119.

In the loop commencing at step 706, controller 30 makes reflection measurements (at the 21 sample frequencies) with external calibration unit (ECU) 130 sequentially having open, short, and 50 ohm loads. In this respect, the substeps depicted on FIGS. 15C, 15D, and 15E respectively concern measurements for the open, short, and 50 ohm load readings.

Figure 15C:
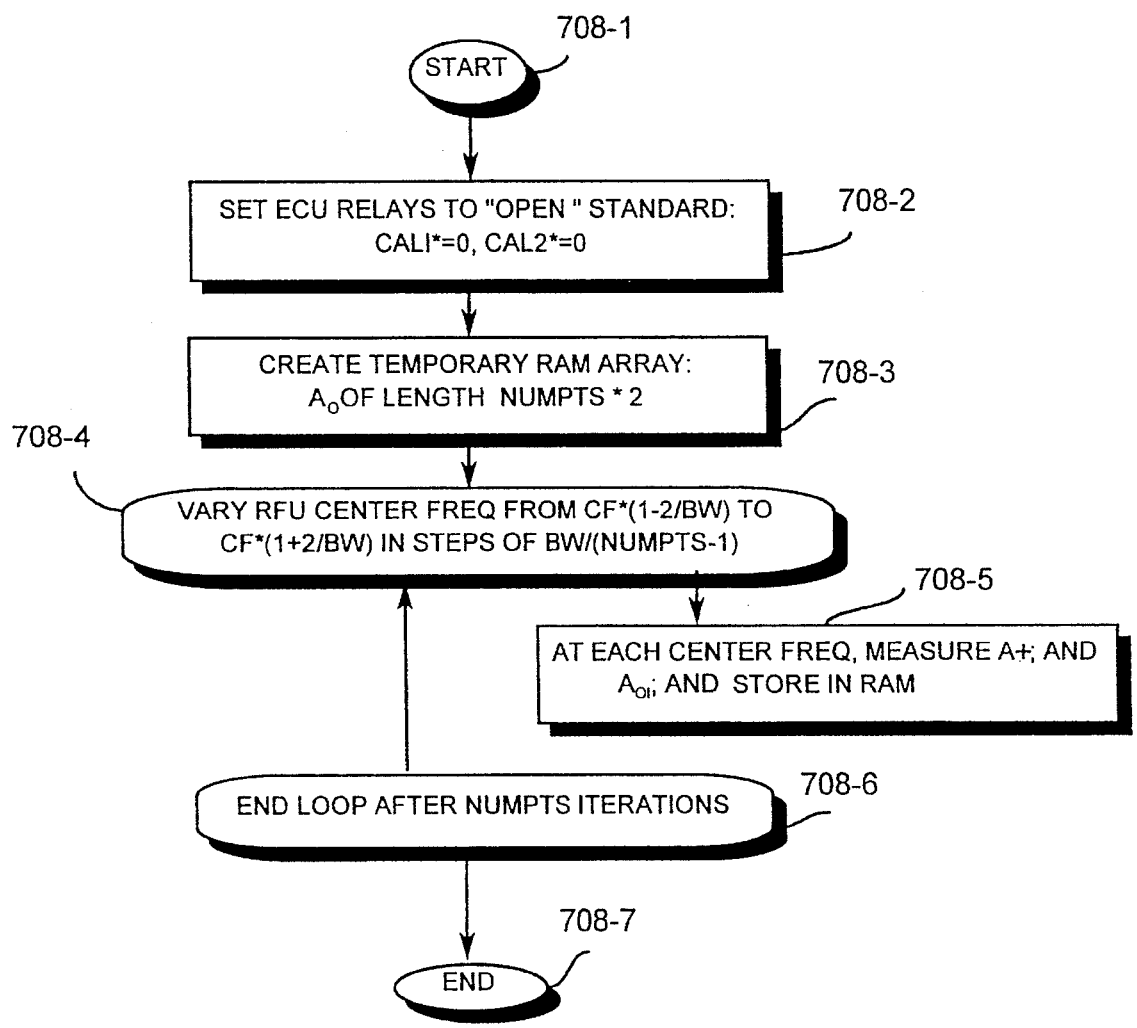
FIG. 15C is a flowchart showing steps executed in connection with an open impedance measurement portion of the calibration operation depicted in FIG. 15.

In the "Open" impedance calibration measurement depicted in FIG. 15C, via signals on bus 132 at substep 708-2 the controller sets the relays CAL1 and CAL2 of the ECU 130 to an open condition. At substep 708-3 the controller creates an array $A_o$ of comparable dimension as array R discussed above. Substeps 708-4 through 708-6 form a loop wherein the RFU frequency is varied through the 21 sample frequencies and a measurement $A_{Oi}$ taken at each sample frequency i.

Figure 15D:
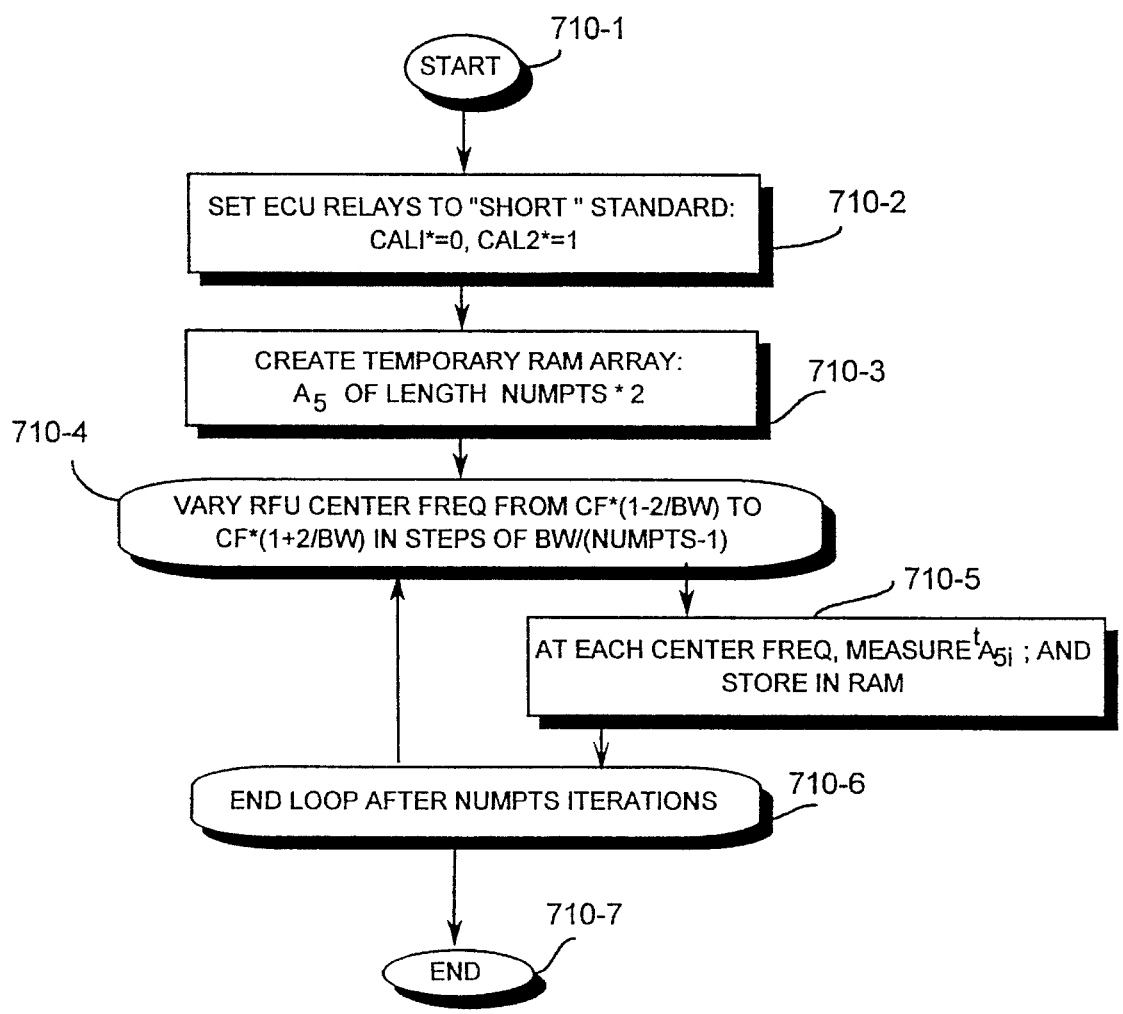
FIG. 15D is a flowchart showing steps executed in connection with a short impedance measurement portion of the calibration operation depicted in FIG. 15.
Figure 15E:
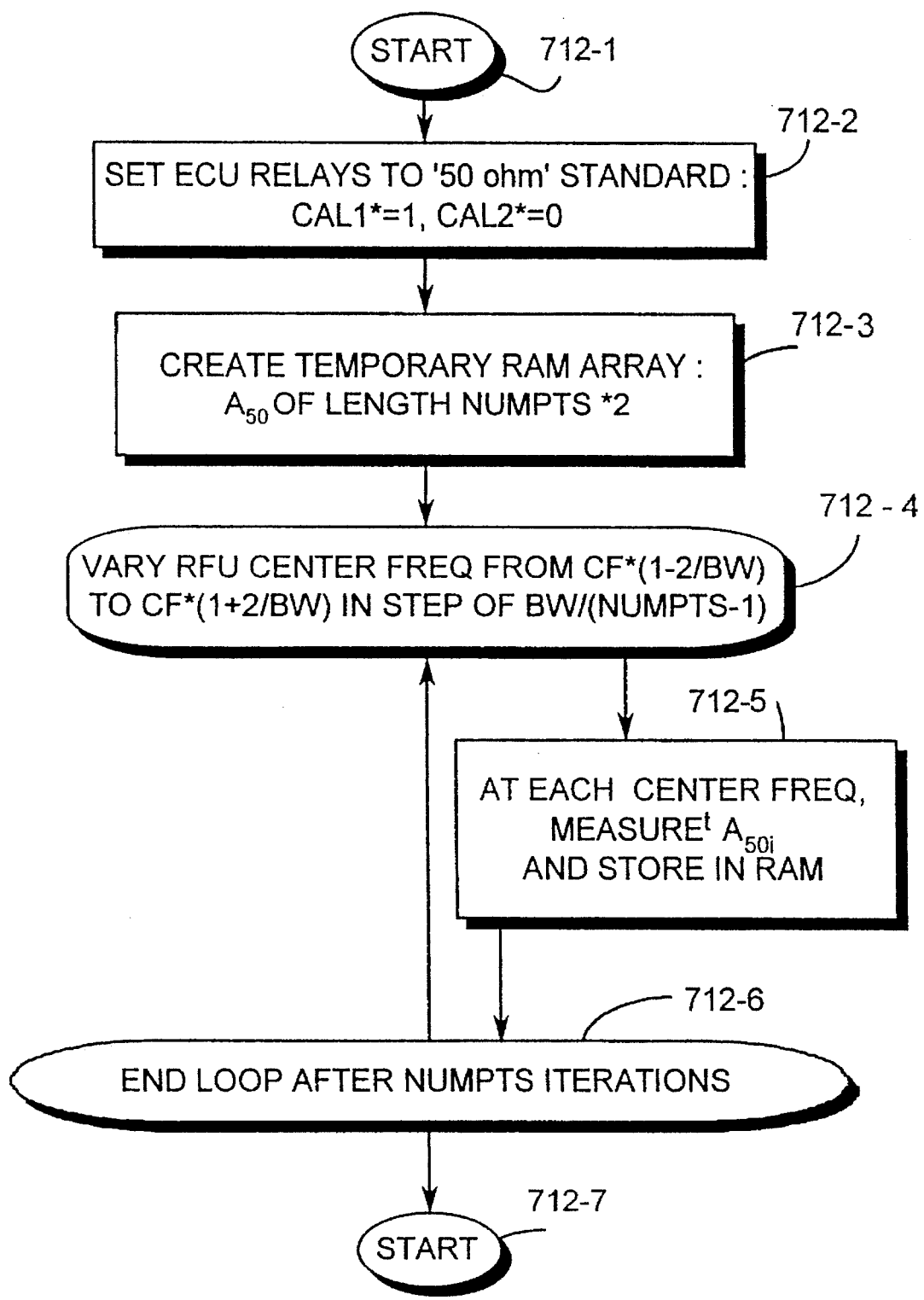
FIG. 15E is a flowchart showing steps executed in connection with a 50 Ohm impedance measurement portion of the calibration operation depicted in FIG. 15.
Figure 15:
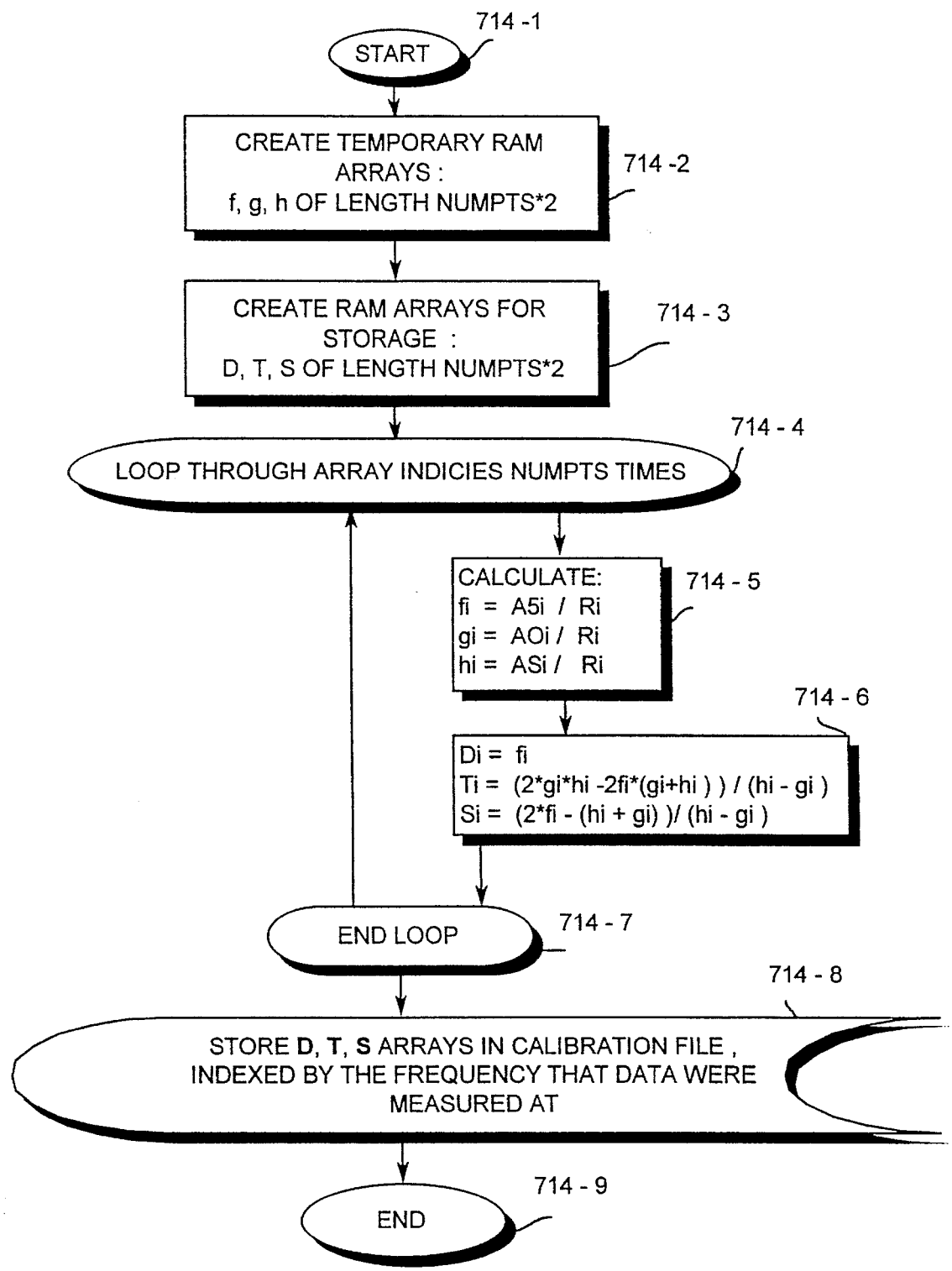

In the "Short" impedance calibration measurement depicted in FIG. 15D, via signals on bus 132 at substep 710-2 the controller sets the relays CAL1 and CAL2 of the ECU 130 to a "short" condition. At substep 710-3 the controller creates an array $A_s$ of comparable dimension as array R discussed above. Substeps 710-4 through 710-6 form a loop wherein the RFU frequency is varied through the 21 sample frequencies and a measurement $A_{Oi}$ taken at each sample frequency i.

In the "50 Ohm" impedance calibration measurement depicted in FIG. 15C, via signals on bus 132 at substep 712-2 the controller sets the relays CAL1 and CAL2 of the ECU 130 to an "50 ohm" condition. At substep 712-3 the controller creates an array $A_{50}$ of comparable dimension as array R discussed above. Substeps 712-4 through 712-6 form a loop wherein the RFU frequency is varied through the 21 sample frequencies and a measurement $A_{50i}$ taken at each sample frequency i.

At step 714, controller 30 calculates and stores the aforementioned calibration constants. Substeps involved with the calculation and storage of the calibration constants are depicted in FIG. 15F. At substep 714-2, memory locations are allocated for temporary arrays "f", "g", and "h". At substep 714-3 memory locations are allocated for arrays "D", "T", and "S". Arrays "D", "T", and "S" are used for storing directivity, transmission, and source correction factors, respectively. The arrays allocated in substeps 714-2 and 714-3 are 21×2 arrays, since there are 21 sample frequencies and two components (real and imaginary) for each sample frequency.

Substeps 714-4 through 714-7 of the calculation and storage steps of FIG. 15F involve calculations of the directivity (D), transmission (T), and source (S) correction factors for each of the sample frequencies. The $D_i$, $T_i$, and $S_i$ computations for each sample frequency i are made at substep 714-6. These computations correspond to Equations 15–17 discussed above. Prior to making the D, T, and S, calculations, intermediate calculations for the f, g, and h arrays (corresponding to Equations 20, 18, and 19, respectively) are conducted at substep 714-5. After the calculations are conducted, the D, T, and S arrays are stored in the calibration file at substep 714-8.

Figure 15G:
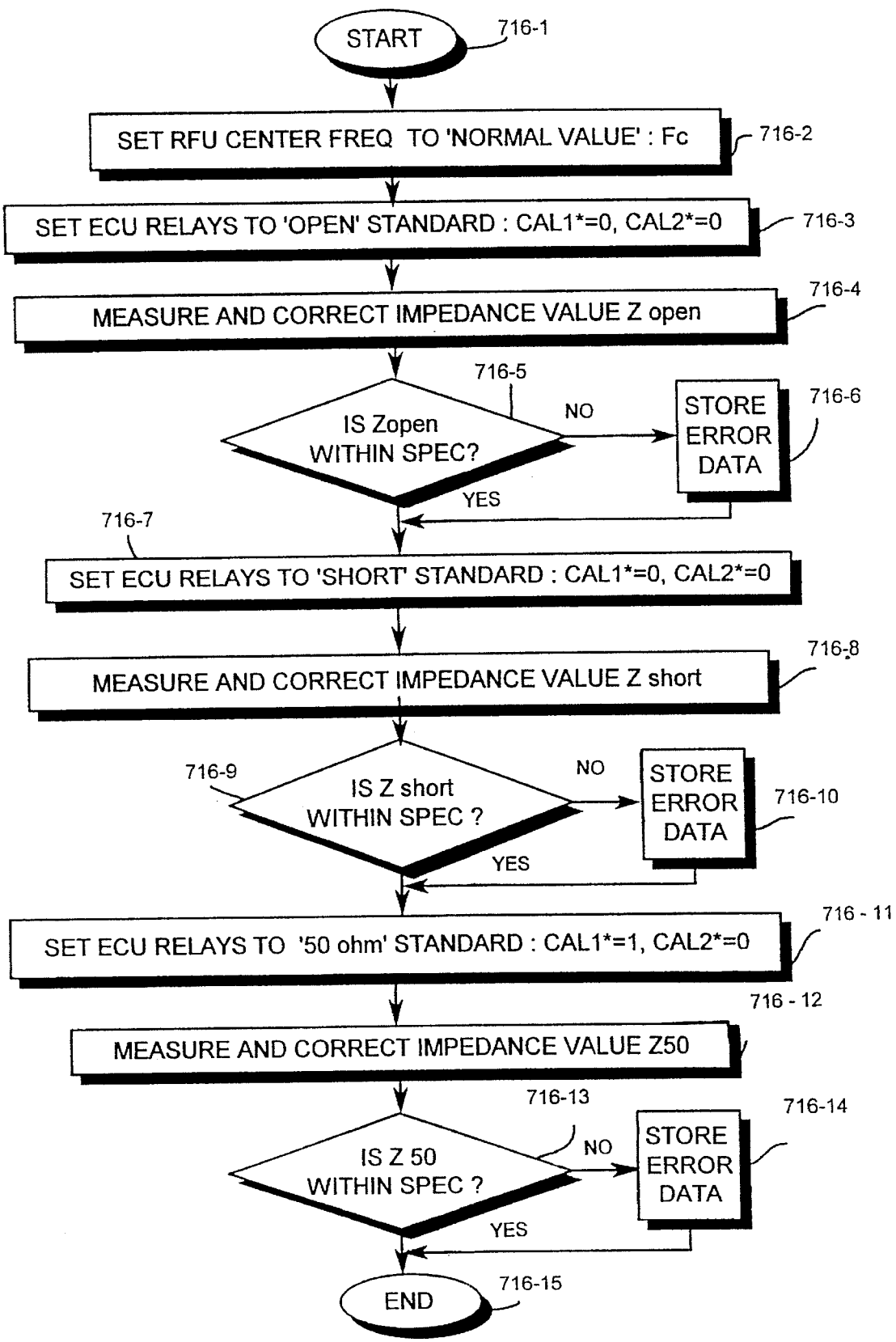
FIG. 15G is a flowchart showing steps executed in connection with an accuracy test portion of the calibration operation depicted in FIG. 15.

At step 716, controller 30 tests the accuracy of the calibration constants which were calculated at step 714. FIG. 15G illustrates substeps 716-1 through 716-15. In testing the calibration constants accuracy, controller 30 sets (at substep 716-2) the RFU center frequency to a "Normal Value". Thereafter, controller 30 sets the relays of the ECU 130 to an "open" condition (substep 716-4); measures and corrects the impedance value determined from the open condition (substep 716-4); determines whether the measured and corrected value from substep 716-4 is within specification tolerances (substep 716-5) and, if not, stores error data (substep 716-6). As seen in FIG. 15G, similar steps are also conducted with respect to the "short" and "50 ohm" conditions of the ECU 130.

At step 720, controller 30 reports any calibration errors that were noted (e.g., during step 716). If no errors are reported, at step 722 controller 30 optionally determines RTU transfer function parameters. Step 722 is normally executed only upon initial installation of the MRI system 20, and need not necessarily be executed for each tune. At step 722 controller 30 determines the effective capacitor and inductor values to be used for the mathematical model of FIG. 11. These effective capacitor and inductor values are used in step 532 of the coarse tuning operation to determine the coarse values of the adjustable impedances Ca and Cb.

Figure 15H:
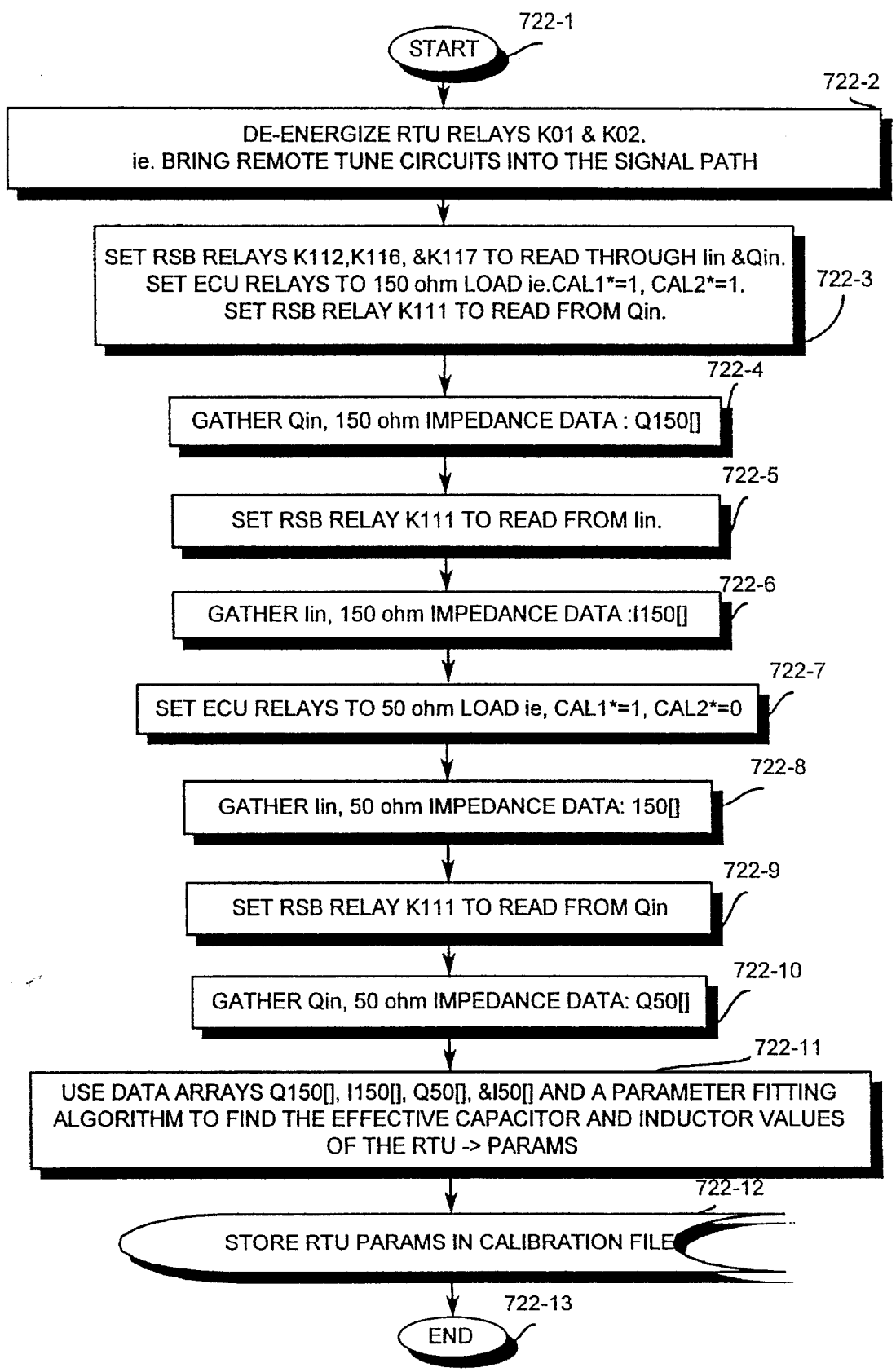
FIG. 15H is a flowchart showing steps executed in connection with an RTU parameter calculation portion of the calibration operation depicted in FIG. 15.
Figure 15I:
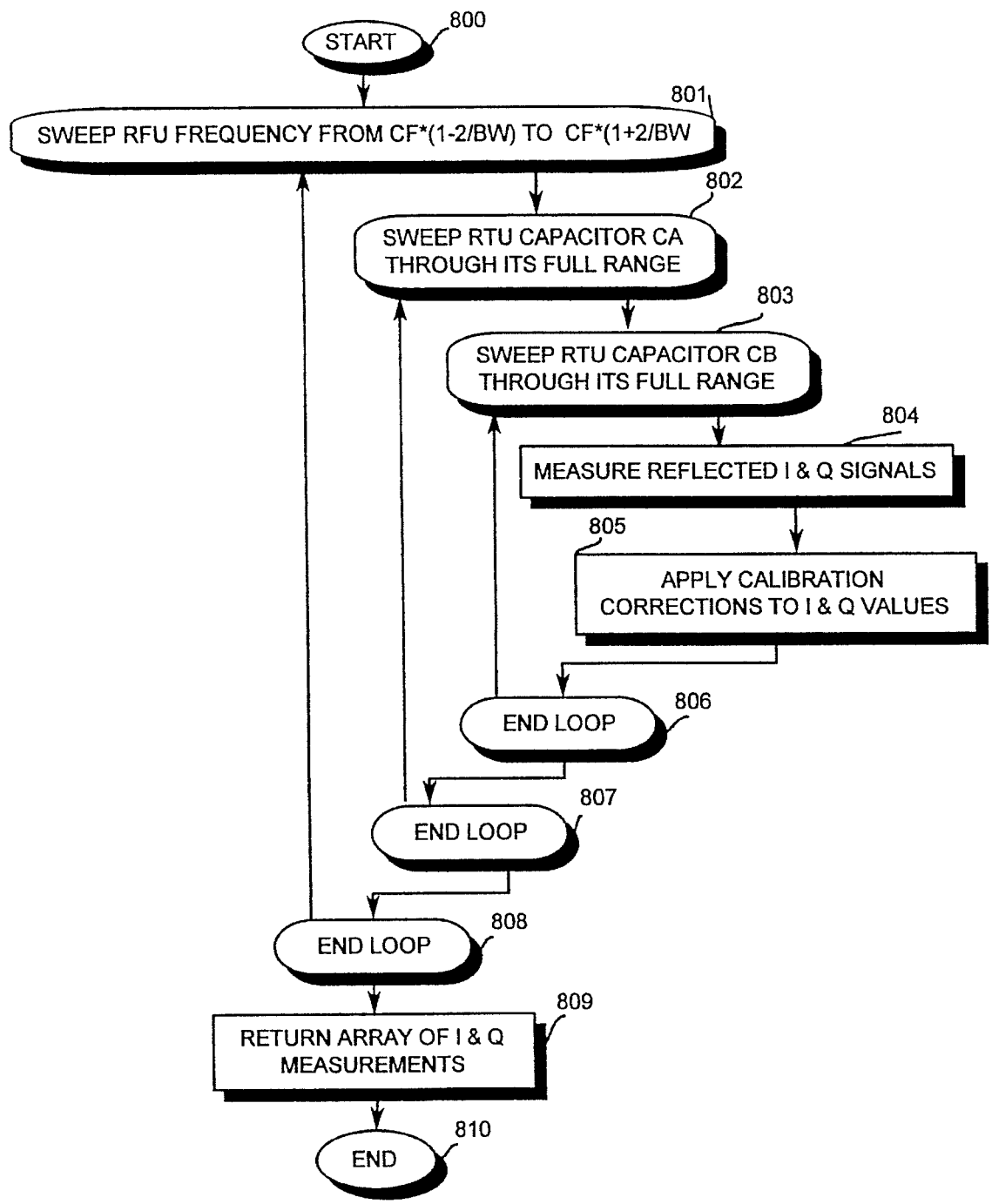
FIG. 15I is a flowchart showing steps executed in connection with a RTU parameter gathering portion of the calibration operation depicted in FIG. 15.

Substeps 722-1 through 722-13 involved in RTU parameter calculating step 722 are illustrated in FIG. 15H. At substep 722-2, controller 30 de-energizes RTU relays K01A, K01B, K02A, and K02B to include the tuning networks 100 in the signal path. Then, at substep 722-3, controller 30 sets the relays K112, K116, K117 of RSB 32 so that the "I" and "Q" values can be read at ports 48A and 48C, respectively. Also at substep 722-3, the ECU relays are set to the "150 ohm" condition, and RSB relay K111 is set to read "Q" from port 48C (see FIG. 2).

At substep 722-4, 150 ohm impedance data is gathered from the ECU 130 and read into an array Q150. The gathering of data from the ECU 130 for substep 722-4 (as well as substeps 722-5, 722-8, and 722-10) is understood with respect to RTU parameter gathering operation depicted in steps 800–810 of FIG. 15I. Step 801 of RTU parameter gathering operation involves sweeping the frequency of the RFU 24 from CF*(1−2/BW) to CF*(1+2/BW), where "CF" stands for "center frequency" and "BW" stands for bandwidth over which the center frequency will be varied (BW being expressed as a fraction of center frequency). At each point during the sweep, a loop consisting of steps 802–807 is executed. At step 802, the capacitor Ca of the tuning network 100 of RTU 26 is swept through its full range. During each sweep of capacitor Ca, a nested loop consisting of steps 803 through 806 is executed. At step 803, the capacitor Cb is swept through its full range, and steps 804 and 805 executed. At step 804, the reflected signal is measured (both "I" and "Q" components). At step 805, the calibration corrections discussed above are applied to the measured value. Thus, upon completion of RTU parameter gathering operation depicted in FIG. 15I, for the 150 ohm condition an array of I and Q measurements is returned, with the array including measurements for each swept RFU frequency at all permutations of settings for the variable capacitances Ca and Cb.

Similar operations are conducted for the "I in" component for the 150 ohm condition, as well as for both the "Q in" and "I in" components for the 50 ohm condition. In this regard, at substep 722-5 RSB relay K111 is set to read "I" from port 48A (see FIG. 2). Then, at substep 722-6, 150 ohm impedance data is gathered and stored in an array I150. In order to cater for the 50 ohm condition, at substep 722-7 controller 30 appropriately sets the relays of the ECU. Then, at substeps 722-8 through 722-10, arrays I50 and Q50 are filled with values in a manner understood with reference to steps 722-4 through 722-6 (albeit at the 50 ohm condition rather than the 150 ohm condition).

At substep 722-11 the data arrays Q150, I150, Q50, and I50 are used in a parameter fitting algorithm to find the effective capacitor and inductor values for the mathematical model of FIG. 11.

Lastly, at step 724, controller 30 finalizes the calibration operation by de-energizing RSB relay K121; by removing DC power to RSB demodulator 50; by de-energizing relay K113. The cables 62 are then manually disconnected from the ETU 130 and re-connected to RTU 26.

OPERATION: REFLECTION MEASUREMENT AND CALIBRATION

In connection with both the coarse tuning operation (described in FIG. 10) and the fine tuning operation (described in FIG. 12), a reflected signal is routed through RSB 32 to the demodulator 50 where it is demodulated and the "I" and "Q" components thereof applied to corresponding channels of the ADC 150. The demodulation operation of the demodulator 50 has been previously described with reference to the structure of FIG. 18. Certain steps of the coarse tuning operation (such as steps 514 and 550), and certain steps of the fine tuning operation (such as steps 600 and 602), involve the processing by controller 30 of the digital information obtained from the ADC 72 in order to calculate the reflected signal or its magnitude. While the computation of the reflected signal and/or its magnitude has been generally alluded to in the foregoing coarse and fine tuning operations, a more detailed explanation is now provided with the benefit of the results of the immediately above-described calibration operation.

FIG. 16 shows steps 900–910 executed by controller 30 in calculating the impedance of a reflected signal. At step 901, controller 30 obtains both the "I" and "Q" values from the respective output channels of the ADC 72. At step 902 the output of the ADC is taken as a complex value A=I+iQ. At step 903, controller 30 obtains the stored reference power R corresponding to the current operating frequency from nonvolatile memory. At step 904 a normalized reflected signal value M is obtained by evaluating the expression M=A/R. Then, at step 905, controller 30 reads the calibration constants arrays generated during the execution of the calibration operation (see step 714) and determines interpolated values for the directivity (D), transmit (T) and source (S) correction factors for the current operating frequency. At step 906 controller 30 uses the normalized measurement M, as well as the interpolated S, D, and T values, to calculate the corrected reflection signal W (also referred to herein as $K_{cor}$). If only the corrected reflection signal is desired, execution terminates after step 906.

For situations wherein it is desired for the reflection to be converted to an impedance value, steps 907–909 are also executed. At step 907, the corrected reflection signal W is converted to impedance N by the formula N=(1−W)/(1+W). At step 908 the normalized impedance N is converted to an impedance Z for a 50 ohm system by multiplying by 50 (e.g., Z=N*50). Thus, in each instance in the coarse tuning and fine tuning operations, steps including those described in connection with FIG. 16 are executed to provide calibrated (e.g., corrected) values.

OPERATION: VARACTOR COIL TUNING OVERVIEW

Coil 22D of FIGS. 1 and 19 is an example of a varactor-tuned RF coil. A varactor-tuned coil is "tuned" when its capacitors Cs and Cp (see FIG. 19) have been adjusted such that, for a single frequency RF signal sent through a cable to the coil, the magnitude of its reflected signal is at a minimum.

All varactors have the general capacitance vs. bias voltage relationship shown in Equation 22 below $$C = \frac{\alpha \beta}{V^\gamma + B} \qquad \text{Equation 22}$$

wherein C=capacitance in pF; V=bias voltage in volts; and wherein α, β, and γ are constants. The values of the constants vary from one model to the next. For example, for two Motorola MV2115s in parallel, α=120; γ=1.5; and β=25$^\gamma$/23.

The tuning method of the present invention seeks a minimum in the reflected signal as a function of both varactor voltages Vp and Vs. As with the high power coil tuning method, the varactor tuning method employs (via RSB 32) the tuning demodulator 50, which yields both a real and imaginary component of the reflected signal. However, the varactor tuning method does not utilize the real and imaginary components other than for calculating the magnitude of the reflected signal (i.e., by taking the square root of the sum of the squares of the imaginary and real components).

Figure 20:
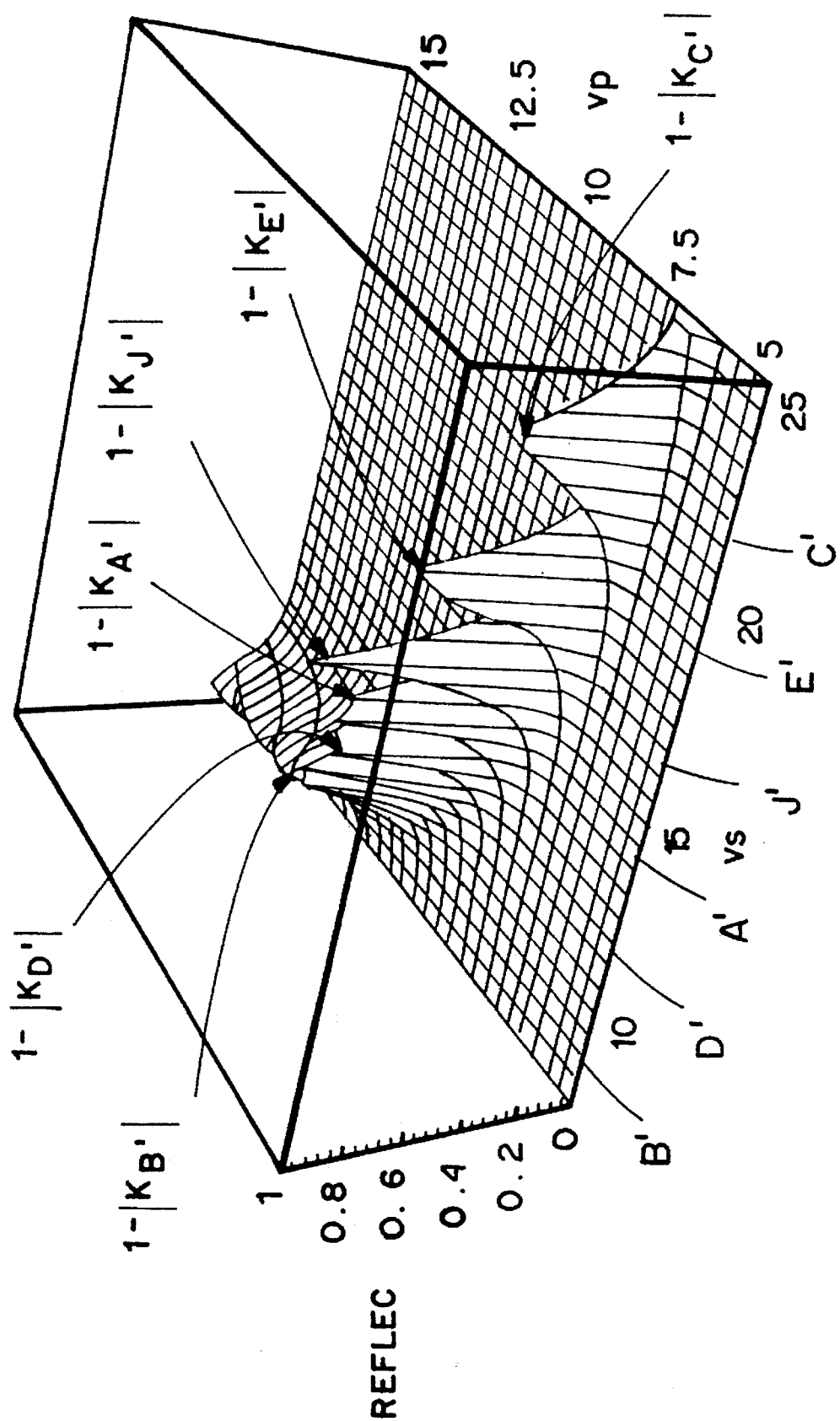
FIG. 20 is a three dimensional graph of |1–51 KI plotted as a function of varactor capacitance voltages.

As indicated above, tuning occurs when the magnitude of the reflected signal (|K|) is at a minimum. For the purpose of illustrating the varactor coil tuning operation, it is useful to think of the tuning as maximizing the expression 1−|K|. FIG. 20 shows a three-dimensional plot of an typical reflected signal, with 1−|K| plotted as a function of Vs and Vp. As can be seen in FIG. 20, the plot of 1−|K| includes a number of peaks. A varactor coil is tuned when the Vp and Vs voltages are set to give the highest 1−|K| peak (e.g., the reflected signal has the lowest magnitude).

Prior to discussing the processing of the reflected signal, it should be mentioned that usage herein of the term "reflected signal" assumes that the measured reflected signal has by normalized by a normalization operation. The normalization operation is similar to aspects of the aforedescribed calibration operation of the high power coils in that a reflected signal is obtained from both a measured signal and a reference signal. The normalization operation for varactor-tuned coils is discussed in greater detail with reference to FIGS. 24 and 25.

The controller 30 is ultimately responsive to operator input (e.g., through input device 31A) specifying that a varactor-tuned coil (e.g., coil 22D) is to be tuned. If controller 30 has not already done so, it executes the operation described below with reference to FIG. 24 in order to obtain a normalized and scaled value for a reference signal R.

The basic steps of tuning a varactor-tuned coil are described with reference to FIG. 21. At step 1020, certain initialization operations are performed. For example, a value is set for TXGAIN. The TXGAIN value is set to give a high dynamic signal (e.g., a setting which would make the ADC 72 read |K|=1.0 as an ADC value 4000 on a single channel 12 bit system.

At step 1022, controller 30 chooses a starting point for the varactor coil tune and obtains a reflection signal magnitude for the starting point. The details of selecting a starting point are explained below in connection with FIG. 22.

Once a starting point is obtained, controller 30 executes a recursive bisection search operation to locate a candidate for the tuned point. The bisection search operation, depicted generally as step 1024 in FIG. 21, is described in more detail below with reference to FIG. 23. The bisection search returns a "last" point as its candidate for the tuned point.

As a last effort to locate the tuned point and as a double check, in steps 1030 through 1038 controller 30 executes a starburst search operation. In the starburst search operation, controller 30 examines the magnitude of reflected signals at points in a starburst or asterisk (*) pattern about the point returned by the bisection search (in step 1024) as the candidate for the tuned point. The point in the starburst pattern having the smallest magnitude for its reflected signal is taken as the tuned point.

Describing now the starburst operation in further detail, controller 30 checks (step 1030) if the magnitude of the reflected signal returned by the bisection search is less than a predetermined value. If so, controller uses the candidate located by the bisection search as the tuned point (step 1032). If not, in a manner understood from the ensuing discussion, at step 1034 controller 30 obtains reflection values for points in the starburst pattern about the last point returned by the bisection search. If any points in the starburst pattern have a lower |K| (as determined at step 1036), controller 30 uses the point in the starburst with the lowest magnitude of reflection as the tuned point (step 1038) prior to termination of the tuning operation. Otherwise, the last point from the bisection search is used as the tuned point (step 1032).

Upon determination of the tuned point, controller 30, knowing the necessary values for Vs and Vp, adjusts the bias voltages of the varactors to the necessary voltages for the tuning of the coil (step 1040). Then controller 30 terminates the varactor coil tuning operation (step 1042). The varactor voltages remain at the tuned values.

In connection with the tuning of the varactor tuned coil 22D generally, it should be understood controller 30 changes the values Vp, Vs by applying appropriate digital values to the DACs 39s, 39p, respectively (see FIG. 7). Such changes occur, for example, during the bisection search of step 1024 and the starburst operation aforedescribed. The DACs 39s, 39p output an appropriate analog voltage signal which is applied as the bias voltage for the varactors 38s, 38p, respectively, as shown in FIGS. 7 and 19.

Thus, a measurement of the reflected signal at a given point is made by setting the output of the DACs 39s, 39p so that bias voltages for the point-to-be-measured are applied to the varactors 38s, 38p. Then, after a pause to permit the new varactor voltages to settle in the long cables to the RF coil 22D, the new values received at the ADC 72 are read by controller 30 for computing the new reflection signal. In measuring the reflected signal, the reflected signal is routed through RSB 32 in accordance with the relay settings shown in Table 1.

OPERATION: VARACTOR COIL START POINT SELECTION

Figure 22:
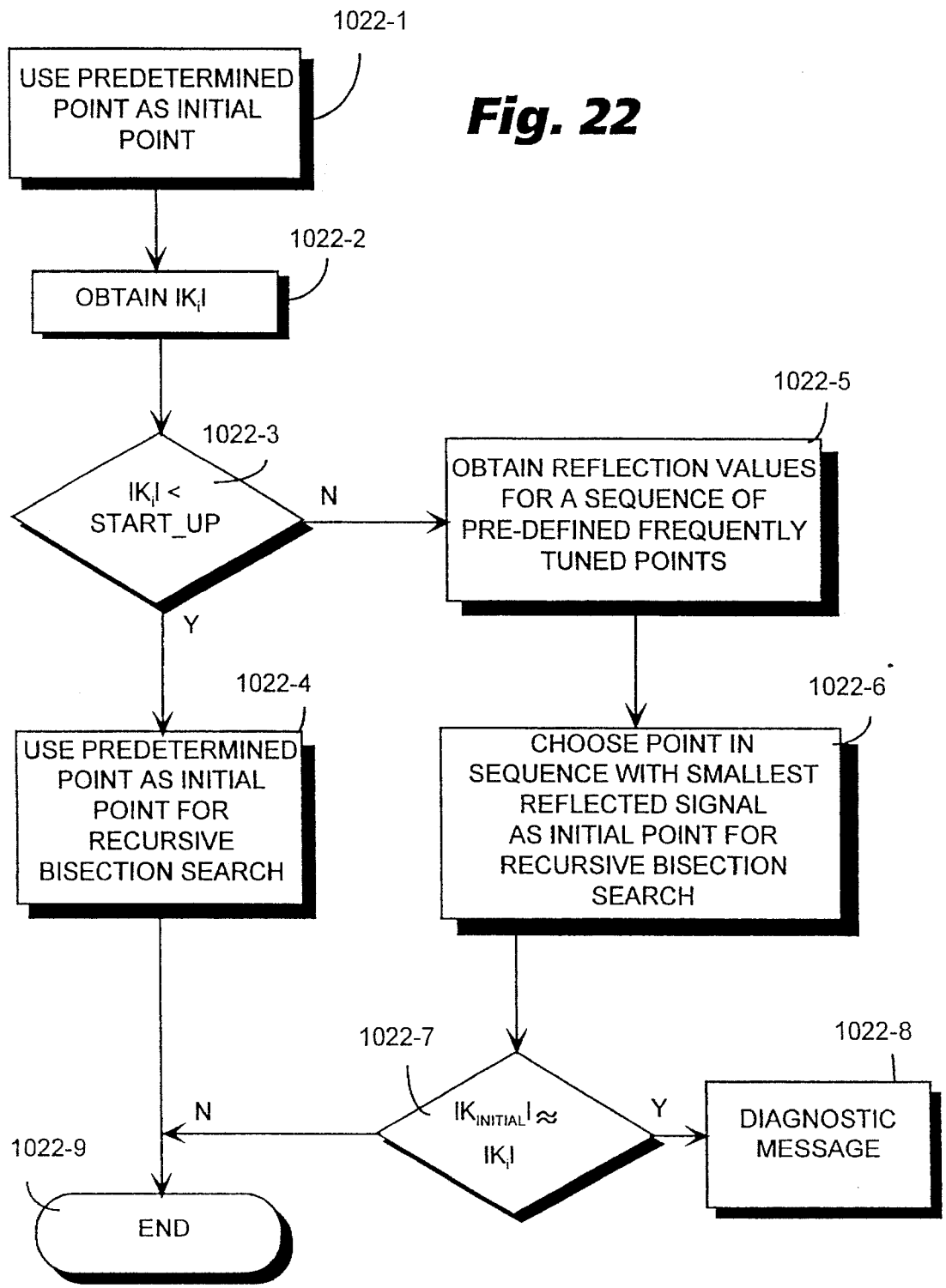
FIG. 22 is a flowchart showing steps executed in connection with a starting point select operation for the tuning of a varactor-tuned coil.

FIG. 22 illustrates sub-steps involved in the selection of a starting point for the varactor-tuned coil tuning operation. At step 1022-1, controller 30 uses a predetermined point as the initial point i. At step 1022-2, controller 30 obtains the value of the reflected signal $|K|$. In general, obtaining the reflected signal for any point requires controller 30 to set the relays of RSB for obtaining the reflected signal from the varactor-tuned coil 22D. Assuming the reflected signal is obtained through channel B of port D (e.g., port 46D), the relays K119, K111, K112, K113 are energized and the relay K122 is de-energized (see Table 1 supra). Thus, the measured reflected signal is applied to the demodulator 50, which demodulates the measured reflected signal into its imaginary and real components for application to the I and Q channels of the ADC 72. The reflected signal $|K_i|$ is obtained by normalization and scaling as described with reference to the steps of FIG. 25.

At step 1022-3, controller 30 determines whether the magnitude of the reflected signal $|K_i|$ is less than a predetermined value START_UP. If so, point i is used as the initial point for the recursive bisection search of step 1024 of the tuning operation (step 1022-4).

If the magnitude of the reflected signal $|K_i|$ is not less than the predetermined value START_UP as determined at step 1022-3, at step 1022-5 controller 30 obtains reflection values for a sequence of approximately eighty pre-defined frequently tuned points (e.g., points which historically have been considered to be good candidates for a tuning solution). These pre-defined points are stored in the non-volatile memory accessed by controller 30. A reflection value is measured for each of these pre-defined points.

At step 1022-6, controller 30 chooses the point in the sequence having the smallest reflected signal magnitude as the initial point for the recursive bisection search. However, if (as determined at step 1022-7) the selected point is very close to the magnitude of the reflected value for the initial predetermined point (i.e., the point used for step 1022-2), there may be no RF coil attached to RSB 32. Accordingly, at step 1022-8 a diagnostic output message is generated. Otherwise, the varactor coil tune select start point operation terminates at step 1022-9 in preparation for the recursive bisection search tuning operation.

OPERATION: VARACTOR COIL BISECTION SEARCH TUNING

Figure 21:
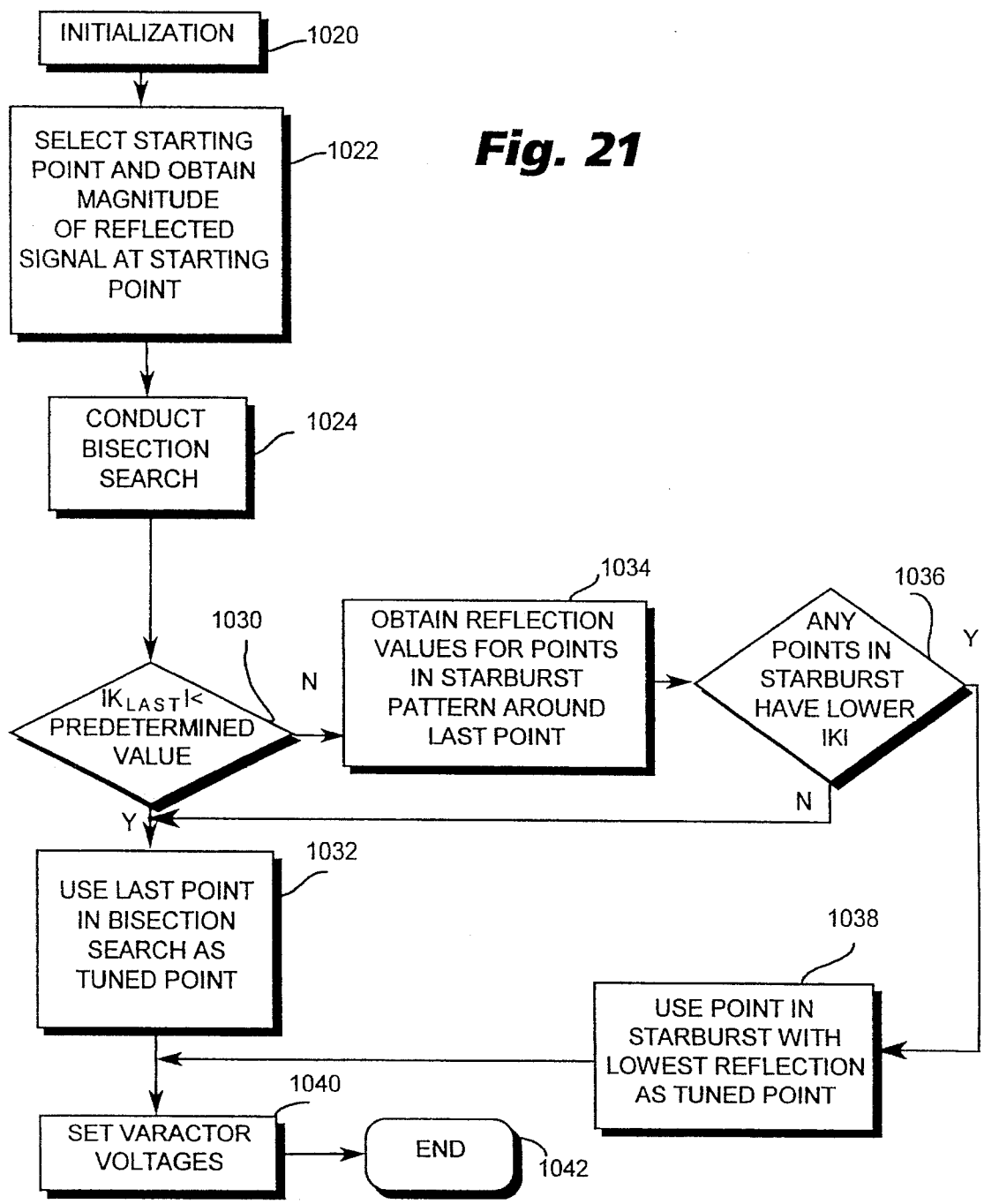
FIG. 21 is a flowchart showing general steps executed in connection with the tuning of a varactor-tuned coil.
Figure 23:
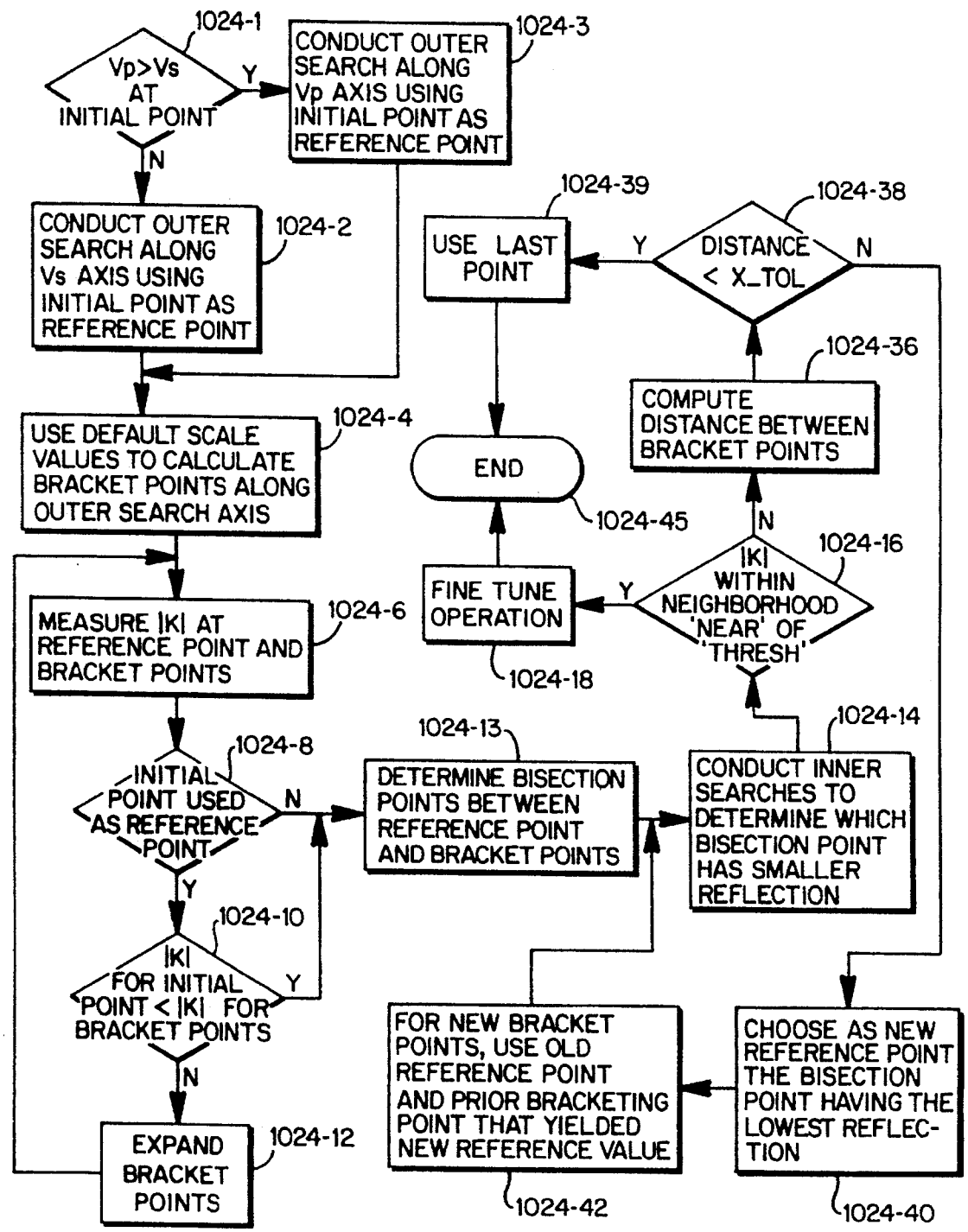
FIG. 23 is a flowchart showing steps executed in connection with a recursive bisection search operation for the tuning of a varactor-tuned coil.

FIG. 23 illustrates sub-steps involved in the recursive bisection search operation (step 1024) of the general varactor coil tuning operation of FIG. 21. However, prior to discussion of the bisection search operation in the context of the tuning of a varactor-tuned RF coil, a general discussion of bisection searching is provided with reference to FIG. 27.

Figure 27:
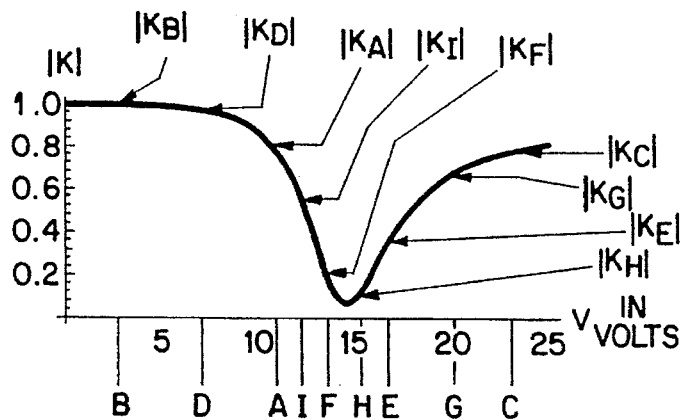
FIG. 27 is a graph showing test voltages and measured reflections for an example bisection search.

A one dimensional bisection search is depicted in FIG. 27. The search is commenced at an initial point such as point "A" on the Voltage or V (horizontal) axis of FIG. 27. Bracket points "B" and "C" are calculated using default scale values. The magnitude of the reflected signal ($|K|$) is measured at each of the points A, B, and C. If $|K_A|$ is not less than $|K_B|$ and $|K_C|$, then points B and C are expanded until $|K_A|$ is at the minimum. Also, points B and C must not exceed the allowed range of the ADC 72. Points D and E are computed in accordance with Equations 23 and 24 below.

$$D=(A+B)/2 \quad \text{Equation 23}$$

$$E=(A+C)/2 \quad \text{Equation 24}$$

The magnitude of the reflected signal is measured at points D and E. The minimum of $|K_D|$ and $|K_E|$ is chosen for further use as a reference point in the search operation. In the example of FIG. 27, point E is chosen as a new reference point. Next, the segments AE and EC are bisected (points A and C being the bracket points), yielding point F between points A and E and point G between points E and C. The magnitude of the reflected signal is measured at points F and G, and it is determined that $|K_F|>|K_G|$. Accordingly, point F is chosen for the next bisection search, and so forth. The foregoing search continues until either (a) the distance between the bracketed points falls below a predefined threshold (X_TOL), or (b) a magnitude of the reflected signal for a trial point stumbles near the $|K|$ value expected for a tuned coil (e.g., the magnitude for the trial point is within a neighborhood NEAR of an expected value THRESH).

The foregoing discussion of FIG. 27 is useful for understanding a one dimensional bisection search. However, the varactor tuning process of the present invention is a two dimensional search, as evidenced by the two dimensional plane of Vp and Vs as seen in FIG. 20. According to the bisection search of the present invention, the two dimensional voltage plane is searched for the minimum $|K|$ by recursively performing one dimensional bisection searches. For example, each measured point of FIG. 20 (e.g., $|K_{A'}|$, $|K_{B'}|$, $|K_{C'}|$, etc.) is a minimum of a one dimensional bisection search. In FIG. 20, the one dimensional searches (with Vs fixed and searching along the Vp axis) are referred to as the "inner" search. The "outer" search (where different Vs values are tried) is based on the reflections found in the inner search.

Now specific steps involved in the recursive bisection search operation of the present invention will be discussed with reference to FIG. 23. At step 1024-1, controller 30 determines whether, for the starting point (obtained at step 1022), Vp is greater than Vs. If so, controller 30 realizes (step 1024-2) that it will conduct the outer search along the Vs axis using the initial point as the reference point. Otherwise, controller 30 realizes (step 1024-3) that it will conduct the outer search along the Vp axis using the initial point as the reference point. At step 1024-4 controller 30 uses default scale factors to calculate the bracket points along the outer search axis.

At step 1024-6 controller 30 measures the magnitude of the reflected signal at the reference point and the bracketing points. For the case when the reference point is the initial point in the recursive bisection search (determined at step 1024-8), a precautionary check is executed at step 1024-10. At step 1024-10, the magnitude of the reflected signal at the reference point (i.e., initial point) and the magnitudes of the reflected signals at the bracketing points are measured. That is, an "inner" bisection search is performed for the initial point and the bracketing points along the axis perpendicular to the axis of the outer search, and the minimum value of the respective inner searches is returned as the magnitude for the initial and bracketing points. If the magnitude for the initial point is not less than the magnitudes for the bracketing points, then (at step 1024-12) the bracketing points are expanded (within range of the ADC 72) and controller 30 loops back to step 1024-6. If the reference point is not the initial point, or if the result of the check at step 1024-10 is negative, processing continues with step 1024-13.

At step 1024-13 controller 30 determines the bisection points (along the outer axis) between the reference point and the first bracketing point and between the reference point and the second bracketing point. At step 1024-14 controller 30 determines which bisection point has the smaller reflection by conducting bisection searches along the inner axes at the bisection points.

At step 1024-16 controller 30 determines if the results of the inner bisection searches of step 1024-14 indicate that the magnitude of the reflection at one of the bisection points is within a neighborhood NEAR of a value THRESH. If the determination is affirmative, a fine tuning operation is commenced (steps 1024-18). Otherwise, processing continues with step 1024-36.

At step 1024-36 controller 30 computes the distance between the bracketing points. If, as determined at step 1024-38, the distance is less than a predetermined amount (X_TOL), controller 30 exits the recursive bisection search operation and considers the "last" point to be the last bisection point having the smallest reflected signal (step 1024-39). Otherwise, processing continues with step 1024-40.

At step 1024-40, controller 30 chooses, as the new reference point, the bisection point having the lowest reflection (along its inner axis). Then, at step 1024-42, controller 30 uses, as a bracketing point, the old reference point and the prior bracketing point that yielded the new reference point. The controller 30 then loops back to step 1024-14 for further magnitude measurements.

Thus, it is seen that the loop between and including steps 1024-14 and 1024-42 of the recursive bisection search are repeated as often as necessary until the loop is exited by an affirmative result at check step 1024-16 (thereby commencing a fine search) or at check step 1024-38.

The fine tune search (step 1024-18) involves essentially the same type bisection search as described with reference to the steps of FIG. 23. However, in the fine tune search of step 1024-18, more narrow shifts are employed to bracket point A, and a tighter tolerance is used for finding the peak of every inner search. The fine tune search returns its "last" point as the tuned point as the operation ends (step 1024-20).

Whether the recursive bisection search exits from the check step of 1024-38 or from the fine tune search (step 1024-18), when the bisection search ends (step 1024-45) the "last" point (having a reflection magnitude $|K_{last}|$) becomes the candidate for the tuned point. This point is then utilized for the starburst operation described in steps 1030–1038 of FIG. 21.

OPERATION: VARACTOR COIL SIGNAL NORMALIZATION

Figure 24:
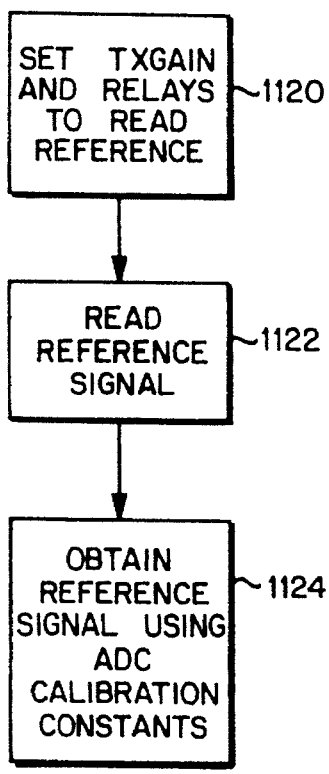
FIG. 24 is a flowchart showing steps executed in connection with a reference signal normalization and scaling operation for the tuning of a varactor-tuned coil.
Figure 25:
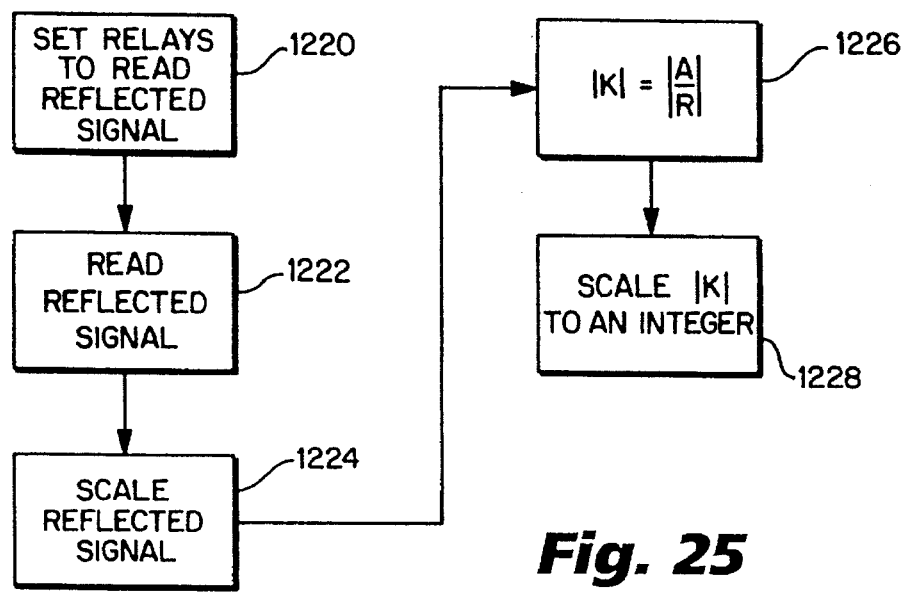
FIG. 25 is a flowchart showing steps executed in connection with a reflection signal normalization and scaling operation for the tuning of a varactor-tuned coil.

Steps involved in the normalization of a reflected signal from a varactor-tuned coil are shown in FIGS. 24 and 25. The steps of FIG. 24 involve processing of a reference signal which is used in the normalization operation. It should be understood that the steps of FIG. 24 are typically executed only at the start of a varactor coil tuning operation, and are not subsequently repeated. The steps of FIG. 25, on the other hand, are executed upon every instance of the receipt of a measured reflection signal from a varactor-tuned coil.

Turning first to the reference signal normalization operations of FIG. 24, at step 1120, the reference signal R is read by obtaining the TXGAIN value and by controller 30 appropriately setting the relays K120, K122, and K113 of RSB 32. In this manner, the tune signal CW tune on cable 36 is directed through relays K120, K122, and K113 to the tune-signal in pin of the demodulator 50. The demodulator 50 then demodulates the measured reference signal, whereby at step 1122 controller 30 reads the I and Q channels of the ADC 72 as $I_{ADC}$ and $Q_{ADC}$, respectively.

At step 1124 controller 30 scales the measured reference signal value obtained at step 1122, so that the reference signal value will have a magnitude less than or equal to 1. The scaling is accomplished using the Equation 25

$$M = \frac{I_{ADC} - I_{OFST}}{I_{GAIN}} + i \times \frac{Q_{ADC} - Q_{OFST}}{Q_{GAIN}} \qquad \text{Equation 25}$$

wherein M represents the scaled measured signal. The constants $I_{OFST}$, $I_{GAIN}$, $Q_{OFST}$, $Q_{GAIN}$ of Equation 25 were obtained from linear regression analysis of data collected for calibrating the ADC 72 (establishing its zero voltage point and matching the gain between its two channels). Typical values for a twelve bit offset binary ADC are $I_{OFST}$=2044.73 and $I_{GAIN}$=2050.0. The scaling compensates for differences between the two ADC channels, and returns values between +1.0 and −1.0, independently of ADC resolution.

Turning now to FIG. 25 and the handling of a measured reflected signal from a varactor-tuned coil, at step 1220 controller 30 sets the relays of RSB for obtaining the reflected signal from the varactor-tuned coil 22D. Assuming the reflected signal is obtained through channel B of port D (e.g., port 46D), the relays K119, K111, K112, K113 are energized and the relay K122 is de-energized (see Table 1). Thus, the measured reflected signal is applied to the demodulator 50, which demodulates the measured reflected signal into its imaginary and real components for application to the I and Q channels of the ADC 72.

At step 1222 controller 30 obtains the measured reflected signal ("A") from the I and Q channels of the ADC 72. At step 1224 controller 30 scales the measured reflected signal using Equation 25.

At step 1226 controller 30 calculates the magnitude of the normalized reflected signal by taking the absolute value of the quotient obtained by dividing the scaled measured reflected signal (from step 1224) by the scaled measured reference signal (from step 1124). The result of step 1226 is a floating point number having a value between 0 and 1.

At step 1228 the magnitude of the reflected signal from step 1226 is converted to an integer by multiplication by a scaling factor (e.g., 2000). Normalization in the manner above-described advantageously reduces differences which maybe encountered when using different system components, thus allowing consistent settings of selected predetermined values.

OPERATION: COIL DETUNING

In an RF coil tune mode, either for the Tx coil or for the Rx coil, one coil has to be detuned to properly tune the other. Moreover, since a plurality of RF coils are attached to the RF front end 25, coils not being utilized during a specific operation may require detuning so that they will not interfere with the coils which are being utilized.

There are two types of detuning circuits, particularly active detuning circuits and passive detuning circuits. The active detuning circuits require an external control circuit for their activation and deactivation.

A passive detuning circuit turns on and off essentially by itself, with an detune inductance (L-detune) and a detune capacitance (C-detune) forming a parallel resonance circuit, which is essentially equivalent to an open circuit at a resonance frequency. The passive detuning circuit is self-biased by the RF transmission pulse.

Figure 30:
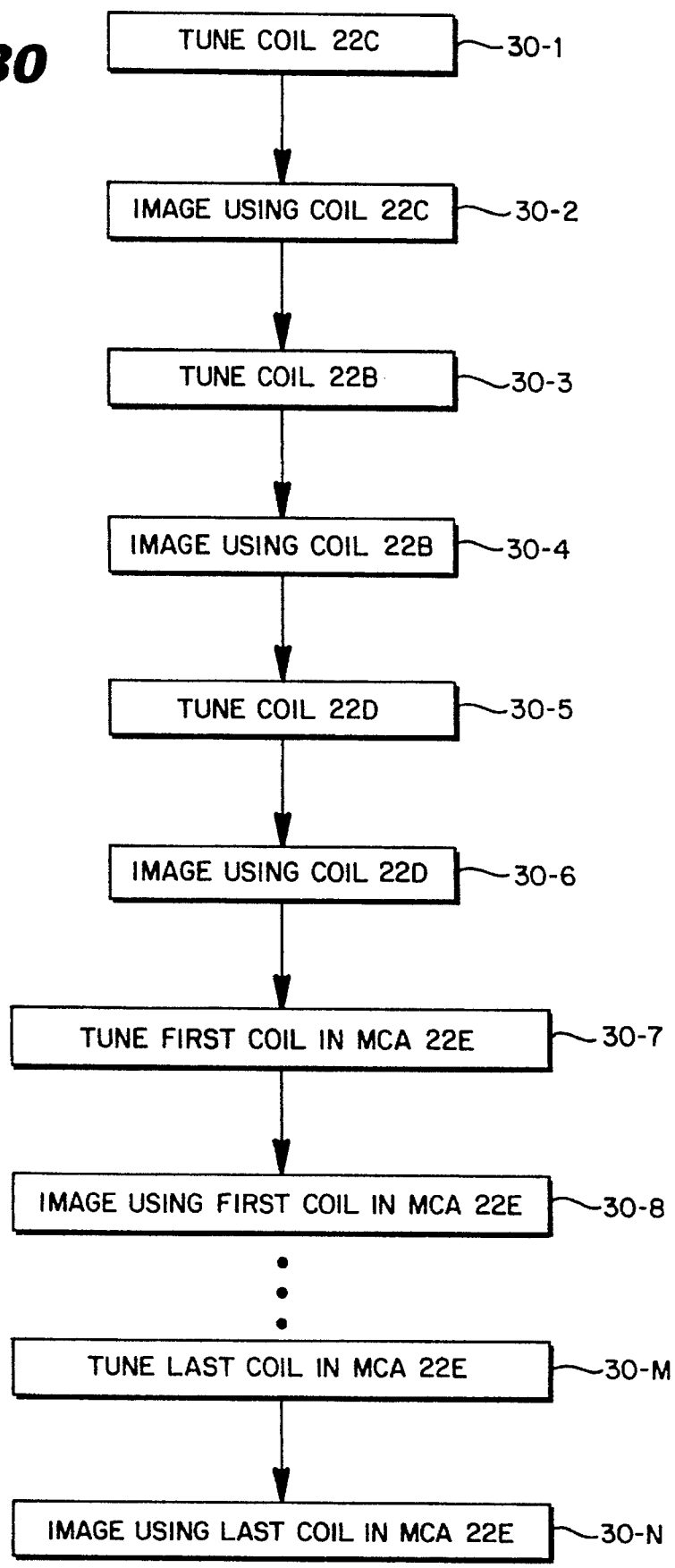
FIG. 30 is a flowchart showing general steps executed in tuning and imaging using a plurality of coils in succession.
Figure 31:
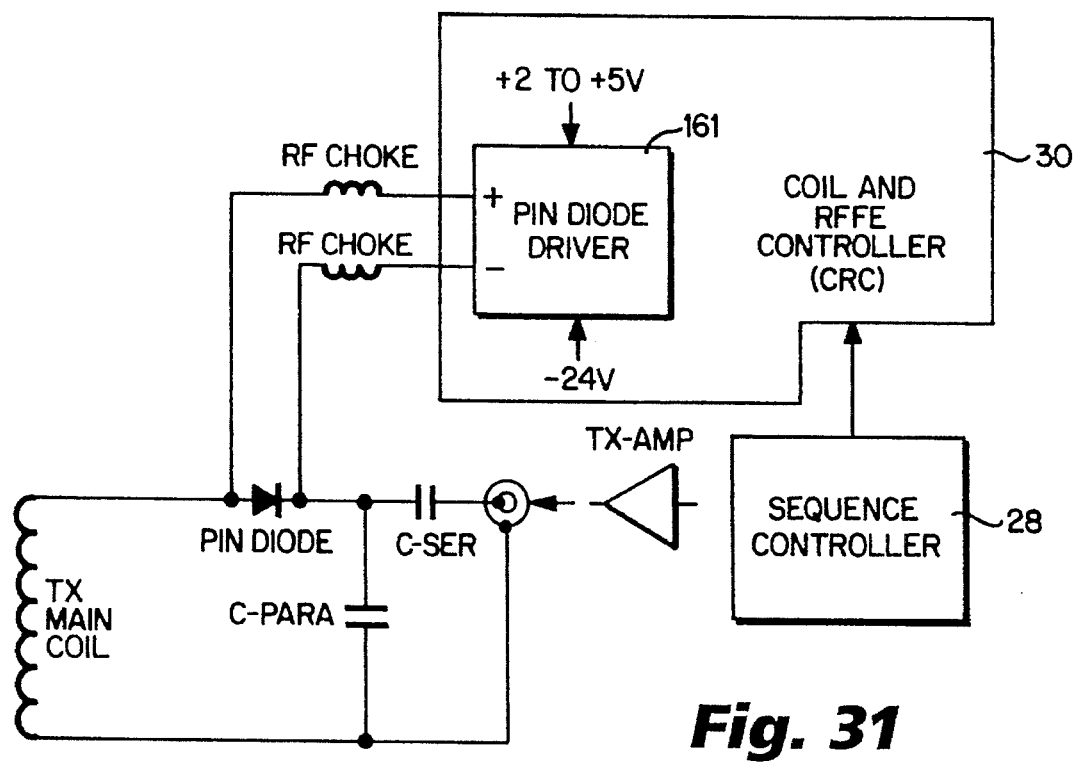
FIG. 31 is a schematic view of a detuning circuit for a Tx RF coil.
Figure 32:
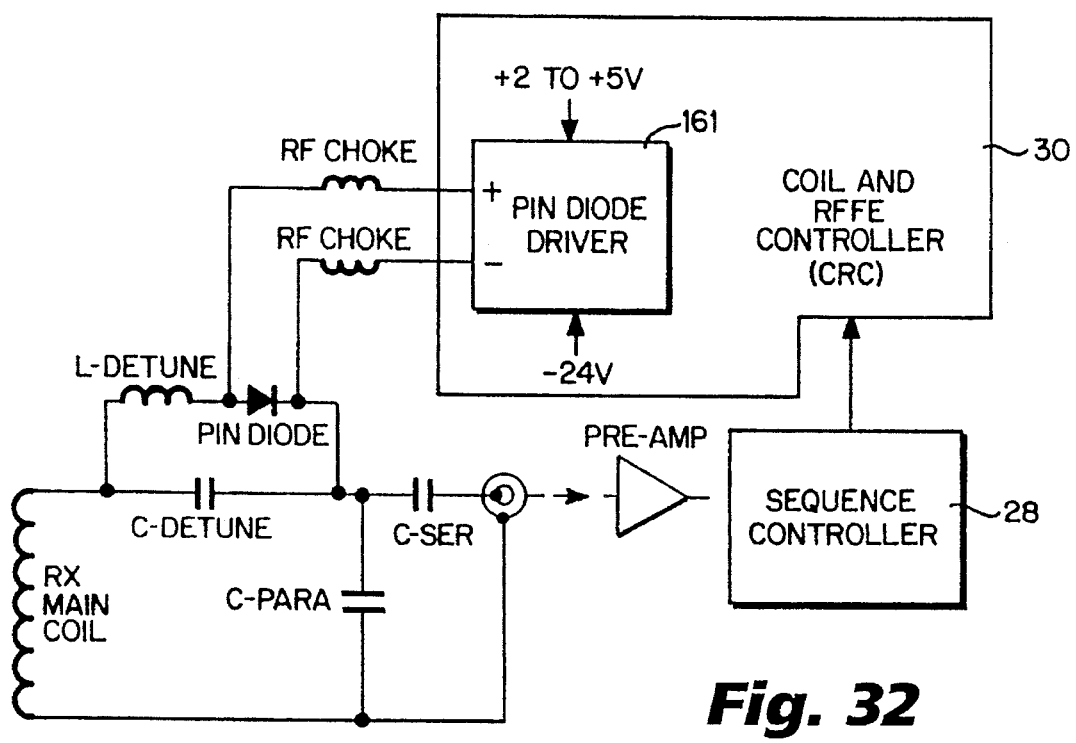
FIG. 32 is a schematic view of a detuning circuit for a Rx RF coil.

FIGS. 31 and 32 illustrate active coil detuning circuits for an Tx coil and a Rx coil, respectively, according to an embodiment of the invention. As understood in conjunction with FIG. 28, FIGS. 31 and 32 show sequence controller 28 and CRC 30, with pin diode driver 161 for a selected coil being included in CRC 30. An output signal from diode driver 161 is applied to a PIN diode of the respective coils of FIGS. 30 and 31. For the Rx coil of FIG. 32, the pin diode is forward biased for detuning (e.g., during transmission or coil deactivation). For the Tx coil of FIG. 31, the pin diode is forward biased for transmission and is reversed biased for Rx coil tuning and receiving the MRI signal.

FIG. 19 shows the use of varactor diodes in tuning circuits. Varactor diodes permit remote tuning and detuning operations. The physical dimension of the regular varactor diode is relatively small and the diode Q is relatively high at a lower frequency, making the varactor diode desirable for an RF coil application.

The varactor diodes in FIG. 19 have a variable reverse bias voltage across them in order to act like a variable capacitor. The larger the reverse bias voltage applied to the diode, the smaller capacitance it exhibits. The Q of the diode becomes lower and the capacitance is increased if a diode is forward biased. Thus, applying a forward bias current to the varactor diode facilitates detuning of the associated coil.

In the embodiment shown in FIG. 19, varactor diode bias voltages are switched to −24 volts by relays K201, K202, K203, K204, K205 and K206 for detuning. For faster Rx coil detuning, analog switches SW201B, SW202A, SW202B and SW203A, SW203B are used. These relays and analog switches are set by sequence controller 28.

As explained herein, the present invention permits applying more than one Rx coil to a patient and switching in and out with respect to each of the plurality of RF coils. This makes patient management more efficient, because the patient does not have to be repositioned between usages of different RF coils and the RF coils do not have to be disconnected and interchanged. Thus, when one coil is being used, other coils are detuned in accordance with the foregoing examples.

OPERATION: IMAGING OPERATION

Figure 29:
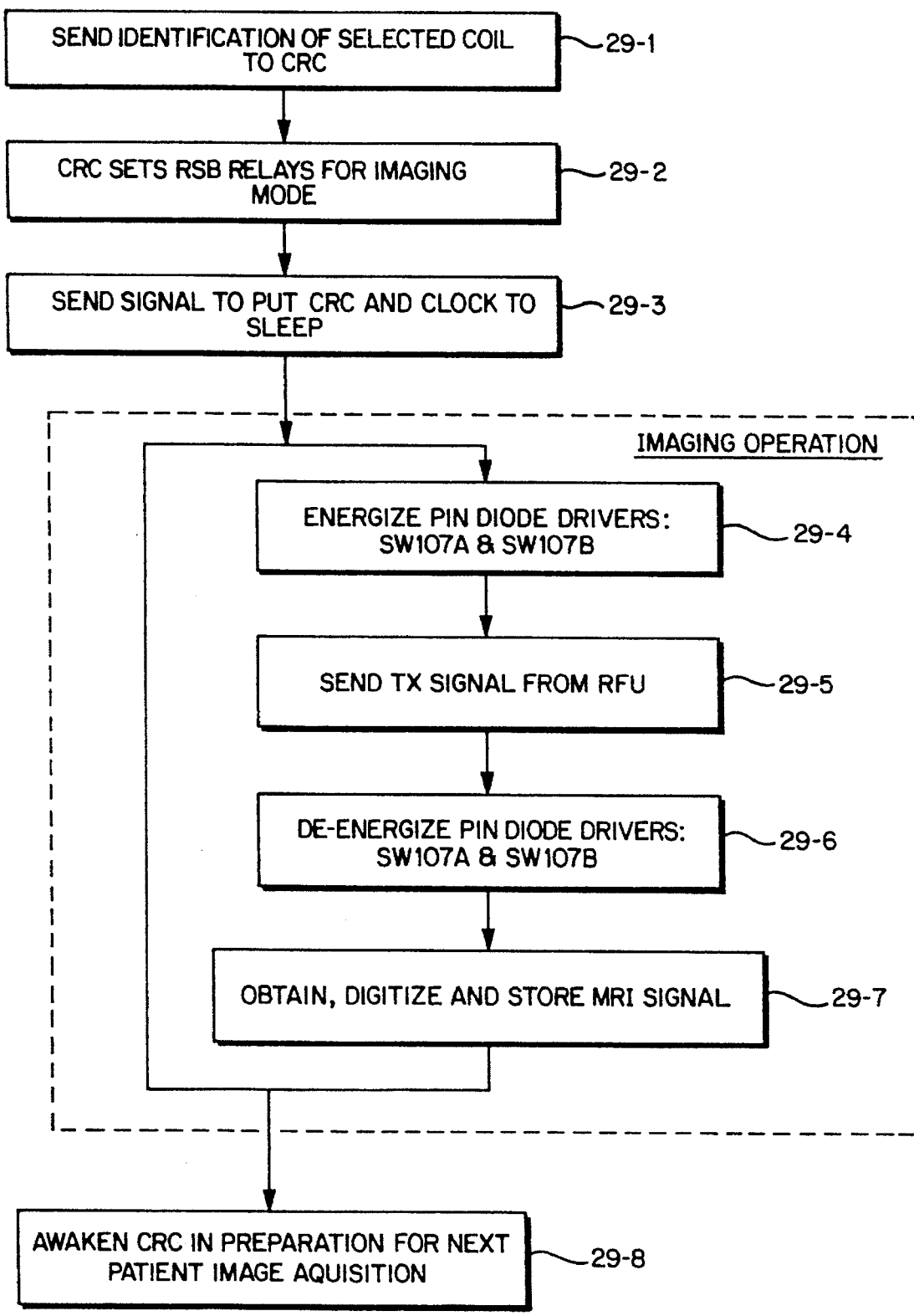
FIG. 29 is a flowchart showing general steps executed in an imaging mode.

General steps executed during an imaging operation are shown in FIG. 29. By the beginning of an imaging operation, an identification of a coil selected robe operative has either already been entered at device 31A (in connection with a tuning operation for that selected coil) or digitally received from a self-identifying coil. Host controller 31 advises sequencing controller 28 of the identity of the selected coil (at step 29-1). Controller 28 communicates (via serial line 168 and I/O bus 154) the selected coil identification to CRC microprocessor 152 (see FIG. 28).

As previously explained, the settings of relays in RSB 32 are set by CRC 30 prior to actual transmission of an Tx transmit signal. In this regard, at step 29-2 controller 30 sends (via I/O bus 154) signals to relay drivers 158, whereby relay drivers 158 in turn send signals over bus 30B to energize and de-energize relays, thereby configuring the unique imaging path for the selected coil.

After the setting of relays in RSB 32, at step 29-3 sequence controller 28 issues a "sleep" command to CRC clock 153 over bus 166, thereby stopping clock 153 and microprocessor 152. Thereafter, steps 29-4, 29-5, 29-6, and 29-7 may be repetitively executed in loop fashion as necessary during the imaging operation.

At step 29-4, sequence controller 28 sends (on bus 166) commands to energize appropriate pin diode drivers 160, 161 for controlling switches 74A (SW107A) and 74B (SW107B) for transmit and for detuning all receive coils. In this regard, see the discussion of the detuning operation provided above.

At step 29-5, RFU 24 applies the Tx (transmit) signal on cable 34 to RF front end 25. The Tx signal is routed through the unique signal path in RF front end 25 for the selected coil.

At step 29-6, sequence controller 28 sends commands to de-energize appropriate pin diode drivers 160, 161 for controlling switches 74A (SW107A) and 74B (SW107B) for reception. If RSB 32 is to toggle between A and B channels, then SW108 will change state at step 29-6. A short time later, returned MRI signals are obtained from a receive coil and routed through the coil's unique return signal path and via cable 37 to RFU 24. At step 29-7, the returned signal is digitized and stored for imaging purposes.

As indicated above, during imaging the loop comprising steps 29-4 through 29-7 is repeated as often as desired. Upon completion of imaging, at step 29-8 CRC 30 is awakened (i.e., by signals on bus 166 for activating clock 153 and microprocessor 152) in preparation for a next patient.

As indicated above, Table 2 shows values indicative of relay energization/de-energization (as set by controller 30) as well as switch and pin diode settings (as set by sequence controller 28) for an imaging mode for each of (high power) coils 22B–22C (Tx/Rx coils). Similarly, Table 3 shows corresponding values for an imaging mode for each of coils 22D–22E (Rx coils).

Imaging for a particular coil or channel (in accordance with the settings of Table 2 and Table 3) may be followed essentially immediately by tuning and subsequent imaging with respect to another coil or channel. For example, steps 30-1 through 30-N of FIG. 30 can all be executed without detaching any of coils 22 shown in FIG. 1.

Moreover, imaging may be performed with respect to a plurality of coils or channels simultaneously. The RSB 32 of the present invention facilitates use of more than one RX coil for a patient and selective use of the differing RX coils during or between a scan. This increases efficiency of patient management, because the patient does not have to be repositioned and coils do not have to be detached or interchanged.

For example, a doctor may be suspecting an ailment with the left TMJ (Temporolmandibular Joint), and might want to compare it with the right side TMJ. While a doctor could use a head coil for this purpose, usage of the head coil might have a poor signal to noise ratio (SNR). Moreover, a fold over artifact might prevent seeing an anatomical detail of interest.

A dual TMJ coil used in conjunction with RSB 32 of the present invention solves the foregoing dilemma. RSB 32 permits the doctor to scan the right TMJ coil while detuning the left TMJ coil, and then to detune the right TMJ coil while scanning the left TMJ coil, all without SNR penalty. Then, both TMJ coils can be activated simultaneously for a scalp view.

The RSB 32 settings necessary to accomplish the foregoing operation are understood with reference to Table 2 and Table 3. For example, in one embodiment with reference to port 46D of RSB 32 shown in FIG. 2, the returned MRI signals from both channels A and B (e.g., connected to left and right TMJ coils) can be directed via proper settings of RSB 32 to RFU 24, resulting in an image that combines both signals. To this end, as shown in Table 2 and Table 3, relays K106, K107, and switch 75 are specially set to obtain a "Linear A+B" imaging operation.

The RSB 32 of the present invention also facilitates the use of multiple transmit (Tx) coils, which can be employed (for example) when a dedicated Tx coil is required. In this regard, it is sometimes advantageous to have a limited field of view (FOV) Rx coil for a high resolution imaging sequence to zoom in on a localized region. In addition to other coils utilized for the general region, a small dedicated transmitter coil can limited the FOV further. One example of this operation is shoulder imaging. A combined narrow RF filed of a Tx coil and an Rx coil can sharply delineate an area for a close examination without a fold over artifact.

OPERATION: PREAMPLIFIER BYPASS

Some Rx coils have a preamplifier (typically a low noise amp whose noise figure is less than 1 dB) built on the coil structure to reduce a loss due to a lengthy coaxial cable. Having a preamplifier on the Rx coil can result in better SNR, particularly at higher frequency (e.g., 64 MHz for a 1.5 Tesla MRI system). The SNR gain comes from the short distance between the Rx coil and the preamplifier. However, the dynamic range would be reduced if there is too much RF gain overall. The present invention provides for selectively bypassing the preamplifier in the RF front end.

FIG. 26 shows that the CRC 30 of the present invention, by supplying control signals on line 45 to by-pass switches 44A and 44B, permits selective bypass of low noise preamplifier 43 associated with multiple coil assembly (MCE) 22E. When it is determined that there is too much RF gain overall, CRC 30 automatically bypasses amplifier 43 (as shown in FIG. 26). For the MCA 22E of FIG. 26, signals from sequence controller 28 operate switches to select the coil in use. More than one coil could be activated to obtain larger imaging area, which is advantageously accommodated by the RF front end 25 of the present invention.

OPERATION: ISOLATION MEASUREMENT

From time to time an operator may desire to apply a tuning signal to a first coil and determine how a second coil is affected thereby (i.e., to determine the isolation between the two coils). Such determinations are particularly useful in quality control.

In the above regard, for optimum signal to noise ratio (SNR) and image uniformity, the electrical isolation between channels in an RF coil needs to be less than −15 to −20 dB in both a QD mode Tx coil and a QD mode Rx coil. With a −15 dB isolation between the RF coil sections, only 3% of the RF energy is leaked from one RF coil section to the other coil section.

Using RSB 32 of the present invention, isolation between two RF coil sections of a QD coil is measured by applying a precalibrated CW (continuous wave) tuning signal to a first coil (e.g., a first coil section input). Leakage level at the second section port is measured, provided that there is no on-coil preamplifier in either RF coil sections. To be accurate, both RF coil input ports should be impedance matched to 50 Ω, because any reflection due to mismatch would give an erroneous isolation test result. On the other hand, a good impedance matching may not be reached if there is an excessive coupling between the RF coils that would cause a double resonance. It is therefore desirable to switch back between the tuning monitor and the isolation monitor rapidly.

There should also be isolation between a Tx coil and an Rx coil, but the timing difference between a Tx period and an Rx period provides an opportunity (using PIN diodes) to totally detune one of the RF coils while the other is active or being impedance matched.

Examples of isolation measurement at ports B, C and D of RSB 32 are shown provided in Table 4. In general, the controller 28 of the present invention facilitates a isolation measurement by RSB 32 by directing the tuning signal from the "Ref Out" terminal of the I/Q demodulator 50 through a unique signal application path. The signal application path includes relays K120, K122, K112, and K111 and further relays in accordance with the specific port and channel to which a coil-to-be-activated (the "first" coil) is connected. A received signal from the coil-to-be-tested (the "second" coil) is routed through RSB 32 by a unique return path. The unique return path includes relays and switches in the signal conditioning and routing network 54, so that the returned signal is ultimately applied through relays K110 and K113 to the tune-signal in port of I/Q demodulator 50.

Table 4 shows three examples of coil isolation measurements. The second example (the second data column) involves port 46C; the second example (the second data column) involves port 46D. In the first example (port 46C), the tuning signal is routed through relays K120, K122, K112, K111, K117, and K115 to channel B of port 46C. Whatever signal is picked up by the coil connected to channel A of port 46C is returned via relays K115, K116, switch 74B, relay K103, relay K104, relay K106, switch 75, relay K107, relay K108, relay K109, relay K110, and relay K113 to the tune-signal in port of the I/Q demodulator 50. An indication of the signal returned from channel A of port 46C is provided by controller 28.

Similarly, with respect to the second example (port 46D), the tuning signal is applied through relays K120, K122, K112, K111, and K101 to channel A of port 46C. Whatever signal is picked up by the coil connected to channel B of port 46D is returned via relays K119 switch relay K103, relay K104, relay K106, switch 75, relay K107, relay K108, relay K109, relay K110, and relay K113 to the tune-signal in port of the demodulator 50. An indication of the signal returned from channel B of port 46D is provided by controller 28.

The man skilled in the art will understand from the foregoing illustrations how other isolation measurements can be performed. In addition to QD RF coil isolation measurements, one can measure the isolation between the Tx coil and the Rx coils by changing the settings of the relays. In the same setup, one can also check whether the detuning circuits on the Tx coil and Rx coils are functioning properly.

OPERATION: LOOP BACK DIAGNOSTICS

As described above, an isolation measurement is a special case of a loop back test to determine a degree of RF coupling between the RF coil sections of QD RF coils.

Since there are many RF relays and RF switches in RSB 32, any excessive contact resistance could affect SNR and image quality. Also, the preamplifiers and hybrids (either 0° or 90°) need to be monitored for potential performance degradation. Additionally, operation of I/Q demodulator 50 and T/R switches 74A, 74B should be monitored.

Loop back diagnostics are performed for the RSB 32 of the present invention by interconnecting channels of the ports 46 involved in the test with a short coaxial cable and conducting a test similar to the afore-described isolation measurement. For example, the A and B channels of a port 46 can be connected by cable to conduct a loop back test.

A variation of loop back testing can be used to tune RF coils which do not have a conventional matching circuit but rather have only a parallel tune circuit. This type of RF coil connects to port 46E of FIGS. 1 and 2 and has one or more preamplifiers, a power combiner, and RF switches on the coil (see FIG. 19). An Rx coil connected at port 46E could pick up leakage RF signal from a Tx coil. Maximizing voltage pick up by adjusting a parallel varactor diode in the RF coil (MCA) accomplishes RF coil tuning.

EPILOGUE

Thus, the MRI system 20 of the present invention permits simultaneous attachment of a plurality of coils during use, including coils having differing types of matching circuits (such as high power coils, varactor-tuned coils, and other coils). In addition, the MRI system 20 can measure the isolation between two channels of a high power coil as well as the isolation between the transmit coil and receiver coil without additional equipment. Further, the MRI system 20 can perform isolation tests to identify trouble spots, and can change the polarity of the QD receiver channel (at relay K105) to match magnet polarity.

Thus, for high power coils, the present invention uses calibrated quadrature demodulation of measurements of the reflected signal both before and after RTU 26 to provide data for the controller's analytical determination of approximate tune conditions via the transfer function of RTU 26. In the coarse tuning operation, the phase information enables the transfer function equations to calculate initial settings of the capacitors Ca and Cb close to the tuned value. In the fine tuning operation, further measurements of the real and imaginary reflection values are used to calculate vector directions towards the tuned point, resulting in an overall quick tune time for the coil.

Advantageously, RTU 26 of the present invention employs conventional stepping motors 102, thereby facilitating low cost construction.

The varactor coil tuning operation of the present invention efficiently and rapidly tunes varactor-tuned coils such as coil 22D. For each dimension of the recursive bisection search, the search is usually completed by a maximum of about nine bisecting steps, thereby enhancing overall operation of the MRI system 20.

While the invention has been particularly shown and described with reference to a single preferred embodiment thereof, it will be understood by those skilled in the art that various alterations in form and detail may be made therein without departing from the spirit and scope of the invention. For example, although the varactor coil tuning operation has been described above only with reference to non-Quadrature varactor coils, it should be understood that a similar operation can be utilized for QD quadrature varactor coils.

Appendix 1
ATTEMPTING NEW TUNE

```
Blue channel start            1991-12-19    15:18:12
VSWR = 8.954197
Coil:    ml=   0    m2=   0    r=-0.797   i=-0.060   mag=0.799   cb= 26, ca=340
Coarse:  ml=  66    m2= 477    r=+0.387   i=-0.226   mag=0.448
Fine:    ml=  21    m2= 422    r=+0.031   i=-0.036   mag=0.048
Tuning stopped at             1991-12-19    15:18:16
Yellow Channel start          1991-12-19    15:111:16
VSWR = 11.581679
Coil:    ml=   0    m2=   0    r=+0.793   i=+0.281   mag=0.841   cb=227, ca=287
Coarse:  ml= 329    m2= 407    r=+0.429   i=+0.023   mag=0.430
Fine::   ml= 299    m2= 407    r=+0.035   i=+0.030   mag=0.046
Tuning stopped at             1992-12-19    15:18:19
Blue channel start            1992-12-19    15:18:19
Fine:    ml=  21    m2= 417    r=+0.017   i=-0.087   mag=0.089
Fine:    ml=  61    m2= 402    r=-0.005   i=-0.050   mag=0.050
Tunig stopped at              1991-12-19    15:18:21
Yellow channel start          1991-12-19    15:18:21
Tuning stopped at             1991-12-19    15:18:22
Total tune time was 9.78 seconds.
```

TABLE 1

TUNING OPERATION

| | Port/Channel | | | | | | |
|---|---|---|---|---|---|---|---|
| | 46B/A | 46B/B | 46C/A | 46C/B | 46D/A | 46D/B | 46E |
| | Coil/Channel | | | | | | |
| | 22B/A | 22B/B | 22C/A | 22C/B | 22D/A | 22D/B | 22E |
| K101 | * | * | * | * | 1 | 0 | * |
| K102 | 0 | * | 0 | * | * | 1 | * |
| K103 | * | 0 | * | 0 | 1 | * | * |

TABLE 1-continued

TUNING OPERATION

| | Port/Channel | | | | | | |
|---|---|---|---|---|---|---|---|
| | 46B/A | 46B/B | 46C/A | 46C/B | 46D/A | 46D/B | 46E |
| | Coil/Channel | | | | | | |
| | 22B/A | 22B/B | 22C/A | 22C/B | 22D/A | 22D/B | 22E |
| K104 | * | * | * | * | * | * | * |
| K105 | * | * | * | * | * | * | * |
| K106 | * | * | * | * | * | * | * |
| K107 | * | * | * | * | * | * | * |
| K108 | * | * | * | * | * | * | 0 |
| K109 | * | * | * | * | * | * | 1 |
| K110 | * | * | * | * | * | * | 0 |
| K111 | 1 | 0 | 1 | 0 | 0 | 1 | * |
| K112 | 0 | 0 | 0 | 0 | 1 | 1 | * |
| K113 | 1 | 1 | 1 | 1 | 1 | 1 | * |
| K115 | 0 | 0 | 1 | 1 | * | * | * |
| K116 | 1 | 0 | 1 | 0 | * | * | * |
| K117 | 0 | 1 | 0 | 1 | * | * | * |
| K118 | * | * | * | * | * | * | * |
| K119 | * | * | * | * | 0 | 1 | * |
| K120 | 0 | 0 | 0 | 0 | 0 | 0 | * |
| K121 | 1 | 1 | 1 | 1 | 1 | 1 | 0 |
| K122 | 0/1 | 0/1 | 0/1 | 0/1 | 0/1 | 0/1 | * |
| SW107A (74A) | 0 | 0 | 0 | 0 | 0 | 0 | 1/0 |
| SW107B (74B) | 0 | 0 | 0 | 0 | 0 | 0 | 1/0 |
| SW108 (75) | 0 | 0 | 0 | 0 | 0 | 0 | 0 |

TABLE 2

IMAGING OPERATION: TX/RX COILS

| | Port/Channel | | | |
|---|---|---|---|---|
| | 46B/A | 46B/B | 46C/A | 46C/B |
| | Coil/Channel | | | |
| | 22B/A | 22B/B | 22C/A | 22C/B |
| K101 | * | * | * | * |
| K102 | * | * | * | * |
| K103 | 0 | 0 | 0 | 0 |
| K104 | | | | |
| QD coil | 0 | 0 | 0 | 0 |
| Any linear coil | 1 | 1 | 1 | 1 |
| K105 | | | | |
| QD coil | DMP | DMP | DMP | DMP |
| Any linear coil | * | * | * | * |
| K106 | | | | |
| QD coil | | | | |
| Only Linear on Channel A | 1 | N/A | 1 | N/A |
| Only Linear on Channel B | N/A | 1 | N/A | 1 |
| Linear A + B | 0 | 0 | 0 | 0 |
| Toggle Linear A & B | 1 | 1 | 1 | 1 |
| K107 | | | | |
| QD coil | * | * | * | * |
| Only Linear on Channel A | 0 | 0 | 0 | 0 |
| Only Linear on Channel B | 0 | 0 | 0 | 0 |
| Linear A + B | 1 | 1 | 1 | 1 |
| Toggle Linear A & B | 0 | 0 | 0 | 0 |
| K108 | | | | |
| QD coil | 0 | 0 | 0 | 0 |
| Any linear coil | 1 | 1 | 1 | 1 |
| K109 | 0 | 0 | 0 | 0 |

TABLE 2-continued

IMAGING OPERATION: TX/RX COILS

| | Port/Channel | | | |
|---|---|---|---|---|
| | 46B/A | 46B/B | 46C/A | 46C/B |
| | Coil/Channel | | | |
| | 22B/A | 22B/B | 22C/A | 22C/B |
| K110 | 0 | 0 | 0 | 0 |
| K111 | * | * | * | * |
| K112 | * | * | * | * |
| K113 | * | * | * | * |
| K115 | 0 | 0 | 1 | 1 |
| K116 | 0 | 0 | 0 | 0 |
| K117 | 0 | 0 | 0 | 0 |
| K118 | | | | |
| QD Tx coil | 1 | 1 | 1 | 1 |
| Linear Tx coil | 0 | 0 | 0 | 0 |
| K119 | * | * | * | * |
| K120 | * | * | * | * |
| K121 | 0 | 0 | 0 | 0 |
| K122 | * | * | * | * |
| SK107A (74A) | 1/0 | 1/0 | 1/0 | 1/0 |
| SW107B (74B) | 1/0 | 1/0 | 1/0 | 1/0 |
| SW108 (75) | | | | |
| QD coil | * | * | * | * |
| Only Linear on Channel A | 0 | N/A | 0 | N/A |
| Only Linear on Channel B | 1 | 1 | N/A | 1 |
| Linear A + B | * | * | * | * |
| Toggle Linear A & B | 1/0 | 1/0 | 1/0 | 1/0 |

TABLE 3

IMAGING OPERATION: Rx COILS

| | Port/Channel | | |
|---|---|---|---|
| | 46D/A | 46D/B | 46E |
| | Coil/Channel | | |
| | 22D/A | 22D/B | 22E |
| K101 | 0 | 0 | * |
| K102 | 1 | 1 | * |
| K103 | 1 | 1 | * |
| K104 | | | |
| QD coil | 0 | 0 | * |
| Any linear coil | 1 | 1 | * |
| K105 | | | |
| QD coil | DMP | DMP | * |
| Any linear coil | * | * | * |
| K106 | | | |
| QD coil | * | * | * |
| Only Linear on Channel A | 1 | 1 | * |
| Only Linear on Channel B | 1 | 1 | * |
| Linear A + B | 0 | 0 | * |
| Toggle Linear A & B | 1 | 1 | * |
| K107 | | | |
| QD coil | * | * | * |
| Only Linear on Channel A | 0 | N/A | * |
| Only Linear on Charmel B | N/A | 0 | * |
| Linear A + B | 1 | 1 | * |
| Toggle Linear A & B | 0 | 0 | * |
| K108 | | | |
| QD coil | 0 | 0 | 0 |
| Any linear coil | 1 | 1 | 0 |
| K109 | 0 | 0 | 1 |
| K110 | 0 | 0 | 0 |
| K111 | * | * | * |

TABLE 3-continued

IMAGING OPERATION: Rx COILS

| | Port/Channel | | |
|---|---|---|---|
| | 46D/A | 46D/B | 46E |
| | \multicolumn{3}{c}{Coil/Channel} | |
| | 22D/A | 22D/B | 22E |
| K112 | * | * | * |
| K113 | * | * | * |
| K116 | * | * | * |
| K117 | | | |
| K118 | | | |
| QD Tx coil | 1 | 1 | 1 |
| Linear Tx coil | 0 | 0 | 0 |
| K119 | 0 | 0 | * |
| K120 | * | * | * |
| K121 | 0 | 0 | 0 |
| K122 | * | * | * |
| SW107A (74A) | 1/0 | 1/0 | 1/0 |
| SW107B (74B) | 1/0 | 1/0 | 1/0 |
| SW108 (75) | | | |
| QD coil | * | * | * |
| Only Linear on Channel A | 0 | N/A | * |
| Only Linear on Channel B | N/A | 1 | * |
| Linear A + B | * | * | * |
| Toggle Linear A & B | 1/0 | 1/0 | * |

TABLE 4

ISOLATION MEASURING OPERATION

| Port [Coil] for Isolation Measurement | 46B [22B] | 46C [22C] | 46D [22D] |
|---|---|---|---|
| K101 | * | * | 1 |
| K102 | * | * | * |
| K103 | 0 | * | 1 |
| K104 | 1 | 1 | 1 |
| K105 | * | * | * |
| K106 | 1 | 1 | 1 |
| K107 | 0 | 0 | 0 |
| K108 | 1 | 1 | 1 |
| K109 | 0 | 0 | 0 |
| K110 | 1 | 1 | 1 |
| K111 | 0 | 0 | 0 |
| K112 | 0 | 0 | 1 |
| K113 | 0 | 0 | 0 |
| K115 | 0 | 1 | * |
| K116 | 1 | 1 | * |
| K117 | 0 | 0 | * |
| K118 | * | * | * |
| K119 | * | * | 0 |
| K120 | 1 | 1 | 1 |
| K121 | 1 | 1 | 1 |
| K122 | 0 | 0 | 0 |
| K140 | * | * | * |
| K141 | 1 | 1 | 1 |
| SW107A (74A) | * | * | * |
| SW107B (74B) | 0 | 0 | * |
| SW108 (75) | 1 | 1 | 1 |

TABLE 5

VALUES OF COMPONENTS
FOR MATHEMATICAL MODEL OF RTU

| Equivalent Component | 15 MHz System | 21 MHz System |
|---|---|---|
| $C_1$ | 196 pF | 150 pF |
| $C_2$ | 199 pF | 150 pF |
| $C_3$ | 182 pF | 150 pF |
| $L_{12}$ | 350 nH | 300 nH |
| $R_1$ | 0.05 Ω | 0.05 Ω |
| $L_{str}$ | 87.5 nH | 87.5 nH |

The embodiments of the invention in which an exclusive property or privilege is claimed are defined as follows:

1. A magnetic resonance imaging (MRI) system having an RF sub-system comprising:

an RF unit for generating an RF input signal for use in an imaging operation;

a signal routing controller;

an impedance adjustment circuit;

an RF front end having:

a set of coil attachment ports, the set of coil attachment ports including a first subset of coil attachment ports and a second subset of coil attachment ports;

a set of connection ports for connection to the impedance adjustment circuit whereby the RF input signal is transmissible through the impedance adjustment circuit to the second subset of coil attachment ports, the RF input signal not being transmissible through the impedance adjustment circuit to the first subset of coil attachment ports;

a switching system responsive to the signal routing controller for connecting a selected coil in a selected one of the first subset of coil attachment ports and the second set of coil attachment ports to the RF unit, thereby permitting, during imaging, coils to remain attached to each of the plurality of coil attachment ports.

2. The apparatus of claim 1, further comprising:

a first RF coil connected to the first subset of coil attachment ports for at least receiving or transmitting an RF signal;

a second RF coil connected to the second subset of coil attachment ports for at least transmitting or receiving an RF signal;

a first imaging signal path for connecting the first RF coil to the RF unit during the imaging operation;

a second imaging signal path for connecting the second RF coil to the RF unit during the imaging operation, the second imaging signal path having at least some path segments which are not common with the first imaging signal path; and wherein the signal routing controller selectively applies the RF signal from the RF unit to one of the first RF coil and the second RF coil to the RF unit through one of its respective imaging signal paths.

3. The apparatus of claim 2, wherein at least one of the first RF coil and the second RF coil has an associated coil detuning circuit, and wherein the signal routing controller selectively sends a detuning signal to the coil detuning circuit for detuning its associated coil when the RF signal is not routed to the coil with which the coil detuning circuit is associated.

4. The apparatus of claim 2, further comprising an imaging switch means provided in the first imaging signal path and the second imaging signal path and responsive to the signal routing controller for directing an MRI signal returned through a selected one of the first imaging signal path and the second imaging signal path.

5. The apparatus of claim 2, further comprising:
   a coil tuning controller for determining, during a coil tuning operation, when a magnitude of a reflected tuning signal from one of the first RF coil and the second RF coil is below a predetermined value;
   a first reflection signal path for selectively connecting the first RF coil to the coil tuning controller during the tuning operation;
   a second reflection signal path for selectively connecting the second RF coil to the coil tuning controller during the tuning operation, the second reflection signal path having at least some path segments which are not common with the first reflection signal path; and
   wherein the signal routing controller selectively routes an MRI signal returned from one of the first RF coil and the second RF coil to the coil tuning controller through its respective tuning signal path.

6. The apparatus of claim 5, further comprising a tune demodulator con, non to the first reflection signal path and the second reflection signal path.

7. The apparatus of claim 6, further comprising tuning switch means for directing a reflected signal from one of the first RF coil and the second RF coil to the coil tuning controller.

8. The apparatus of claim 7, wherein one of the first RF coil and the second RF coil has two channels, and wherein the tuning switching means is operative or directing a reflected signal from one of the channels to the tuning controller.

9. The apparatus of claim 7, wherein the tuning switch means is controlled by the signal routing controller.

10. The system of claim 1, wherein the RF front end further comprises a source of a tuning reference input signal, and wherein the switching system connects a selected one of the RF input signal and the tuning reference signal with the selected coil.

11. The system of claim 1, wherein the second subset of coil attachment ports includes two second subset coil attachment ports, and wherein the switching system includes a switch for selectively connecting one of the two second subset coil attachment ports to the RF unit.

12. The system of claim 1, wherein the set of connection ports for connection to the impedance adjustment circuit comprises first In-Phase and Quadrature-Phase ports for applying an input signal to the impedance adjustment circuit and second In-Phase and Quadrature-Phase ports or applying an impedance adjusted input signal from the impedance adjustment circuit to the second set of attachment ports.

13. The system of claim 12, wherein the second subset of coil attachment ports includes two second subset coil attachment ports, and wherein the switching system includes a switch for selectively connecting one of the two second subset coil attachment ports to the RF unit.

14. The system of claim 1, wherein the RF unit also receives an RF return signal returned from the selected coil, and wherein the RF front end further comprises a tune demodulator, and wherein the switching system connects the selected coil to a selected one of the RF unit and the tune demodulator.

15. The system of claim 1, wherein the first subset of coil attachment ports has a first coil type connected thereto and the second subset of coil attachment ports having a second coil type connected thereto, only one of the first and second coil types being both transmit and receive coils.

16. A method of operating a magnetic resonance imaging (MRI) system comprising:
   (a) attaching an RF coil to each of a set of coil attachment ports including in an RF front end, the set of coil attachment ports including a first subset of coil attachment ports and a second subset of coil attachment ports;
   (b) attaching an impedance adjustment circuit to a set of connection ports in the RF front end whereby an RF transmit signal is transmissible through the impedance adjustment circuit to the second subset of coil attachment ports but not to the first subset of coil attachment ports;
   (c) selecting at least one of the RF coils to be operative;
   (d) routing an RF transmit signal from an RF signal processing unit to the operative coil(s) through the RF front end and routing a returned RF receive signal from the operative coil(s) through the RF front end to an RF signal processing unit.

17. The method of claim 16, wherein for each coil the RF transmit signal is routed through a unique signal path.

18. The method of claim 16, wherein for each coil the RF receive signal is routed through a unique signal path.

19. The method of claim 16, further comprising:
   automatically selecting at least another of the plurality of RF coils to be operative and automatically de-selecting at least one of the coils selected in step (c) of claim 16 without detaching the de-selected coil(s).

20. The method of claim 19, further comprising automatically de-tuning the de-selected coil (s).

21. The method of claim 16, wherein the step of routing the RF transmit signal and the RF receive signal is involves automatically setting relay switches in the RF front end for connecting selected ports with the RF signal processing unit.

22. The method of claim 21, wherein automatically setting relays switches involves sending relay status signals from a signal routing controller to a plurality of relays comprising the RF front end.

23. The method of claim 16, wherein a plurality of RF coil types are connected to differing ports of the RF front end, the RF coil types including a high power coil, a varactor-tuned coil, and a multiple view coil.

* * * * *